United States Patent
Spreitzer et al.

(10) Patent No.: US 6,638,646 B2
(45) Date of Patent: Oct. 28, 2003

(54) SUBSTITUTED POLY (ARYLENEVINYLENES), PROCESS FOR THEIR PREPARATION, AND THEIR USE IN ELECTROLUMINESCENT ELEMENTS

(75) Inventors: Hubert Spreitzer, Viernheim (DE); Willi Kreuder, Mainz (DE); Heinrich Becker, Glashütten (DE); Hermann Schenk, Wiesbaden (DE); Nu Yu, Knoxville, TN (US)

(73) Assignee: Semiconductors GmbH (DE)

( * ) Notice: Subject to any disclaimer, the term of this patent is extended or adjusted under 35 U.S.C. 154(b) by 0 days.

(21) Appl. No.: 10/185,061

(22) Filed: Jun. 28, 2002

(65) Prior Publication Data

US 2003/0088050 A1 May 8, 2003

Related U.S. Application Data

(63) Continuation of application No. 09/530,890, filed on Aug. 22, 2000.
(60) Provisional application No. PCT/EP98/06722, filed on Oct. 22, 1998, now abandoned.

(30) Foreign Application Priority Data

Nov. 5, 1997 (DE) .......................................... 197 48 814

(51) Int. Cl.[7] .............................................. H05B 33/00
(52) U.S. Cl. ...................... 428/690; 428/691; 428/917; 528/86
(58) Field of Search ................................ 428/690, 691, 428/917; 528/86

(56) References Cited

U.S. PATENT DOCUMENTS

| | | | |
|---|---|---|---|
| 5,558,904 A | 9/1996 | Hsieh et al. | .................. 427/66 |
| 5,817,430 A | 10/1998 | Hsieh | ......................... 428/690 |

FOREIGN PATENT DOCUMENTS

| | | |
|---|---|---|
| WO | WO 98/25874 | 6/1998 |
| WO | WO 98/27136 | 6/1998 |

OTHER PUBLICATIONS

Hoerhold et al., "Poly(arylene vinylenes)," 1974, Chem Abstract, 81:169873.

(List continued on next page.)

*Primary Examiner*—Duc Truong
(74) *Attorney, Agent, or Firm*—Connolly Bove Lodge & Hutz LLP

(57) ABSTRACT

Poly(arylenevinylenes) comprising at least 20% of recurring units of the formula (I),

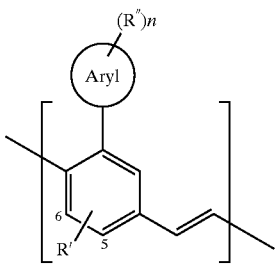

(I)

where the symbols and indices have the following meanings:

Aryl: is an aryl group having 4 to 14 carbon atoms;

R': is a substituent which is either in the labeled phenylene position 5 or 6 and is CN, F, Cl, N($R^1R^2$) or a straight-chain, branched or cyclic alkyl, alkoxy or thioalkoxy group having 1 to 20 carbon atoms, in which, in addition, one or more H atoms may be replaced by F;

R": are identical or different and are CN, F, Cl or a straight-chain, branched or cyclic alkyl or alkoxy group having 1 to 20 carbon atoms, where one or more non-adjacent $CH_2$ groups may be replaced by —O—, —S—, —CO—, —COO—, —O—CO—, —$NR^1$—, —($NR^2R^3$)$^+$—$A^-$ or —$CONR^4$—, and where one or more H atoms may be replaced by F, or an aryl group having 4 to 14 carbon atoms, which may be substituted by one or more non-aromatic radicals R';

$R^1$, $R^2$, $R^3$, $R^4$ are identical or different and are H or an aliphatic or aromatic hydrocarbon radical having 1 to 20 carbon atoms;

$A^-$: is a singly charged anion or an equivalent thereof; and n: is 0, 1, 2, 3, 4 or 5, are suitable as electroluminescent material.

19 Claims, 2 Drawing Sheets

Sections from $^1$H NMR spectra (400 MHz, CDCl$_3$, 300K) of polymers P1 and V1

OTHER PUBLICATIONS

Schaaf et al., "Toward the soluble derivatives of poly(2, 3–diphenylphenylene vinylene," Chem Abstract, 126:251542.

Schoo et al., "Organic electroluminescent device," Oct. 1997, Chem Abstract, 128:17254.

Chung, Sung–Jae et al., "Improved–Efficiency Light–Emitting Diodes Prepared from Organic–Soluble PPV Derivatives with Phenylanthracene and Branched Alkoxy Pendents," *Advanced Materials* 10:684–688, XP–000774673 (1998).

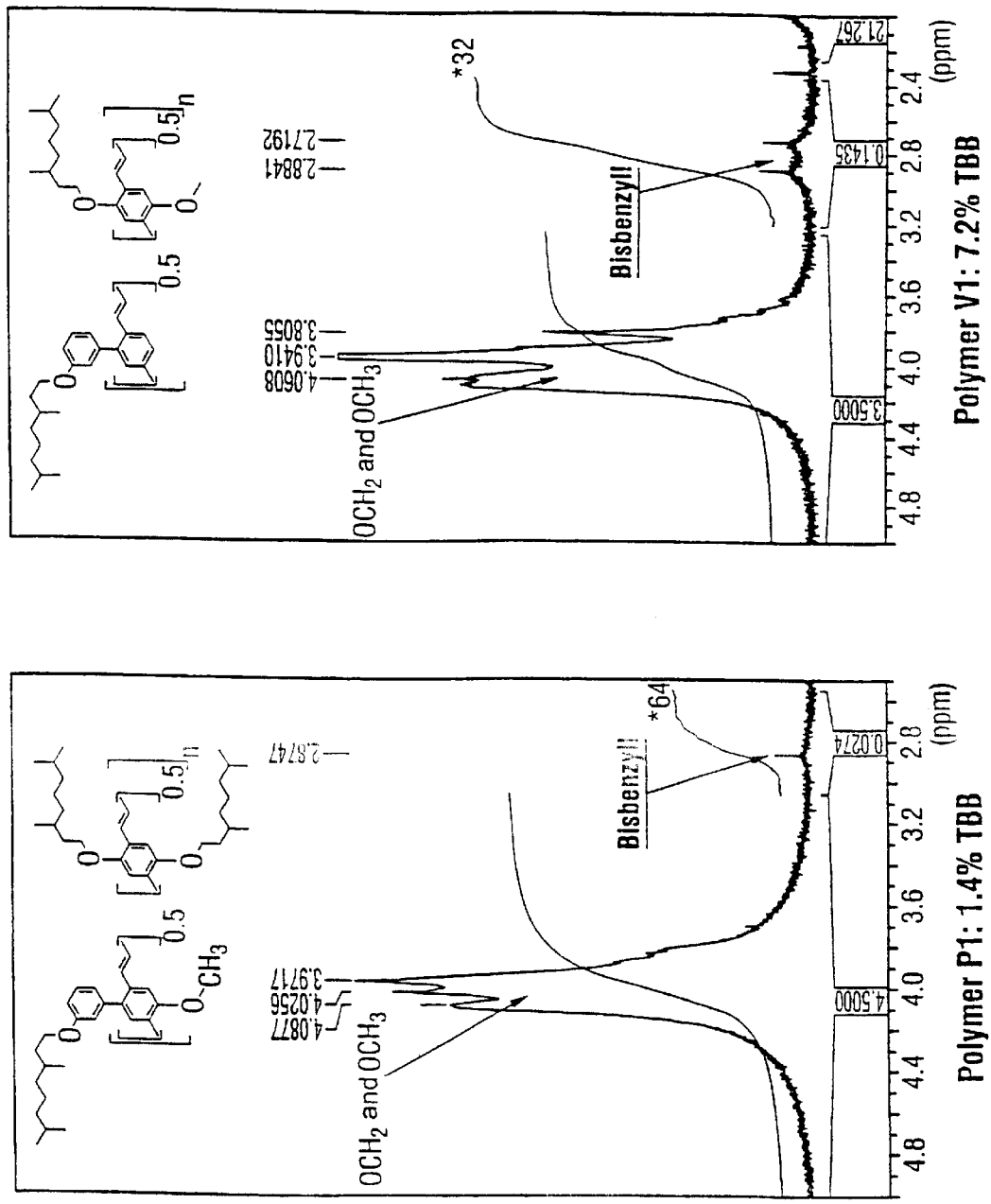
FIG. 1A: Sections from $^1$H NMR spectra (400 MHz, CDCl$_3$, 300K) of polymers P1 and V1

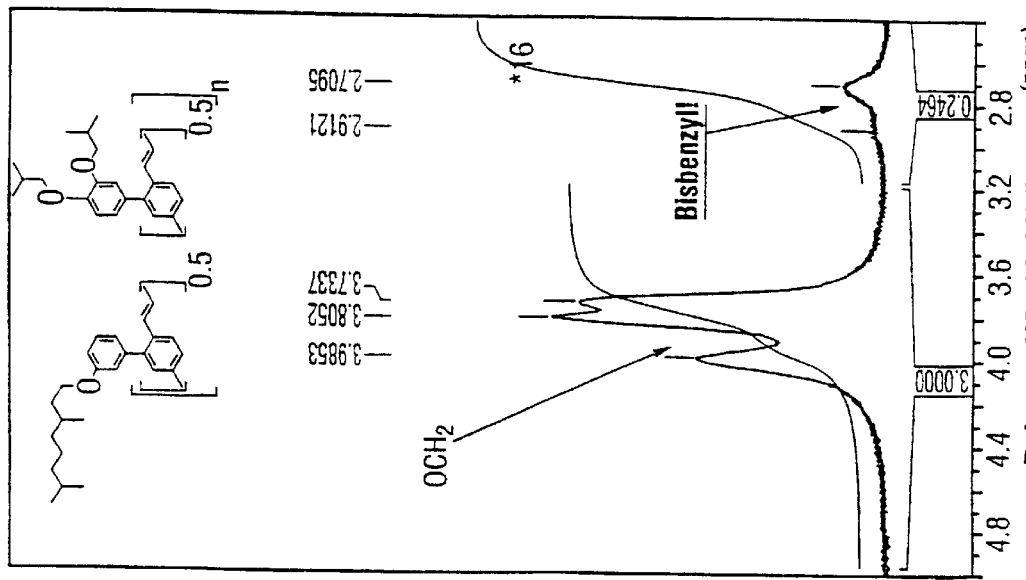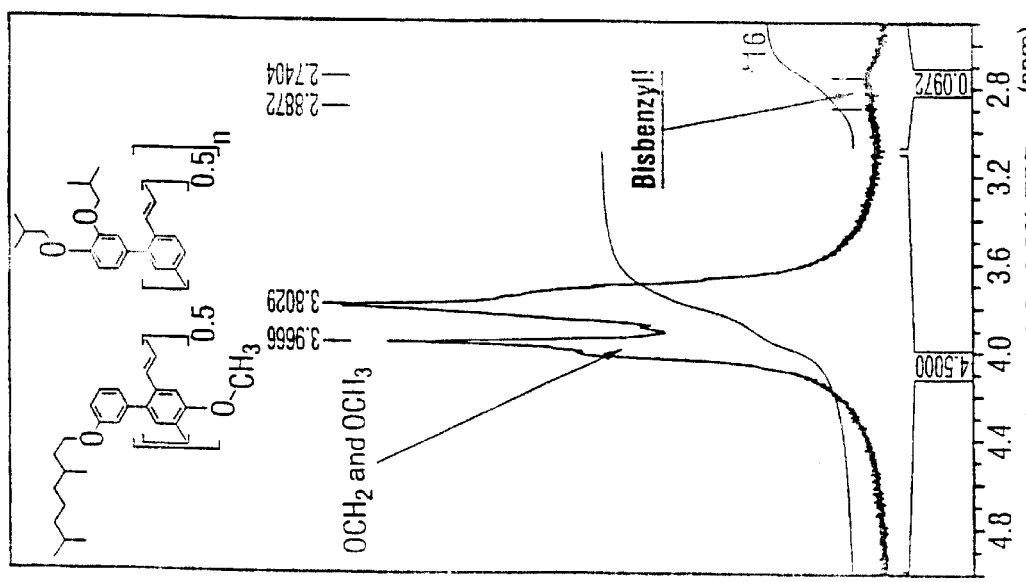
FIG. 2A: Sections from ¹H NMR spectra (400 MHz, CDCl₃, 300K) of polymers P2 and V2

SUBSTITUTED POLY (ARYLENEVINYLENES), PROCESS FOR THEIR PREPARATION, AND THEIR USE IN ELECTROLUMINESCENT ELEMENTS

This application is a continuation of Ser. No. 09/530,890 filed Aug. 22, 2000 now abandoned, which is a 371 of PCT/EP98/06722 filed Oct. 22, 1998.

There is a considerable demand in industry for large-area solid-state light sources for a number of applications, predominantly in the area of display elements, display screen technology and illumination technology. The requirements made of these light sources can currently not be met entirely satisfactorily by any of the existing technologies.

As an alternative to conventional display and illumination elements, such as incandescent lamps, gas-discharge lamps and non-self-illuminating liquid-crystal display elements, electroluminescent (EL) materials and devices, such as light-emitting diodes (LEDs), have already been in use for some time.

Besides inorganic electroluminescent materials and devices, low-molecular-weight, organic electroluminescent materials and devices have also been known for about 30 years (see, for example, U.S. Pat. No. 3,172,862). Until recently, however, the practical utility of such devices was greatly restricted.

EP 423 283 and EP 443 861 describe electroluminescent devices which contain a film of a conjugated polymer as light-emitting layer (semiconductor layer). Such devices have numerous advantages, such as the possibility of producing large-area, flexible displays simply and inexpensively. In contrast to liquid-crystal displays, electroluminescent displays are self-illuminating and therefore do not require an additional back-lighting source.

A typical device in accordance with EP 423 283 consists of a light-emitting layer in the form of a thin, dense polymer film (semiconductor layer) which contains at least one conjugated polymer. A first contact layer is in contact with a first surface, and a second contact layer is in contact with a further surface of the semiconductor layer. The polymer film of the semiconductor layer has a sufficiently low concentration of extrinsic charge carriers so that, on application of an electric field between the two contact layers, charge carriers are introduced into the semiconductor layer, where one contact layer becomes positive compared with the other, and the semiconductor layer emits radiation. The polymers used in devices of this type are referred to as conjugated. The term "conjugated polymer" is taken to mean a polymer which has a delocalized electron system along the main chain. The delocalized electron system gives the polymer semiconductor properties and enables it to transport positive and/or negative charge carriers with high mobility.

EP 423 283 and EP 443 861 describe, as polymeric material for the light-emitting layer, poly(p-phenylenevinylene), which may be modified on the aromatic ring by alkyl, alkoxy, halogen or nitro substituents in order to improve the properties. Polymers of this type have since then been investigated in a large number of studies, and bisalkoxy-substituted PPVs in particular have already been optimized a very long way toward applicational maturity (cf., for example, J. Salbeck, Ber. Bunsenges. Phys. Chem. 1996, 100, 1667).

The German patent application 196 52 261.7 with the title "Aryl-substituted poly(p-arylenevinylenes), process for their preparation, and their use in electroluminescent components", which was not published before the priority date of the present application, proposes aryl-substituted poly(p-arylenevinylenes) which are also suitable for generating green electroluminescence.

However, the development of polymers of this type can in no way be regarded as complete, and there continues to be plenty of room for improvement. Thus, inter alia, improvements are still possible with respect to the service life and stability, in particular at elevated temperatures.

The object of the present invention was therefore to provide electroluminescent materials which, when used in illumination or display devices, are suitable for improving the property profile of these devices.

Surprisingly, it has now been found that poly (arylphenylenevinylenes) whose phenylene unit carries a further substituent in the para- or meta-position to the aryl radical are particularly suitable as electroluminescent materials.

The invention therefore relates to poly(arylenevinylenes) comprising at least 20% of recurring units of the formula (I),

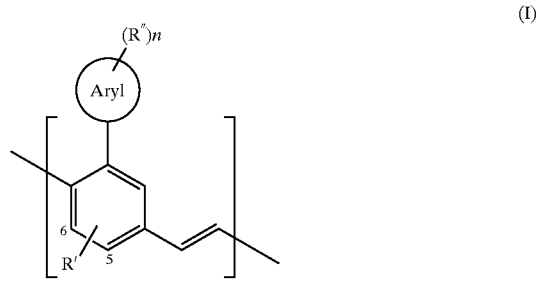

where the symbols and indices have the following meanings:
  Aryl: is an aryl group having 4 to 14 carbon atoms;
  R': is a substituent which is either in the labeled phenylene position 5 or 6 and is CN, F, Cl, N(R$^1$R$^2$) or a straight-chain, branched or cyclic alkyl, alkoxy or thioalkoxy group having 1 to 20 carbon atoms, in which, in addition, one or more H atoms may be replaced by F;
  R": are identical or different and are CN, F, Cl or a straight-chain, branched or cyclic alkyl or alkoxy group having 1 to 20 carbon atoms, where one or more non-adjacent CH$_2$ groups may be replaced by —O—, —S—, —CO—, —COO—, —O—CO—, —NR$^1$—, —(NR$^2$R$^3$)$^+$-A$^-$ or —CONR$^4$—, and where one or more H atoms may be replaced by F, or an aryl group having 4 to 14 carbon atoms, which may be substituted by one or more non-aromatic radicals R';
  R$^1$, R$^2$, R$^3$, R$^4$ are identical or different and are H or an aliphatic or aromatic hydrocarbon radical having 1 to 20 carbon atoms;
  A$^-$: is a singly charged anion or an equivalent thereof; and
  n: is 0, 1, 2, 3, 4 or 5.

The polymers according to the invention are highly suitable for use as electroluminescent materials. They have, for example, the advantage of having constant brightness in long-term operation, even at elevated temperatures (for example heating for a number of hours at 85° C.).

It is thus not necessary to adjust the voltage during long-term operation in order to obtain an initial brightness. This advantage is particularly evident in the case of battery operation, since the maximum voltage economically possible is greatly restricted here.

Devices containing the polymers according to the invention also have a long service life.

Surprisingly, the polymers according to the invention have a particularly low content of defect structures.

The polymers generally contain from 10 to 10,000, preferably from 10 to 5000, particularly preferably from 100 to 500, very particularly preferably from 250 to 2000, recurring units.

Polymers according to the invention comprise at least 20%, preferably at least 30%, particularly preferably at least 40%, of recurring units of the formula (I).

Furthermore, preference is also given to copolymers consisting of recurring units of the formula (I) and recurring units containing a 2,5-dialkoxy-1,4-phenylenevinylene structure. Preference is likewise given to copolymers consisting of recurring units of the formula (I) and recurring units containing a 2-aryl-1,4-arylenevinylene structure which is not further substituted.

Preference is furthermore given to copolymers comprising 1, 2 or 3 different recurring units of the formula (I).

For the purposes of the present invention, the term "copolymers" covers random, alternating, regular and block-like structures.

Preference is also given to polymers comprising recurring units of the formula (I) in which the symbols and indices have the following meanings:

Aryl is phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinolinyl, 2- or 3-thiophenyl, 2- or 3-pyrrolyl, 2- or 3-furanyl or 2-(1,3,4-oxadiazol)yl;

R' are identical or different and are CN, F, Cl, $CF_3$ or a straight-chain or branched alkoxy group having 1 to 12 carbon atoms;

R" are identical or different and are a straight-chain or branched alkyl or alkoxy group having 1 to 12 carbon atoms; and n is 0, 1, 2 or 3, particularly preferably 0, 1 or 2.

Particular preference is given to polymers in which the aryl substituent in the formula (I) has the following meaning: phenyl, 1-naphthyl, 2-naphthyl or 9-anthracenyl.

Particular preference is furthermore given to polymers in which the aryl substituent in the formula (I) has the following substitution pattern: 2-, 3- or 4-alkyl(oxy)phenyl, 2,3-, 2,4-, 2,5-, 2,6-, 3,4- or 3,5-dialkyl(oxy)phenyl, 2,3,4-, 2,3,5-, 2,3,6-, 2,4,5-, 2,4,6- or 3,4,5-trialkyl(oxy)phenyl, 2-, 3-, 4-, 5-, 6-, 7- or 8-alkyl(oxy)-1-naphthyl, 1-, 3-, 4-, 5-, 6-, 7- or 8-alkyl(oxy)-2-naphthyl or 10-alkyl(oxy)-9-anthracenyl.

The polymers according to the invention can be obtained, for example, by dehydrohalogenation polymerization from starting materials of the formula (II) in which the symbols and indices are as defined under the formula (I), and Hal and Hal' are Cl, Br or I; this is generally carried out by reacting one or more monomers with a suitable base in a suitable solvent.

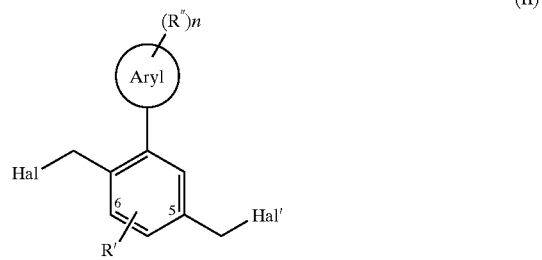

These monomers—with the exception of 2,5-bis (chloromethyl)4-methoxy-4'-(3,7-dimethyloctyloxy) biphenyl and 2,5-bis(chloromethyl)4-methoxy-3'-(3,7-dimethyloctyloxy)biphenyl, both of which were disclosed in WO 98/25874—are novel and are therefore likewise a subject-matter of this invention.

To this end, the monomers are dissolved in suitable solvents in suitable concentrations, brought to the suitable reaction temperature and mixed with the suitable amount of a suitable base. After a suitable reaction time has passed, the reaction solution can be terminated, for example by addition of acid. The polymer is subsequently purified by suitable methods familiar to the person skilled in the art, such as, for example, reprecipitation or extraction.

Examples of suitable solvents are ethers (for example diethyl ether, THF, dioxane, dioxolane and tert-butyl methyl ether), aromatic hydrocarbons (for example toluene, xylenes, anisole and methylnaphthalenes), alcohols (for example ethanol and tert-butanol), chlorinated compounds (for example chlorobenzene and dichlorobenzene) and mixtures of these solvents.

A suitable concentration range is the range from 0.005 to 5 mol/l (monomer/solution volume). Preference is given here to the range from 0.01 to 2 mol/l, very particularly preferably to the range from 0.01 to 0.5 mol/l.

The reaction temperature is generally from –80 to 200° C., preferably from 20 to 140° C.

Examples of suitable bases are alkali metal hydroxides (NaOH and KOH), hydrides (NaH and KH) and alkoxides (NaOEt, KOEt, NaOMe, KOMe and KO$^t$Bu), organometallic compounds (nBuLi, sBuLi, tBuLi and PhLi) and organic amines (LDA, DBU, DMAP and pyridine). A suitable amount is in the range from 2 to 10 equivalents (based on one equivalent of monomer), preferably from 3.5 to 8 equivalents, particularly preferably from 4 to 6 equivalents.

The reaction time is generally from 5 minutes to 24 hours, preferably from 0.5 to 6 hours, very particularly preferably from 1 to 4 hours.

This process is likewise a subject-matter of the invention.

The biaryl derivatives indicated in the formula (II) can be obtained by the route outlined in Scheme 1:

Scheme 1
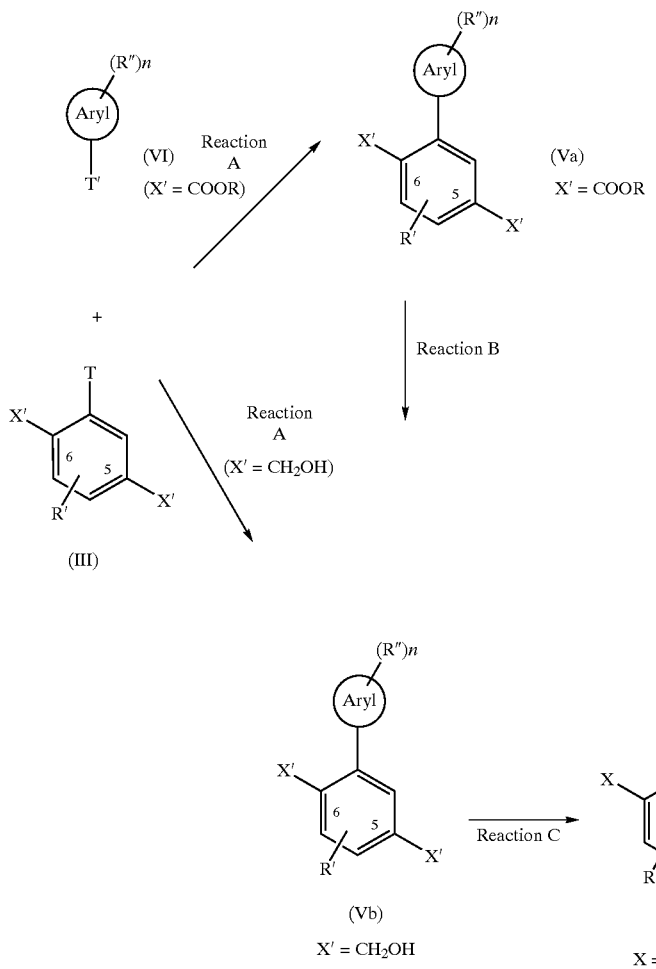
The starting compounds of the formulae (III) and (IV) are very readily accessible since they can be prepared in a simple manner and in large amounts from commercially available compounds.
Scheme 2
Preparation of the starting compound (III)
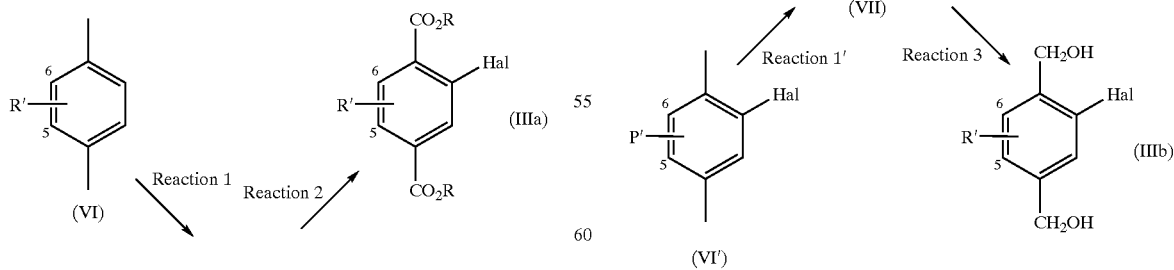
-continued
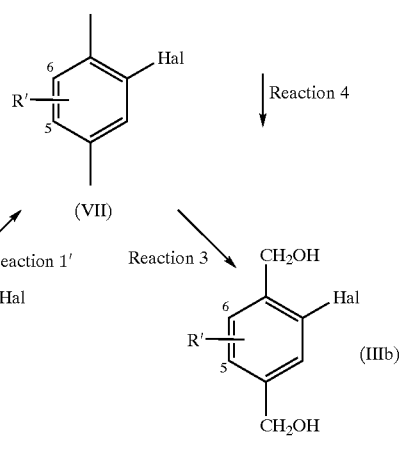

The reactions in Scheme 2 can be explained as follows: the 1,4-dimethyl compound (VI) is generally commercially available (for example 2,5-dimethylphenol, 2,5-dimethylaniline, 2,5-dimethylbenzonitrile or 2,5-dimethylanisole) or can be prepared simply from commercially available compounds (for example alkylation of a corresponding phenol or amine). The compound (VI) can be halogenated, for example chlorinated or brominated, on the aromatic ring by standard methods (see, for example, Organikum [Synthetic Organic Chemistry], VEB Deutscher Verlag der Wissenschaften, 15$^{th}$ Edition, pp. 391 ff., Leipzig 1984). The resultant compounds (VII) are accessible in good yields and in industrial quantities. Analogously, the compounds of the type (VI') are also either commercially available or can be prepared easily (for example 2,5-dibromo-p-xylene). These compounds can then likewise be converted into compounds of the type (VII) by standard reactions (for example nucleophilic substitution of a halogen by an alkoxy radical). (VII) can be converted, preferably catalytically (cobalt catalyst, atmospheric oxygen, see, for example, EP-A 0 121 684) into the corresponding 1,4-dicarboxylic acids (IIIa). Given a suitable choice of the reaction conditions, this is possible irrespective of the substituent. The resultant acids, (IIIa) with R=H, can, if desired, be converted into the corresponding esters (R≠H) by standard methods.

The compounds of the formula (IIIa), which are obtained virtually quantitatively in this way, can be converted into the bisalcohols (IIIb) by conventional reduction reactions. These bisalcohols are also obtainable directly from the compounds of the formula (VII) by oxidation (see, for example, A. Belli et al., Synthesis 1980, 477).

It may also prove advantageous to delay conversion of the substituent (P') into the substituent (R') until the stage of the carboxylic acid or its ester, i.e. to delay carrying out reaction (1') until this point: This is principally appropriate in the case of long-chain alkoxy substituents, since these would otherwise possibly be destroyed by air oxidation.

The halogen atom can, if desired, be replaced by a boric acid, borate or trialkyltin group at a suitable stage, as described below for the compounds of the formula (IVa).

The corresponding perfluoroalkylsulfonates can be prepared, for example, by esterification of corresponding phenol functions.

Scheme 3

Preparation of the starting compound (IV)

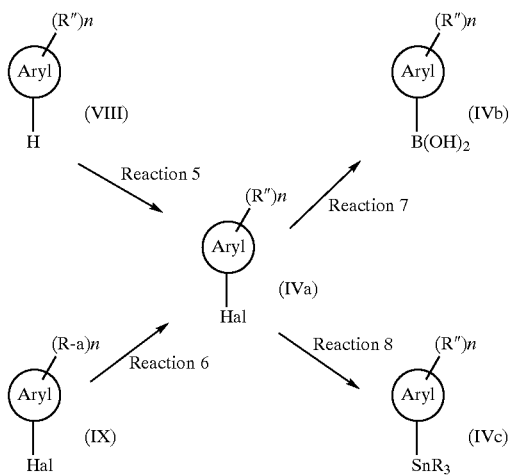

Scheme 3 can be explained as follows: the compounds (VIII) are generally commercially available (for example diverse alkyl- and dialkylaromatic compounds or alkoxyaromatic compounds) or can be prepared simply from corresponding precursors (for example hydroquinone, pyrocatechol, naphthol and the like), for example by alkylation. The compound (VIII) can then be converted into compounds of the formula (IVa) by simple halogenation reactions (Reaction 5), as described above. Many compounds of the formula (IV) are inexpensive chemicals (for example bromophenol and bromoaniline) which can be converted simply into compounds of the formula (IVa) by Reaction 6 (for example alkylation of phenyl functions). These compounds of the formula (IVa) can then be metallated by corresponding reagents (for example Mg turnings, n-BuLi or s-BuLi) and then converted into the corresponding compounds of the formula (IVb) or (IVc) by corresponding further reaction, for example with trialkyltin chloride or trialkyl borate.

It can thus be seen that the starting compounds (III) and (IV) are accessible in a simple manner in the requisite range of variations. The starting compounds (III) and (IV) are converted into intermediates of the formula (V) by a coupling reaction (Reaction A in Scheme 1).

To this end, the compounds of the formulae (III) and (IV) are reacted in an inert solvent at a temperature in the range from 0° C. to 200° C. in the presence of a palladium catalyst.

In each case one of these compounds, preferably the compound of the formula (III), contains a halogen or perfluoroalkylsulfonate group and the other contains a boric acid or borate group (IVb) or a trialkyltin group (IVc).

In order to carry out the above reaction A with boric acids or borates of the formula (IVb), Variant Aa, Suzuki coupling, the aromatic boron compound, the aromatic halogen compound or the perfluoroalkylsulfonate, a base and catalytic amounts of the palladium catalyst are added to water or to one or more inert organic solvents or preferably to a mixture of water and one or more inert organic solvents and stirred at a temperature of from 0 to 200° C., preferably from 30 to 170° C., particularly preferably from 50 to 150° C., especially preferably from 60 to 120° C., for a period of from 1 hour to 100 hours, preferably from 5 hours to 70 hours, particularly preferably from 5 hours to 50 hours. The crude product can be purified by methods known to the person skilled in the art and appropriate for the respective product, for example by recrystallization, distillation, sublimation, zone melting, melt crystallization or chromatography.

Examples of organic solvents which are suitable for the process described are ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide, dimethylacetamide and N-methylpyrrolidone, and nitriles, for example acetonitrile, propionitrile and butyronitrile, and mixtures thereof.

Preferred organic solvents are ethers, such as dimethoxyethane, diethylene glycol dimethyl ether, tetrahydrofuran, dioxane and diisopropyl ether, hydrocarbons, such as hexane, heptane, cyclohexane, toluene and xylene, alcohols, such as methanol, ethanol, 1-propanol, 2-propanol, 1-butanol, 2-butanol, tert-butanol and ethylene glycol, ketones, such as ethyl methyl ketone and isobutyl methyl ketone, amides, such as dimethylformamide, dimethylacetamide and N-methylpyrrolidone, and mixtures thereof.

Particularly preferred solvents are ethers, for example dimethoxyethane and tetrahydrofuran, hydrocarbons, for example cyclohexane, toluene and xylene, alcohols, for example ethanol, 1-propanol, 2-propanol, 1-butanol and tert-butanol, and mixtures thereof.

In a particularly preferred variant, water and one or more water-insoluble solvents are employed in the process described. Examples are mixtures of water and toluene and water, toluene and tetrahydrofuran.

Bases which are preferably used in the process described are alkali and alkaline earth metal hydroxides, alkali and alkaline earth metal carbonates, alkali metal hydrogencarbonates, alkali and alkaline earth metal acetates, alkali and alkaline earth metal alkoxides, and primary, secondary and tertiary amines.

Particular preference is given to alkali and alkaline earth metal hydroxides, alkali and alkaline earth metal carbonates and alkali metal hydrogencarbonates.

Particular preference is given to alkali metal hydroxides, such as sodium hydroxide and potassium hydroxide, and alkali metal carbonates and alkali metal hydrogencarbonates, such as lithium carbonate, sodium carbonate and potassium carbonate.

The base is preferably employed in the above process in a proportion of from 100 to 1000 mol %, particularly preferably from 100 to 500 mol %, very particularly preferably from 150 to 400 mol %, especially from 180 to 250 mol %, based on the aromatic boron compound.

The palladium catalyst contains palladium metal or a palladium(O) or palladium(II) compound and a complex ligand, preferably a phosphine ligand.

The two components can form a compound, for example the particularly preferred $Pd(PPh_3)_4$, or can be employed separately.

Examples of suitable palladium components are palladium compounds, such as palladium ketonates, palladium acetylacetonates, nitrilopalladium halides, olefinpalladium halides, palladium halides, allylpalladium halides and palladium biscarboxylates, preferably palladium ketonates, palladium acetylacetonates, bis-$\eta^2$-olefinpalladium dihalides, palladium(II) halides, $\eta^3$-allylpalladium halide dimers and palladium biscarboxylates, very particularly preferably bis(dibenzylideneacetone)palladium(O) [$Pd(dba)_2$)], $Pd(dba)_2$ $CHCl_3$, palladium bisacetylacetonate, bis(benzonitrile) palladium dichloride, $PdCl_2$, $Na_2PdCl_4$, dichlorobis(dimethylsulfoxide)palladium(II), bis(acetonitrile) palladium dichloride, palladium(II) acetate, palladium(II) propionate, palladium(II) butanoate and (1c,5c-cyclooctadiene)palladium dichloride.

The catalyst can also be palladium in metallic form, referred to below as simply palladium, preferably palladium in powdered form or on a support material, for example palladium on activated carbon, palladium on aluminum oxide, palladium on barium carbonate, palladium on barium sulfate, palladium on aluminum silicates, such as montmorillonite, palladium on $SiO_2$ and palladium on calcium carbonate, in each case with a palladium content of from 0.5 to 10% by weight. Particular preference is given to palladium in powdered form, palladium on activated carbon, palladium on barium and/or calcium carbonate and palladium on barium sulfate, in each case with a palladium content of from 0.5 to 10% by weight. Particular preference is given to palladium on activated carbon with a palladium content of 5 or 10% by weight.

The palladium catalyst is employed in the process according to the invention in a proportion of from 0.01 to 10 mol %, preferably from 0.05 to 5 mol %, particularly preferably from 0.1 to 3 mol %, especially preferably from 0.1 to 1.5 mol %, based on the aromatic halogen compound or the perfluoroalkylsulfonate.

Examples of ligands which are suitable for the process are phosphines, such as trialkylphosphines, tricycloalkylphosphines and triarylphosphines, where the three substituents on the phosphorus may be identical or different, chiral or achiral, and where one or more of the ligands can link the phosphorus groups from a plurality of phosphines, and where part of this link may also be one or more metal atoms.

Examples of phosphines which can be used in the process described here are trimethylphosphine, tributylphosphine, tricyclohexylphosphine, triphenylphosphine, trisolylphosphine, tris(o-tolyl)phosphine, tris(4-dimethylaminophenyl)phosphine, bis(diphenylphosphano) methane, 1,2-bis(diphenylphosphano)ethane, 1,3-bis(diphenylphosphano)propane and 1,1'-bis(diphenylphosphano)ferrocene. Examples of other suitable ligands are diketones, for example acetylacetone and octafluoroacetylacetone, and tertiary amines, for example trimethylamine, triethylamine, tri-n-propylamine and triisopropylamine. Preferred ligands are phosphines and diketones, particularly preferably phosphines. Very particularly preferred ligands are triphenylphosphine, 1,2-bis(diphenylphosphano)ethane, 1,3-bis(diphenylphosphano) propane and 1,1'-bis(diphenylphosphano)ferrocene, in particular triphenylphospine.

Also suitable for the process are water-soluble ligands containing, for example, sulfonic acid salt and/or sulfonic acid radicals and/or carboxylic acid salt and/or carboxylic acid radicals and/or phosphonic acid salt and/or phosphonic acid radicals and/or phosphonium groups and/or peralkylammonium groups and/or hydroxyl groups and/or polyether groups of suitable chain length.

Preferred classes of water-soluble ligands are phosphines substituted by the above groups, such as trialkylphosphines, tricycloalkylphosphines, triarylphosphines, dialkylarylphosphines, alkyldiarylphosphines and heteroarylphosphines, such as tripyridylphosphine and trifurylphosphine, where the three substituents on the phosphorus may be identical or different, chiral or achiral, and where one or more of the ligands can link the phosphorus groups from a plurality of phosphines, and where part of this link may also be one or more metal atoms, phosphites, phosphinites and phosphonites, phosphols, dibenzophosphols and cyclic- and oligo- and polycyclic compounds containing phosphorus atoms.

The ligand is employed in the process in a proportion of from 0.1 to 20 mol %, preferably from 0.2 to 15 mol %, particularly preferably from 0.5 to 10 mol %, especially preferably from 1 to 6 mol %, based on the aromatic halogen compound or the perfluoroalkylsulfonate. It is also possible, if desired, to employ mixtures of two or more different ligands.

All or some of the boronic acid derivative employed can be in the form of the anhydride.

Advantageous embodiments of the variant Aa process described are described, for example, in WO 94/101 05, EP-A-679 619, WO-A-694 530 and PCT/EP 96/03154, which are expressly incorporated herein by way of reference.

In variant Ab, also known as the Stille coupling, an aromatic tin compound, preferably of the formula (IVc), is reacted with an aromatic halogen compound or an aromatic perfluoroalkylsulfonate, preferably of the formula (III), at a temperature in the range from 0° C. to 200° C. in an inert organic solvent in the presence of a palladium catalyst.

A review of this reaction is given, for example, in J. K. Stille, Angew. Chemie Int. Ed. Engl. 1986, 25, 508.

In order to carry out the process, the aromatic tin compound [lacuna] the aromatic halogen compound or the perfluoroalkylsulfonate are preferably introduced into one or more inert organic solvents and stirred at a temperature of from 0° C. to 200° C., preferably from 30° C. to 170° C., particularly preferably from 50° C. to 150° C., especially preferably from 60° C. to 120° C., for a period of from 1 hour to 100 hours, preferably from 5 hours to 70 hours, particularly preferably from 5 hours to 50 hours. When the reaction is complete, the Pd catalyst obtained as a solid is separated off, for example by filtration, and the crude product is freed from solvent or solvents. Further purification can subsequently be carried out by methods known to the person skilled in the art and appropriate for the respective product, for example by recrystallization, distillation, sublimation, zone melting, melt crystallization or chromatography.

Examples of organic solvents which are suitable for the process described are ethers, for example diethyl ether, dimethoxyethane, diethylene glycol dimethyl ether, tetrahydrofuran, dioxane, dioxolane, diisopropyl ether and tert-butyl methyl ether, hydrocarbon, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketones, amides, for example dimethylformamide (DMF), dimethylacetamide and N-methylpyrrolidone, and nitriles, for example acetonitrile, propionitrile and butyronitrile, and mixtures thereof.

Preferred organic solvents are ethers, such as dimethoxyethane, diethylene glycol dimethyl ether, tetrahydrofuran, dioxane and diisopropyl ether, hydrocarbons, such as hexane, heptane, cyclohexane, benzene, toluene and xylene, alcohols, such as methanol, ethanol, 1-propanol, 2-propanol, 1-butanol, 2-butanol, tert-butanol and ethylene glycol, ketones, such as ethyl methyl ketone, or amides, such as DMF.

Particularly preferred solvents are amides, very particularly preferably DMF.

The palladium catalyst contains palladium metal or a palladium(O) or palladium(II) compound and a complex ligand, preferably a phosphine ligand.

The two components can form a compound, for example $Pd(PPh_3)_4$, or can be employed separately.

Examples of suitable palladium components are palladium compounds, such as palladium ketonates, palladium acetylacetonates, nitrilopalladium halides, olefinpalladium halides, palladium halides, allylpalladium halides and palladium biscarboxylates, preferably palladium ketonates, palladium acetylacetonates, bis-$\eta^2$-olefinpalladium dihalides, palladium(II) halides, $\eta^3$-allylpalladium halide dimers and palladium biscarboxylates, very particularly preferably bis(dibenzylideneacetone)palladium(O) [$Pd(dba)_2$)], $Pd(dba)_2$ $CHCl_3$, palladium bisacetylacetonate, bis(benzonitrile)palladium dichloride, $PdCl_2$, $Na_2PdCl_4$, dichlorobis(dimethylsulfoxide)palladium(II), bis(acetonitrile) palladium dichloride, palladium(II) acetate, palladium(II) propionate, palladium(II) butanoate and (1c,5c-cyclooctadiene)palladium dichloride.

The palladium catalyst is employed in the process described in a proportion of from 0.01 to 10 mol %, preferably from 0.05 to 5 mol %, particularly preferably from 0.1 to 3 mol %, especially preferably from 0.1 to 1.5 mol %, based on the aromatic halogen compound or the perfluoroalkylsulfonates.

Examples of ligands which are suitable for the process described are phosphines, such as trialkylphosphines, tricycloalkylphosphines and triarylphosphines, where the three substituents on the phosphorus may be identical or different, chiral or achiral, and where one or more of the ligands can link the phosphorus groups from a plurality of phosphines, and where part of this link may also be one or more metal atoms.

The ligand is employed in the process described in a proportion of from 0.1 to 20 mol %, preferably from 0.2 to 15 mol %, particularly preferably from 0.5 to 10 mol %, especially preferably from 1 to 6 mol %, based on the aromatic halogen compound or the perfluoroalkylsulfonate.

Reaction B

If the group X' in the intermediate (V) is —COOR, it is reduced to the bisalcohol, X'=$CH_2OH$.

The reduction can be carried out by known methods familiar to the person skilled in the art, as described, for example, in Houben-Weyl, $4^{th}$ Edn. Vol. 6, 16, Chapter VIII, Georg-Thieme-Verlag, Stuttgart 1984.

Preferred embodiments are the following:

a) Reaction with $LiAlH_4$ or diisobutylaluminum hydride (DIBAL-H) in tetrahydrofuran (THF) or toluene, as described, for example, in Organikum [Synthetic Organic Chemistry] (see above), pp. 612 ff.

b) Reaction with boron hydrides, such as $BH_3$, as described, for example, in Houben-Weyl, $4^{th}$ Edn. Vol. 6, 16, Chapter VIII, pp. 211–219, Georg-Thieme-Verlag, Stuttgart 1984.

c) Reaction with hydrogen in the presence of a catalyst, as described, for example, in Houben-Weyl, $4^{th}$ Edn. Vol. 6, 16, Chapter VIII, pp. 110 ff., Georg-Thieme-Verlag, Stuttgart 1984.

d) Reaction with sodium or sodium hydride.

Particular preference is given to reduction using $LiAlH_4$ or DIBAL-H.

Reaction C

In accordance with the invention, the OH groups in the bisalcohols of the formula (V) can be replaced by halogen by nucleophilic substitution.

In order to prepare chlorides and bromides, it is preferred to react the corresponding bisalcohol with HCl or HBr, for example in glacial acetic acid (see, for example, Houben-Weyl, Volume 5/4, pp. 385 ff., 1960) or with thionyl chloride or bromide, if desired in the presence of a catalyst (see, for example, Houben-Weyl, Volume 5/1b, pp. 862 ff., 1962). Chlorides can also preferably be prepared by reaction with phosgene (see, for example, Houben-Weyl, Volume V, 3, pp. 952 ff, 1962) or with $BCl_3$, and bromides by reaction with $PBr_3$.

Iodides can preferably be prepared by reaction with phosphorus/iodine by the method of A. I. Vogel (see, for example, Houben-Weyl, Volume V, 4, pp. 615 ff., 1969).

Alternatively, the halides can be interchanged in a comparable manner to the FINKELSTEIN reaction; thus, monomers containing two different halides, or mixtures thereof, can also advantageously be employed. The work-up is carried out in all cases in a simple manner by known methods familiar to a person skilled in the art.

The synthetic methods described here enable, for example, the preparation of the following monomers which can be converted into polymers according to the invention.

Monomer 1
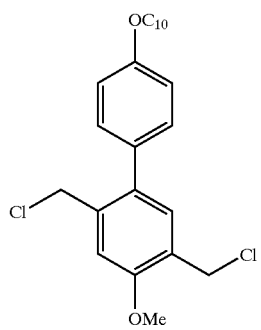
Monomer 2
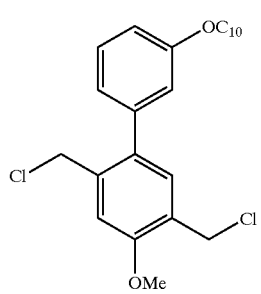
Monomer 3
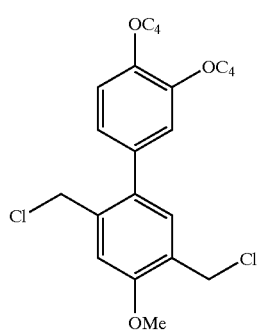
Monomer 4
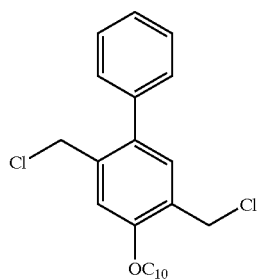
Monomer 5
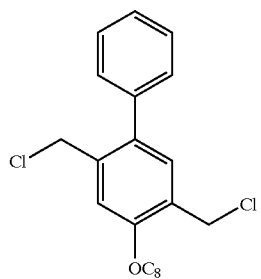
-continued
Monomer 6
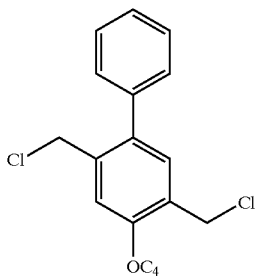
Monomer 7
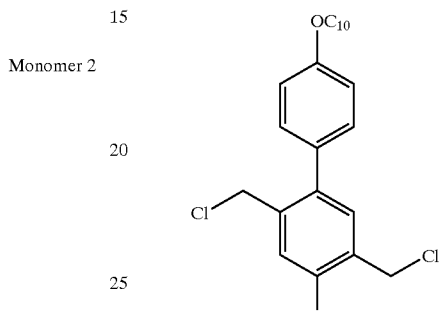
Monomer 8
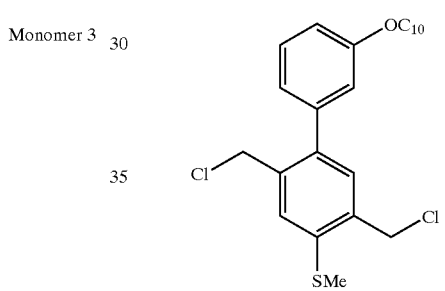
Monomer 9
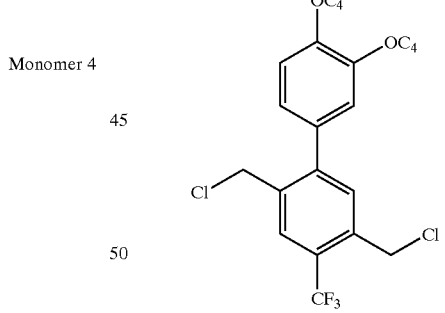
Monomer 10
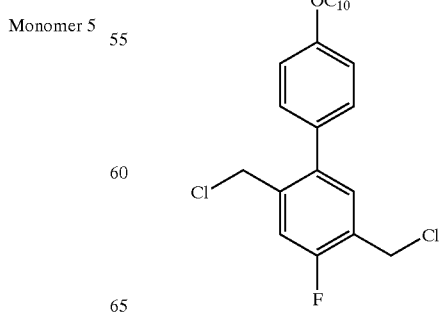

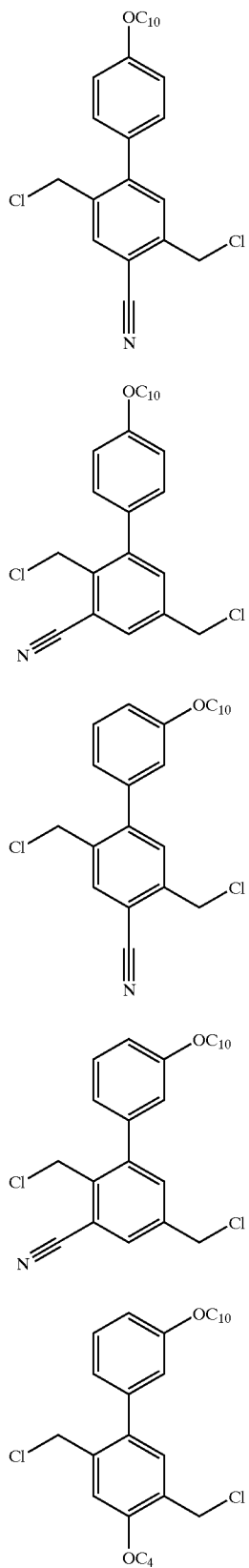
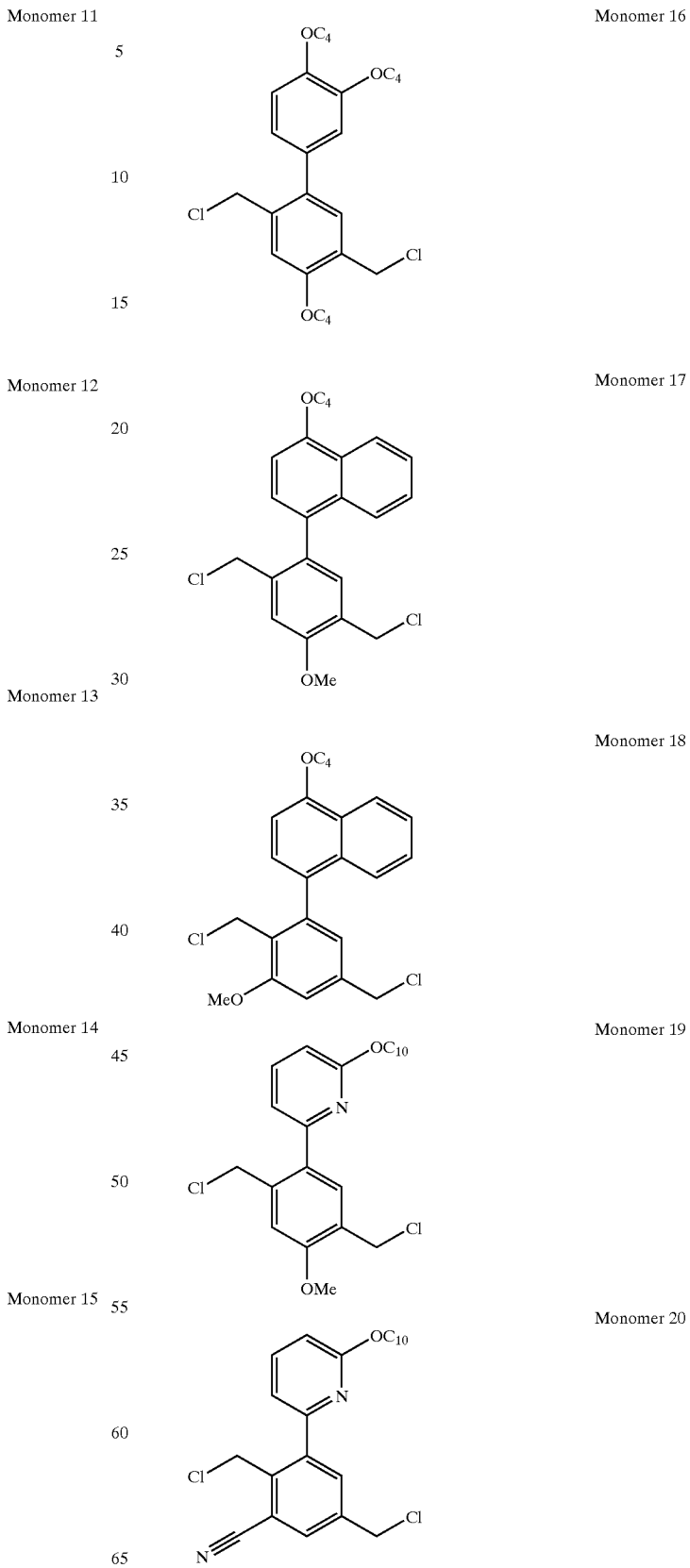

-continued

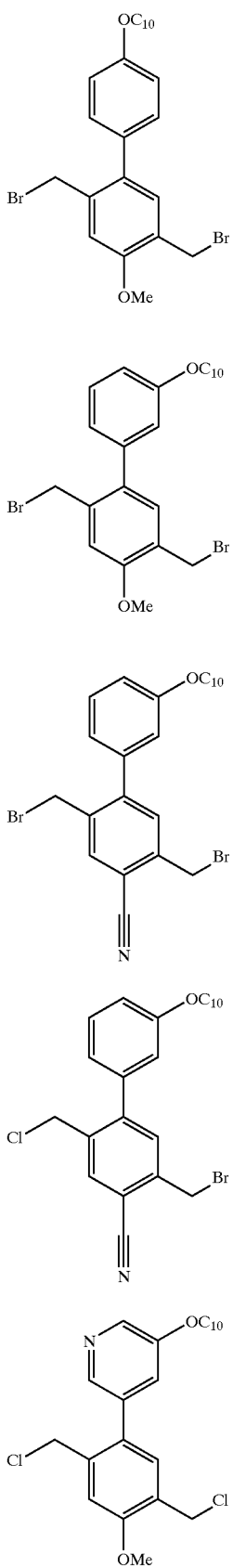

Monomer 21

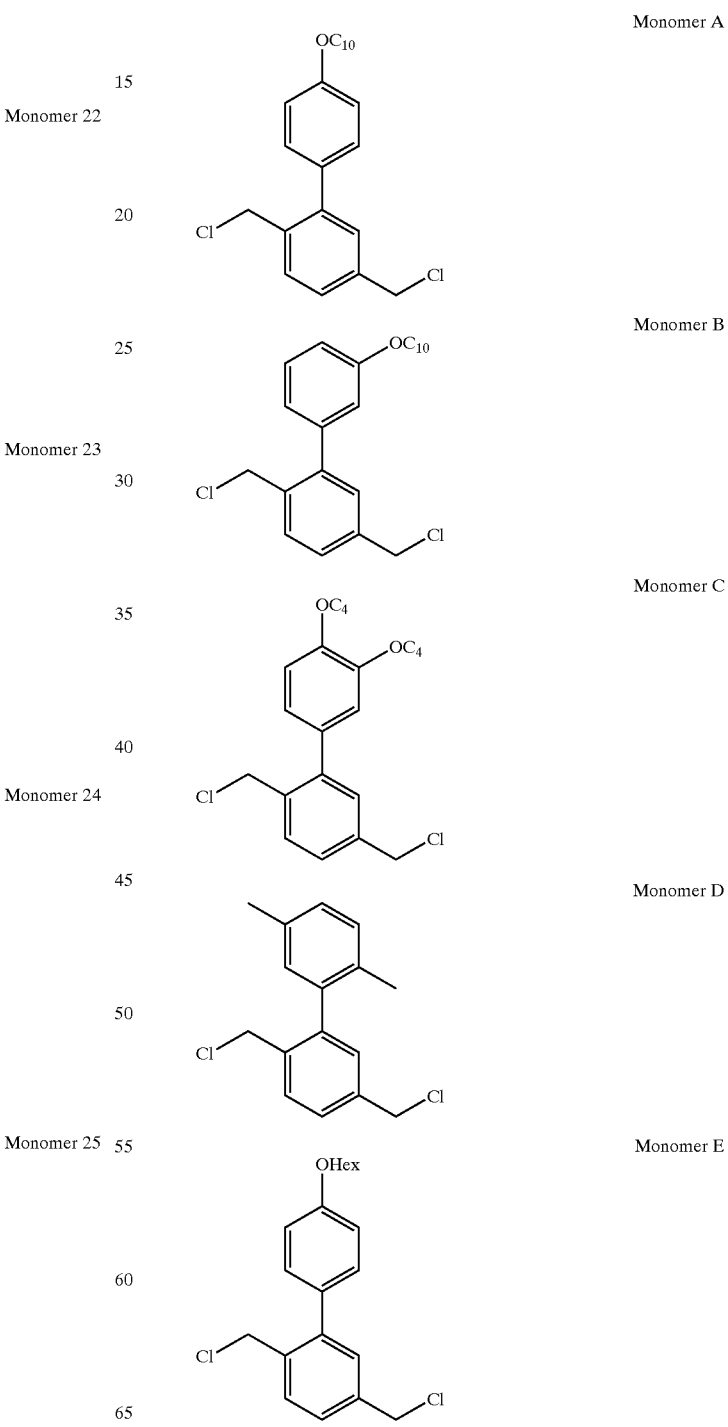

Monomer 22

Key: $C_4$: 2-methylpropyl; $C_8$: 2-ethylhexyl; $C_{10}$: 3,7-dimethyloctyl.

Polymers comprising recurring units of the formula (I) can be prepared from the monomers of the formula (II) accessible in this way by the polymerization variant indicated above—if desired with addition of further comonomers. Comonomers of this type are, for example, the compounds shown below.

Monomer A

Monomer B

Monomer C

Monomer D

Monomer E

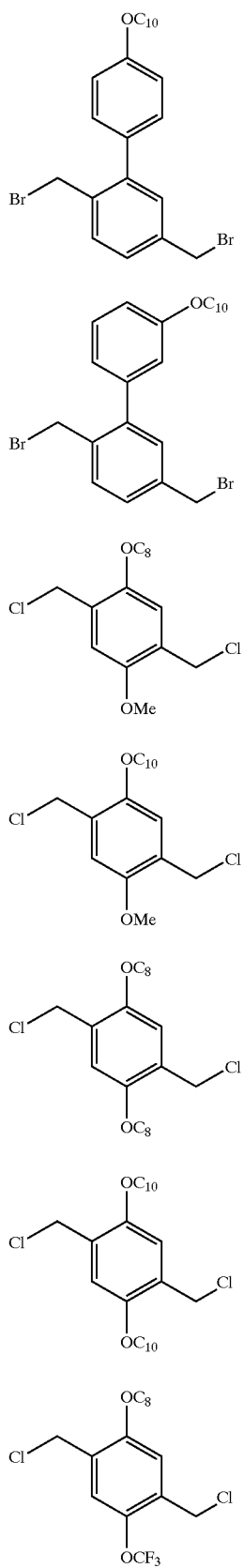
Monomer F
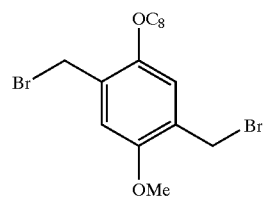
Monomer M
Monomer G
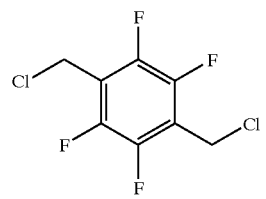
Monomer N
Monomer H
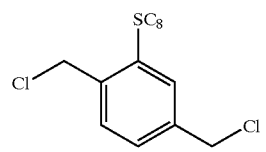
Monomer O
Monomer I
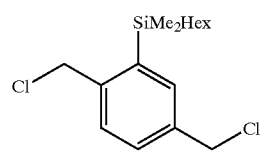
Monomer P
Monomer J
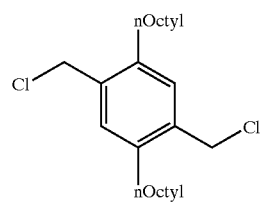
Monomer Q
Monomer K
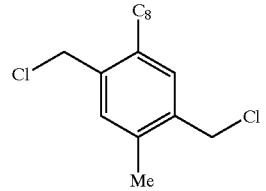
Monomer R
Monomer L
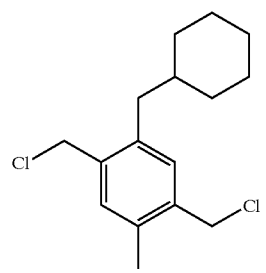
Monomer S Monomer T

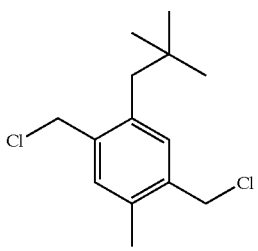

Key: C$_4$: 2-methylpropyl; C$_8$: 2-ethylhexyl; C$_{10}$: 3,7-dimethyloctyl.

The homopolymers or copolymers according to the invention produced in this way are very particularly suitable as electroluminescent materials. For the purposes of the present invention, the term "electroluminescent materials" is taken to mean materials which can be used as an active layer in an electroluminescent device. The term "active layer" means that the layer is capable of emitting light (light-emitting layer) on application of an electric field and/or that it improves the injection and/or transport of the positive and/or negative charges (charge injection or charge transport layer).

The invention therefore also relates to the use of a polymer comprising at least 20% of recurring units of the formula (I) in an electroluminescent device, in particular as electroluminescent material.

In order to be used as electroluminescent materials, the polymers comprising structural units of the formula (I) are generally applied in the form of a film to a substrate by known methods familiar to the person skilled in the art, such as dipping or spin coating.

The invention thus likewise relates to an electroluminescent device having one or more active layers, where at least one of these active layers comprises one or more polymers according to the invention. The active layer can be, for example, a light-emitting layer and/or a transport layer and/or a charge-injection layer.

The general construction of electroluminescent devices of this type is described, for example, in U.S. Pat. No. 4,539,507 and U.S. Pat. No. 5,151,629. Electroluminescent devices containing polymers are described, for example, in WO-A 90/13148 and EP-A 0 443 861.

They usually contain an electroluminescent layer between a negative electrode and a positive electrode, where at least one of the electrodes is transparent. In addition, one or more electron-injection and/or electron-transport layers can be introduced between the electroluminescent layer and the negative electrode and/or one or more hole-injection and/or hole-transport layers can be introduced between the electroluminescent layer and the positive electrode. Suitable negative electrodes are preferably metals or metal alloys, for example Ca, Mg, Al, In or Mg/Ag. The positive electrodes can be metals, for example Au, or other metallically conducting substances, such as oxides, for example ITO (indium oxide/tin oxide) on a transparent substrate, for example made of glass or a transparent polymer.

In operation, the negative electrode is set to a negative potential compared with the positive electrode. Electrons are injected by the negative electrode into the electron-injection layered-electron-transport layer or directly into the light-emitting layer. At the same time, holes are injected by the positive electrode into the hole-injection layer/hole-transport layer or directly into the light-emitting layer.

The injected charge carriers move through the active layers toward one another under the effect of the applied voltage. This results in electron/hole pairs recombining at the interface between the charge-transport layer and the light-emitting layer or within the light-emitting layer with emission of light.

The color of the emitted light can be varied by means of the materials used as light-emitting layer.

Electroluminescent devices are used, for example, as self-illuminating display elements, such as control lamps, alphanumeric displays, signs and in opto-electronic couplers.

The invention is explained in greater detail by the examples which follow, without this being intended to represent a limitation.

Part 1: Synthesis of the Monomers
A. Synthesis of Compounds of the Formula (III)

Example A1

Synthesis of diethyl 2-bromo-5-methoxyterephthalate a) Synthesis of 4-bromo-2,5-dimethylanisole Bromine (291.5 g, 1835 mmol) was added dropwise with stirring to an initially introduced mixture of 2,5-dimethylanisole (250 g, 1835 mmol) and Fe powder (3.25 g). The commencement of the reaction was evident from gas evolution. The remainder of the bromine was subsequently added dropwise over the course of 30–40 minutes at room temperature with water-bath cooling. The reaction mixture was stirred for about a further 4 hours. The Fe powder was subsequently separated off, a little chloroform was added to the solution, and the solution was washed by shaking with water, resulting in the solution becoming paler. After the solution had been shaken with 50 ml of saturated aqueous Na$_2$SO$_3$ solution, it had become completely colorless. The solution was shaken again with dilute aqueous NaOH and twice with H$_2$O and dried, and the solvent was stripped off. The crude product was subjected to fractional distillation under reduced pressure.

The product was obtained as a viscous, colorless oil (boiling point 68° C., 0.8 mbar): 285 g (72%)

$^1$H NMR (CDCl$_3$): [ppm]=7.25 (s, 1 H, H-aryl), 6.68 (s, 1 H, H-aryl), 3.78 (s, 3 H, O-Me), 2.36, 2.14 (each s, 3+3 H, CH$_3$).

b) Synthesis of 2-bromo-5-methoxyterephthalic Acid

A solution of cobalt acetate tetrahydrate (1.25 g, 5 mmol), manganese acetate tetrahydrate (1.23 g), HBr (0.81 g), sodium acetate (1.37 g) and 4-bromo-2,5-dimethylanisole (107.5 g, 0.5 mol) in 380 g of glacial acetic acid was introduced into a 1 l autoclave (HC-22) fitted with disk agitator, reflux condenser, gas inlet and gas outlet. The reaction solution was heated to 150° C. with stirring under a nitrogen atmosphere (17 bar). Air (17 bar) was passed through the solution (180–200 l/h) at this temperature, after which the exothermic reaction immediately commenced. The reaction temperature remained at 150° C. due to external cooling. The exothermic reaction was complete after about 45 minutes. In order to facilitate a subsequent reaction, an air/nitrogen mixture (10% of O$_2$) was passed through the solution at 150° C. for 30 minutes. The supply of air was then terminated, and nitrogen was introduced.

The reactor contents were cooled to 100° C. under a nitrogen atmosphere, discharged into a flask as a solution and cooled to 20° C. with stirring, during which the product crystallized out. The colorless crystal slurry was filtered off with suction and washed four times with 40 g of glacial acetic acid each time.

Drying gave 96.2 g of 2-bromo-5-methoxyterephthalic acid (70%).

$^1$H NMR (DMSO): [ppm]=13.5 (br, 2 H, COOH), 7.87 (s, 1 H, H-aryl), 7.42 (s, 1 H, H-aryl), 3.88 (s, 3 H, 0-Me).

c) Synthesis of diethyl 2-bromo-5-methoxyterephthalate

2-Bromo-5-methoxyterephthalic acid (202.89 g, 738 mmol) was initially introduced with 500 ml of EtOH under a protective gas, and $H_2SO_4$ was then added at RT with stirring. The mixture was subsequently refluxed at an internal temperature of 78° C., and EtOH was distilled off until the internal temperature was above 100° C. Ethanol was firstly added once more and then distilled off again. The process was repeated until only the diester was present according to TLC. Finally, all the ethanol was stripped off, the resultant crude product was taken up in ethyl acetate and extracted with aqueous $NaHCO_3$ solution, and finally, after phase separation and drying, all the solvent was again stripped off. The solidified solid obtained was, after comminution, purified by stirring with hexane, giving 190.4 g (78%) of pale-yellow crystals.

Melting point: 61–63° C.

$^1$H NMR (CDCl$_3$): [ppm]=8.00 (s, 1 H, H-aryl), 7.34 (s, 1 H, H-aryl), 4.43+4.37 (each q, 2+2 H, OCH$_2$, J=7.5 Hz), 3.92 (s, 3 H, O-Me), 1.42+1.38 (each t, 3+3 H, CH$_3$, J=7.5 Hz).

Example A2

Synthesis of diethyl 2-bromo-5-fluoroterephthalate a) Synthesis of 2-bromo-5-nitro-p-xylene 740 g of bromo-p-xylene were initially introduced in acetic anhydride (ice-bath cooling) and nitrating acid (prepared from 400 ml of fuming nitric acid and 480 ml of concentrated sulfuric acid) was slowly added dropwise. During the addition, it was ensured that the internal temperature remained between 22° C.–25° C. When the addition was complete (duration about 5 hours), the ice bath was removed, and the mixture was stirred at RT for about a further 1 hour.

The entire batch was poured onto 4 l of ice with vigorous stirring; a viscous oil separated out during this operation. The aqueous phase was decanted off, water was again added to the oil, and the mixture was stirred. This procedure (decanting off and purification) was repeated three times. Finally, methanol was added, giving a crystalline solid, which was filtered off with suction and recrystallized again from a little methanol, finally giving 230 g (30%) of orange-yellow crystals.

Melting point: 62–65° C.

$^1$H NMR (CDCl$_3$): [ppm]=7.88 (s, 1 H, H-aryl), 7.53 (s, 1 H, H-aryl), 2.55, 2.44 (each s, 3+3 H, CH$_3$).

b) Synthesis of 2-amino-5-bromo-p-xylene 316 g of 2-bromo-5-nitro-p-xylene were dissolved in 3000 ml of methanol, freshly produced Raney nickel (about 4 g) was added under a vigorous stream of N$_2$, and the mixture was heated to reflux with vigorous stirring. 275 ml of hydrazine hydrate (80% in water) were then slowly added dropwise. When the dropwise addition was complete (duration about 5 hours), the mixture was refluxed for about a further 6 hours. The catalyst was filtered off, the methanol was removed in a rotary evaporator, the residue was taken up in ethyl acetate, and the solution was washed by shaking with water, dried and re-evaporated in a rotary evaporator. The resultant crude product was recrystallized from heptane, giving 238 g (87%) of pale-green crystals.

Melting point: 92–93° C.

$^1$H NMR (CDCl$_3$): [ppm]=7.18 (s, 1H, H-aryl), 6.56 (s, 1H, H-aryl), 3.6 (s (br), 2 H, NH$_2$), 2.27, 2.09 (each s, 3+3 H, CH$_3$).

c) Synthesis of 2-bromo-5-fluoro-p-xylene 373 g of 2-amino-5-bromo-p-xylene were suspended in 1860 ml of H$_2$O in a 4 l four-necked flask, the mixture was cooled to 3° C. (internal temperature), and 612 ml of tetrafluoroboric acid were added. 154 g of NaNO$_2$ in 300 ml of water were then added dropwise over the course of 60 minutes. After 60 minutes, the solid was filtered off with suction and washed with a little cold 5% tetrafluoroboric acid, then with a little cold methanol and finally with a little cold diethyl ether. The yellow solid (497 g=90%) was dried overnight in an oil-pump vacuum.

The batch was then halved, and each half was suspended in about 500 ml of toluene. The suspensions were heated using a hair drier; each time vigorous evolution of gas commenced, the heating was stopped until it subsided again. Finally, the mixture was refluxed until the evolution of gas was complete. The toluene was removed in a rotary evaporator, and the product was purified by distillation under reduced pressure (0.1 mbar, 54–57° C.), giving (in total) 232 g (61%) of colorless oil.

$^1$H NMR (CDCl$_3$): [ppm]=7.32 (d, 1H, H-aryl, J$_{H-F}$=7 Hz), 6.88 (d, 1H, H-aryl, J$_{H-F}$=10 Hz), 2.33 (s, 3 H, CH$_3$), 2.21 (d, 3 H, CH$_3$, J$_{H-F}$=2 Hz).

d) Synthesis of 2-bromo-5-fluoroterephthalic Acid

The reaction was carried out analogously to Example A1 (b).

Drying gave 88% 2-bromo-5-fluoroterephthalic acid.

$^1$H NMR (DMSO-d$_6$): [ppm]=13.8 (br, 2 H, COOH), 8.07 (d, 1 H, H-aryl, J$_{H-F}$=7 Hz), 7.68 (d, 1H, H-aryl, J$_{H-F}$=10.5 Hz).

e) Synthesis of diethyl 2-bromo-5-fluoroterephthalate

The reaction was carried out analogously to Example A1 (c). Purification was carried out by stirring with hexane. Drying gave 99% of diethyl 2-bromo-5-fluoroterephthalate as a virtually white powder.

Melting point: 30° C.

$^1$H NMR (CDCl$_3$): [ppm]=8.19 (d, 1H, H-aryl, J$_{H-F}$=6.5 Hz), 7.56 (d, 1H, H-aryl, J$_{H-F}$=10.5 Hz), 4.43+4.42 (each q, 2+2 H, OCH$_2$, J=7.5 Hz), 1.42+1.41 (each t, 3+3 H, CH$_3$, J=7.5 Hz).

Example A3

Synthesis of diethyl 2-bromo-5-chloroterephthalate a) Synthesis of 2-bromo-5-chloro-p-xylene Chloro-p-xylene was brominated analogously to Example A1 (a). Recrystallization from methanol gave 72% of 2-bromo-5-chloro-p-xylene as a white powder.

Melting point: 66–67° C.

$^1$H NMR (CDCl$_3$): [ppm]=7.38 (s, 1 H, H-aryl), 7.19 (s, 1H, H-aryl), 2.32, 2.30 (each s, 3+3 H, CH$_3$).

b) Synthesis of 2-bromo-5-chloroterephthalic acid

The reaction was carried out analogously to Example A1 (b). Drying gave 87% of 2-bromo-5-chloroterephthalic acid.

$^1$H NMR (DMSO-d$_6$): [ppm]=13.9 (br, 2 H, COOH), 8.07 (s, 1 H, H-aryl), 7.88 (s, 1 H, H-aryl).

c) Synthesis of diethyl 2-bromo-5-chloroterephthalate

The reaction was carried out analogously to Example A1 (c). The purification was carried out by stirring with hexane. Drying gave 98% of diethyl 2-bromo-5-chloroterephthalate as a virtually white powder.

Melting point: 125° C.

¹H NMR (CDCl₃): [ppm]=8.08 (s, 1H, H-aryl), 7.84 (s, 1H, H-aryl), 4.43+4.41 (each q, 2+2 H, OCH₂, J=7.5 Hz), 1.42+1.38 (each t, 3+3 H, CH₃, J=7.5 Hz).

B. Synthesis of Compounds of the Formula (IV)

Example B1

Synthesis of 3-(3,7-dimethyloctyloxy) benzeneboronic Acid a) Synthesis of 3-(3,7-dimethyloctyloxy)bromobenzene 450 ml of ethanol were initially introduced, and NaI (10.5 g; 70 mmol) and KOH (67.3 g; 1.2 mol) were added. A temperature increase from 25 to 40° C. after addition of the KOH was observed. After the mixture had been cooled to room temperate, 3-bromophenol (176.5 g; 1 mol) was added, during which the white suspension became beige. 3,7-Dimethyloctyl chloride (186.32 g; 212.94 ml; 1.05 mol) was added over the course of 3 minutes via a dropping funnel. The mixture was stirred at RT for a further 2 hours and subsequently stirred at an internal temperature of 80° C. for 96 hours. Ethanol was distilled off. The residue was taken up in ethyl acetate, and the precipitate was separated off by filtration. The organic phase was extracted three times with 10% strength by weight aqueous NaOH solution and washed once with H₂O, three times with H₂O which had been acidified using CO₂ and again with H₂O. After the mixture had been dried using MgSO₄, the solvent was stripped off again in a rotary evaporator, and the crude product was purified by fractional distillation under reduced pressure.

Product: high-boiling colorless oil; 180° C. at 2–3 mbar; 262.3 g (84%)

¹H NMR (400 MHz; CDCl₃): [ppm]=7.12 (pseudo-t; 1H; J=8 Hz; H-5), 7.05 (m; 2 H; H-2, H-6), 6.81 (ddd; 1H; J₁=8, J₂=2, J₃=0.7 Hz; H-4), 3.97 (m; 2 H; O—CH₂), 1.81 (m; 1H; O—CH₂—CH₂—CH), 1.70–1.50 (m; 3 H; H-alkyl), 1.35–1.13 (m; 6 H; H-alkyl), 0.93 (d; 3 H; J=7.7 Hz; CH₃), 0.87 (d; 6 H; J=7.7 Hz; CH₃).

b) Synthesis of 3-(3,7-dimethyloctyloxy)benzeneboronic Acid

Mg turnings (24.7 g, 1.02 mol) were initially introduced, and the apparatus was dried by heating under argon. About 100 ml of THF were introduced at room temperature via the dropping funnel, and a few crystals of iodine were added. A few ml of 3-(3,7-dimethyloctyloxy)bromobenzene were subsequently added dropwise to the static solution, and the mixture was heated at the point where the drops entered using a hot-air blower. When the reaction had commenced, the remainder of the 3-(3,7-dimethyloctyloxy) bromobenzene (total: 313 g, 1 mol, 280 ml) was continuously added dropwise (70 minutes) with stirring. At the same time, a further 1100 ml of THF were added. The reaction batch was refluxed for a further two hours.

The resultant Grignard reagent was, after cooling to room temperature, added dropwise under a protective gas and with rapid stirring to a mixture, cooled to −70° C., of 800 ml of THF and 123 ml of trimethyl borate (114 g, 1.10 mol) at such a rate that the internal temperature did not exceed −60° C. (duration: 3 hours). A pale suspension formed.

The reaction mixture was stirred into 1200 g of ice water/40 ml of conc. H₂SO₄. The clear phases were separated, and the water phase was extracted by shaking with ethyl acetate. The combined organic phases were stirred with water, dried and evaporated. For further purification, the colorless solid obtained in this way was stirred with about 500 ml of hexane (to which 2 ml of conc. aqueous HCl had been added), giving 239 g (86%) of a colorless crystal powder.

Melting point: 83–89° C.

¹H NMR (400 MHz; CDCl₃): [ppm]=7.81 (td; 1H; J₁=8, J₂=1.3 Hz; H-4), 7.73 (dd; 1H; J₁=2, J₂=1.1 Hz; H-2), 7.43 (t; 1H; J=8 Hz; H-5), 7.13 (ddd; 1H; J₁=8, J₂=2, J₃=1.1 Hz; H-6), 4.11 (m; 2 H; O—CH₂), 1.90 (m; 1 H; O—CH₂—CH₂—CH), 1.75–1.50 (m; 3 H; H-alkyl), 1.44–1.14 (m; 6 H; H-alkyl), 1.00 (d; 3 H; J=7.9 Hz; CH₃), 0.88 (d; 6 H; J=7.8 Hz; CH₃). Contains variable proportions of anhydrides.

Example B2

Synthesis of 4-(3,7-dimethyloctyloxy) benzeneboronic Acid a) Synthesis of 4-(3,7-dimethyloctyloxy)bromobenzene Procedure analogous to Example B1, a).

Yield: 85%

Boiling point: 180° C. at 2 mbar

¹H NMR (CDCl₃): [ppm]=7.36, 6.77 (AA'BB', 4 H, H-aryl), 3.95 (m, 2 H, O—CH₂), 1.82 (m, 1H, H-3'), 1.6 (m, 3 H, H-2', H-7'), 1.24 (m, 6 H, H-4', H-5', H-6'), 0.94 (d, 3 H, Me, J=7 Hz), 0.87 (d, 6 H, Me, J=7 Hz).

b) Synthesis of 4-(3,7-dimethyloctyloxy)benzeneboronic Acid

Procedure analogous to Example B1, b).

Yield: 83%

Melting point: 57–63° C.

¹H NMR (CDCl₃): [ppm]=7.67, 6.92 (AA'BB', 4 H, H-aryl), 4.6 (br, 2 H, B(OH)₂), 4.03 (m, 2 H, O—CH₂), 1.87 (m, 1H, H-3'), 1.65 (m, 3 H, H-2', H-7'), 1.27 (m, 6 H, H-4', H-5', H-6'), 0.95 (d, 3 H, Me, J=7 Hz), 0.87 (d, 6 H, Me, J=7 Hz). Contains variable proportions of anhydrides.

Example B3

Synthesis of 3,4-bis(2-methylpropoxy) benzeneboronic Acid a) Synthesis of 1,2-bis(2-methylpropoxy)benzene Pyrocatechol (220.22 g, 2 mol) and NaI (10.49 g, 0.14 mol) were initially introduced in 900 ml of ethanol, and the mixture was heated to reflux. KOH (56.11 g, 1 mol) dissolved in about 300 ml of ethanol and simultaneously 1-bromo-2-methylpropane (137.03 g, 1 mol, 108.75 ml) were subsequently slowly added dropwise. The mixture was refluxed further overnight. On the next day, the same amount of KOH and alkyl bromide were again added. This procedure was repeated a total of seven times.

After the reaction mixture had been cooled, the supernatant was decanted off from the solid. The filter cake was rinsed with ethanol. The organic phase was evaporated. The filter cake was dissolved in 1 l of warm water, and the organic phase diluted with ethyl acetate was added. Phase separation was followed by repeated stirring with 10% strength aqueous NaOH, washing with water and drying over Na₂SO₄. The crude product obtained after the solvent had been stripped off was subjected to fractional distillation under reduced pressure.

The product was obtained as a colorless oil (boiling point: 82° C. at 0.18 mbar): 333.4 g (75%).

¹H NMR (CDCl₃): [ppm]=6.87 (ps-s, 4 H, H-aryl), 3.75 (d, 4 H, O—CH₂, J=8 Hz), 2.13 (ps-non, 2 H, C—H, J=8 Hz), 1.05 (d, 12 H, CH₃, J=8 Hz).

b) Synthesis of 3,4-bis(2-methylpropoxy)bromobenzene 1,2-bis(2-methylpropoxy)benzene (359.61 g, 1.62 mol) was initially introduced with 500 ml of CH₂Cl₂, and a little iron powder was added. Bromine (266.88 g, 1.78 mol) (mixed with about 200 ml of CH₂Cl₂) was then slowly added dropwise with cooling. The batch was stirred at room temperature for about 20 hours. For work-up, the batch was stirred with aqueous Na$_2$SO$_3$ solution, and the iron powder was subsequently filtered off. The organic phase was then washed by shaking 2× with NaHCO$_3$ solution, and subsequently washed with water until neutral. After drying, the organic phase was evaporated.

Double fractional distillation gave the desired product as a colorless solid (166.9 g, 34%).

Melting point: 47° C.

$^1$H NMR (CDCl$_3$): [ppm]=6.98 (m, 2 H, H-2, H-6), 6.73 (m, 1H, H-5), 3.72, 3.70(2×d, 2×2 H, O—CH$_2$, J=8 Hz), 2.12 (m, 2 H, CH), 1.04 (m, 12 H, CH$_3$).

c) Synthesis of 3,4-bis(2-methylpropoxy)benzeneboronic Acid

Procedure analogous to Example B1, b).

Yield: 76%

Melting point: 146° C.

$^1$H NMR (CDCl$_3$): [ppm]=7.81 (dd, 1H, H-6, J$_1$=8 Hz, J$_2$=1.8 Hz), 7.68 (d, 1H, H-2, J=1.8 Hz), 6.99 (d, 1H, H-5, J=8 Hz), 3.89, 3.84 (2×d, 2×2 H, O—CH$_2$, J=8 Hz), 2.13 (m, 2 H, CH), 1.07 (m, 12 H, CH$_3$). Contains variable proportions of anhydrides.

Example B4

Synthesis of 2,5-dimethoxybenzeneboronic Acid

The synthesis was carried out analogously to Example B1 (b) (2,5-dimethoxybromobenzene: AVOCADO). The product was obtained as a white powder in a yield of 90%. $^1$H NMR (CDCl$_3$): [ppm]=7.38 (d, 1H, H-6, J=2 Hz), 6.98 (dd, 1H, H-4, J=2 Hz, J=8 Hz), 6.86 (d, 1H, H-3, J=8 Hz), 6.10 (s, 2 H, OH), 3.88+3.81 (each s, 3+3 H, OCH$_3$).

Example B5

Synthesis of 2,5-dimethylbenzeneboronic Acid

The synthesis is described in WO98/25874 as Example B3.

Example B6

Synthesis of 4-fluorobenzeneboronic Acid

The synthesis was carried out analogously to Example B1 (b) (4-fluorobromobenzene: Aldrich). The product was obtained as a white powder in a yield of 86%. (Contains about 25% of anhydride)

$^1$H NMR (DMSO-d$_6$): [ppm]=7.90 (dd, 2 H, H-3, H-5, J=6 Hz, J=8.2 Hz), 7.84 (dd, 0.5 H, H-3, H-5 anhydride, J=6 Hz, J=8.2 Hz); 7.18 (ps. t, 2 H, H-2, H-6, J=8.4 Hz);); 7.14 (ps. t, 0.5 H, H-2, H-6-anhydride; J=8.4 Hz).

Example B7

Synthesis of 3,5-difluorobenzeneboronic Acid

The synthesis was carried out analogously to Example B1 (b) (3,5-difluorobromobenzene: Aldrich). The product was obtained [lacuna] a white powder in a yield of 68%. (Contains about 10% of anhydride).

$^1$H NMR (DMSO-d$_6$): [ppm]=7.46 (d with shoulder, 2 H, H-2,H-6, J=6 Hz), 7.40 (d with shoulder, 0.2 H, H-2, H-6 anhydride, J=6 Hz); 7.21 (ps. t with shoulder, 1H, H-4, J=9.2 Hz).

C. Coupling Reactions in Accordance with Reaction A

Example C1

Synthesis of diethyl 2-[4-(3,7-dimethyloctyloxy) phenyl]-5-methoxyterephthalate

Diethyl 2-bromo-5-methoxyterephthalate (49.67 g, 150 mmol), K$_2$CO$_3$ (44.23 g, 320 mmol), 140 ml of toluene and 140 ml of H$_2$O were initially introduced and flushed with argon for 30 minutes. 4-(3,7-dimethyloctyloxy)boronic acid (44.51 g, 160 mmol) and Pd(PPh$_3$)$_4$ (0.7 g, 0.6 mmol) were subsequently added under a protective gas. The brownish mixture, which was cloudy due to phase separation, was stirred vigorously at an internal temperature of 85° C. under a protective-gas blanket. The reaction was complete after 24 hours (according to TLC). Palladium residues were removed by stirring with 1% strength aqueous NaCN solution. After the phases had been separated, the organic phase was washed (neutral) by shaking firstly with water and subsequently with dilute HCl/H$_2$O and subsequently evaporated to dryness in a rotary evaporator. The product (95% yield) was a colorless high-viscosity oil (purity>97%).

$^1$H NMR (CDCl$_3$): [ppm]=7.75, 7.35 (2×s, 2×1H, H-3, H-6), 7.20, 6.91 (AA'BB', 4 H, H-aryl), 4.37, 4.12 (2×q, 2×2 H, CO$_2$CH$_2$, J=7.6 Hz), 4.02 (m, 2 H, O—CH$_2$), 3.97 (s, 3 H, O-Me), 1.84 (m, 1H, H-3''), 1.62 (m, 3 H, H-2'', H-7''), 1.37, 1.03 (2×t, 2×3H, ester-CH$_3$, J=7.6 Hz), 1.28 (m, 6 H, H-4'', H-5'', H-6''), 0.96 (d, 3 H, Me, J=7.5 Hz), 0.87 (d, 6 H, Me, J=7.5 Hz).

Example C2

Synthesis of diethyl 2-[3-(3,7-dimethyloctyloxy) phenyl]-5-methoxyterephthalate

Synthesis analogous to Example C1. The product (95% yield) was a colorless high-viscosity oil.

$^1$H NMR (CDCl$_3$): [ppm]=7.78, 7.37 (2×s, 2×1H, H-3, H-6), 7.26 (t; 1H; H-5', J=8 Hz), 6.86 (m; 3 H; H-2', H-4', H-6'), 4.37, 4.10 (2×q, 2×2 H, CO$_2$CH$_2$, J=7.6 Hz), 4.00 (m, 2 H, O—CH$_2$), 3.97 (s, 3 H, O-Me), 1.83 (m, 1H, H-3''), 1.62 (m, 3 H, H-2'', H-7''), 1.37, 1.01 (2×t, 2×3H, ester-CH$_3$, J=7.6 Hz), 1.28 (m, 6 H, H-4'', H-5'', H-6''), 0.95 (d, 3 H, Me, J=7.5 Hz), 0.86 (d, 6 H, Me, J=7.5 Hz).

Example C3

Synthesis of Diethyl 2-[3,4-bis(2-methylpropyl) phenyl]-5-methoxyterephthalate

Procedure analogous to Example C1. The product was obtained as a viscous oil in a yield of 100%.

$^1$H NMR (CDCl$_3$): [ppm]=7.75, 7.32 (2×s, 2×1 H, H-3, H-6), 6.88 (d, 1 H, H-2, J=2 Hz), 6.80 (m, 2 H, H-5+H-6), 4.37, 4.12 (2×q, 2×2 H, CO$_2$CH$_2$, J=7.5 Hz), 3.96 (s, 3 H, O-Me), 3.78, 3.74 (2×d, 2×2 H, O—CH$_2$, J=8 Hz), 2.14 (m, 2 H, CH), 1.36, 1.02 (2×t, 2×3H, ester-CH$_3$, J=7.5 Hz), 1.04 (m, 12 H, CH$_3$).

Example C4

Synthesis of diethyl 2-[2,5-dimethoxyphenyl]-5-methoxyterephthalate

Procedure analogous to Example C1. After stirring in hexane, the product was obtained as a crystalline solid in a yield of 72%.

$^1$H NMR (CDCl$_3$): [ppm]=7.73, 7.46 (2×s, 2×1H, H-3, H-6), 6.82 (m, 3 H, H-3+H-4+H-6), 4.36, 4.11 (2×q, 2×2 H, CO$_2$CH$_2$, J=7.5 Hz), 3.96, 3.81, 3.75 (3×s, 3×3 H, 3×O-Me), 1.36, 1.03 (2×t, 2×3H, ester-CH$_3$, J=7.5 Hz).

Example C5

Synthesis of diethyl 2-[2,5-dimethylphenyl]-5-methoxyterephthalate

Procedure analogous to Example C1. The product was obtained as a viscous oil in a yield of 99%.

¹H NMR (CDCl₃): [ppm]=7.63, 7.50 (2×s, 2×1H, H-3, H-6), 7.10 (d, 1H, H-3, J=8 Hz), 7.06 (dd, 1H, H-4, J=1.3 Hz, J=8 Hz), 6.89 (s (br), 1 H, H-6), 4.35, 4.05 (2×q, 2×2 H, CO₂CH₂, J=7.5 Hz), 3.99 (s, 3 H, O-Me), 2.32, 2.02 (2×s, 2×3 H, CH₃), 1.35, 0.92 (2×t, 2×3H, ester-CH₃, J=7.5 Hz).

Example C6

Synthesis of diethyl 2-[3-(3,7-dimethyloctyloxy)phenyl]-5-fluoroterephthalate

Procedure analogous to Example C1. The product was obtained as a viscous oil in a yield of 98%.

¹H NMR (CDCl₃): [ppm]=7.93 (d, 1H, H-6, $J_{H-F}$=7 Hz), 7.55 (d, 1 H, H-3, $J_{H-F}$=11 Hz), 7.26 (t (br); 1H; H-5', J=8 Hz), 6.87 (m; 3 H; H-2', H-4', H-6'), 4.42, 4.13 (2×q, 2×2 H, CO₂CH₂, J=7.8 Hz), 3.99 (m, 2 H, O—CH₂), 1.83 (m, 1 H, H-3"), 1.60 (m, 3 H, H-2", H-7"), 1.40, 1.05 (2×t, 2×3H, ester-CH₃, J=7.8 Hz), 1.25 (m, 6 H, H-4", H-5", H-6"), 0.94 (d, 3 H, Me, J=7.5 Hz), 0.87 (d, 6 H, Me, J 7.5 Hz).

Example C7

Synthesis of diethyl 2-[3,4-bis(2-methylpropyl)phenyl]-5-fluoroterephthalate

Procedure analogous to Example C1. The product was obtained as a viscous oil in a yield of 100%.

¹H NMR (CDCl₃): [ppm]=7.91 (d, 1H, H-6, $J_{H-F}$=7 Hz), 7.50 (d, 1H, H-3, $J_{H-F}$=11 Hz), 6.89 (d; 1H; H-5', J=8 Hz), 6.80 (m; 2 H; H-2', H-6'), 4.42, 4.14 (2×q, 2×2 H, CO₂CH₂, J=7.6 Hz), 3.78, 3.75 (2×d, 2×2 H, O—CH₂, J=8 Hz), 2.14 (m, 2 H, CH), 1.40, 1.07 (2×t, 2×3H, ester-CH₃, J=7.5 Hz), 1.05 (m, 12 H, CH₃).

Example C8

Synthesis of diethyl 2-[4-(3,7-dimethyloctyloxy)phenyl]-5-chloroterephthalate

Procedure analogous to Example C1. The product was obtained as an oil in a yield of 93%.

¹H NMR (CDCl₃): [ppm]=7.83, 7.78 (2×s, 2×1 H, H-3, H-6), 7.22, 6.92 (AA'BB', 4 H, H-aryl), 4.41, 4.25 (2×q, 2×2 H, CO₂CH₂, J=7.6 Hz), 4.03 (m, 2 H, O—CH₂), 1.83 (m, 1H, H-3"), 1.60 (m, 3 H, H-2", H-7"), 1.41, 1.07 (2×t, 2×3H, ester-CH₃, J=7.6 Hz), 1.30 (m, 6 H, H-4", H-5", H-6"), 0.96 (d, 3 H, Me, J=7.5 Hz), 0.87 (d, 6 H, Me, J=7.5 Hz).

Example C9

Synthesis of diethyl 2-chloro-5-phenylterephthalate

Procedure analogous to Example C1. After distillation under reduced pressure (0.1 mbar, 170° C.), the product was obtained as an oil in a yield of 80%.

¹H NMR (CDCl₃): [ppm]=7.83, 7.80 (2×s, 2×1H, H-3, H-6), 7.35 (m (AA'BB'C), 5 H, H-phenyl), 4.42, 4.11 (2×q, 2×2 H, CO₂CH₂, J=7.5 Hz), 1.40, 1.02 (2×t, 2×3H, ester-CH₃, J=7.6 Hz).

Example C10

Diethyl 2-[3,5-difluorophenyl]-5-methoxyterephthalate

The procedure was carried out analogously to Example C1. After crystallization from hexane, the product was obtained as a colorless solid in a yield of 62%.

¹H NMR (CDCl₃): [ppm]=7.99, 7.89 (2×s, 2×1 H, H-3, H-6), 6.88–6.83 (m, 3 H, H-phenyl), 4.44, 4.17 (2×q, 2×2 H, CO₂CH₂, J=7.0 Hz), 3.97 (s, 3H, O—CH₃), 1.41, 1.10 (2×t, 2×3H, ester-CH₃, J=7.0 Hz).

D. Reductions in Accordance with Reaction B

Example D1

Synthesis of 2,5-bishydroxymethyl-4-methoxy-4'-(3,7-dimethyloctyloxy)biphenyl

LiAlH₄ (7.9 g, 208 mmol) was initially introduced with about 250 ml of THF under an argon blanket. Diethyl 2-[4-(3,7-dimethyloctyloxy)phenyl]-5-methoxyterephthalate (72.2 g, 149 mmol) was diluted with about 60 ml of THF in a dropping funnel and slowly added dropwise. During this addition, the reaction mixture was stirred vigorously. The batch, diluted with a further 100 ml of THF, was then refluxed at 67° C. After 2 hours, it was cooled to RT. When the reduction was complete, 8 ml of water were carefully added for work-up. 8 ml of aqueous NaOH solution (15% strength) were subsequently added, and finally 24 ml of water were added. After each addition, the mixture was stirred for about a further 15 minutes ("1:1:3 method"). The solid formed was filtered off with suction and again stirred with THF, and finally the combined organic phases were evaporated. Recrystallization from hexane/ethyl acetate (20:1) gave the product (93% yield) as colorless crystals.

Melting point: 101° C.

¹H NMR (CDCl₃): [ppm]=7.21, 6.93 (AA'BB', 4 H, H-aryl), 7.18, 7.10 (2×s, 2×1 H, H-3, H-6), 4.70, 4.62 (2×s, 2×2 H, CH₂O), 4.02 (m, 2 H, O—CH₂), 3.93 (s, 3 H, O-Me), 1.85 (m, 1H, H-3'), 1.65 (br, 2 H, OH), 1.60 (m, 3 H, H-2', H-7'), 1.28 (m, 6 H, H-4', H-5', H-6'), 0.96 (d, 3 H, Me, J=7.5 Hz), 0.86 (d, 6 H, Me, J=7.5 Hz).

Example D2

Synthesis of 2,5-bishydroxymethyl-4-methoxy-3'-(3,7-dimethyloctyloxy)biphenyl

Synthesis analogous to Example D1. Stirring with hot hexane. The product was obtained (99% yield) as a colorless, wax-like solid.

Melting point: 55° C.

¹H NMR (CDCl₃): [ppm]=7.29 (t; 1H; J=8 Hz; H-5'), 7.21, 7.12 (2×s, 2×1H, H-3, H-6), 6.87 (m; 3 H; H-2', H-4', H-6'), 4.70, 4.64 (2×d, 2×2 H, CH₂O, J=8 Hz), 4.01 (m, 2 H, O—CH₂), 3.93 (s, 3 H, O-Me), 2.29, 1.63 (2×t, 2×1 H, OH, J=8 Hz), 1.84 (m, 1H, H-3'), 1.60 (m, 3 H, H-2', H-7'), 1.25 (m, 6 H, H-4', H-5', H-6'), 0.94 (d, 3 H, Me, J=7.5 Hz), 0.87 (d, 6 H, Me, J=7.5 Hz).

Example D3

Synthesis of 2,5-bishydroxymethyl-4-methoxy-3',4'-bis(2-methylpropyl)biphenyl

Procedure analogous to Example D1. The product was obtained as white crystals in a yield of 78% after recrystallization from ethyl acetate/hexane (1:2).

Melting point: 110–111° C.

¹H NMR (CDCl₃): [ppm]=7.19, 7.10 (2×s, 2×1 H, H-3, H-6), 6.89 (d, 1H, H-5', J=8 Hz), 6.84 (d,₁H, H-2', J=2 Hz), 6.80 (dd, 1H, H-6', J=8 Hz, J=2 Hz), 4.71, 4.63 (2×s, 2×2 H, CH₂O), 3.94 (s, 3 H, O-Me), 3.78, 3.75 (2×d, 2×2 H, O—CH₂, J=8 Hz), 2.15 (m, 2 H, CH), 1.05 (m, 12 H, CH₃).

Example D4

Synthesis of 2,5-bishydroxymethyl-4,2',5'-trimethoxybiphenyl

Procedure analogous to Example D1. After stirring in hexane, the product was obtained as a white powder in a yield of 96%.

Melting point: 91.5–92.5° C.

$^1$H NMR (CDCl$_3$): [ppm]=7.14, 7.10 (2×s, 2×1H, H-3, H-6), 6.91 (d, 1H, H-3', J=8 Hz), 6.87 (dd, 1 H, H-4', J=8 Hz, J=2 Hz), 6.73 (d, 1H, H-6', J=2 Hz), 4.71, 4.40 (2×d (br), 2×2 H, CH$_2$O), 3.94, 3.78, 3.68 (3×s, 3×3 H, 3×O-Me), 2.1 (s (br), 2 H, OH). The CH$_2$OH groups were diastereotopic owing to hindered rotation.

Example D5

Synthesis of 2,5-bishydroxymethyl-4-methoxy-2',5'-dimethylbiphenyl

Procedure analogous to Example D1. After stirring in hexane, the product was obtained as a white powder in a yield of 96%.

Melting point: 147.5–150° C.

$^1$H NMR (CDCl$_3$): [ppm]=7.14 (d, 1H, H-3', J=8 Hz), 7.11, 7.03 (2×s, 2×1H, H-3, H-6), 7.07 (dd, 1 H, H-4', J=8 Hz, J=1.2 Hz), 6.91 (s (br), 1H, H-6'), 4.69, 4.40 (2×s, 2×2 H, CH$_2$O), 3.93 (s, 3 H, O-Me), 2.31, 2.00 (2×s, 2×3 H, CH$_3$).

Example D6

Synthesis of 2,5-bishydroxymethyl-4-fluoro-3'-(3,7-dimethyloctyloxy)biphenyl

Procedure analogous to Example D1. However, pure LiAlH$_4$ was not used but instead, for toning down, one equivalent of isopropanol was added, i.e. the reduction was carried out using LiAlH$_3$(O$^i$Pr). The product was obtained as a high-viscosity oil in a yield of 94% (purity about 98%).

$^1$H NMR (CDCl$_3$): [ppm]=7.30 (m, 3 H, H-3, H-6, H-5'), 6.88 (m, 3 H, H-2', H-4', H-6'), 4.78, 4.59 (2×d, 2×2 H, CH$_2$O, J=5 Hz), 4.00 (m, 2 H, O—CH$_2$),1.85 (m, 2 H, H-3", OH), 1.60 (m, 4 H, H-2", H-7", OH), 1.25 (m, 6 H, H-4", H-5", H-6"), 0.94 (d, 3 H, Me, J=7.5 Hz), 0.86 (d, 6 H, Me, J=7.5 Hz).

Example D7

Synthesis of 2,5-bishydroxymethyl-4-fluoro-3',4'-bis(2-methylpropyl)biphenyl

Procedure analogous to Example D6. After stirring in hexane, the product was obtained as a white powder in a yield of 87%.

Melting point: 78–79° C.

$^1$H NMR (CDCl$_3$): [ppm]=7.31 (d, 1H, H-6, J$_{H-F}$=7 Hz), 7.27 (d, 1H, H-3, J$_{H-F}$=11 Hz), 6.90 (d; 1H; H-5', J=8 Hz), 6.84 (d; 1H; H-2', J=2 Hz), 6.80 (dd; 1H; H-6', J=8 Hz, J=2 Hz), 4.78, 4.60 (2×s, 2×2 H, CH$_2$O), 3.80, 3.75 (2×d, 2×2 H, O—CH$_2$, J=8 Hz), 2.15 (m, 2 H, CH), 1.05 (m, 12 H, CH$_3$).

Example D8

Synthesis of 2,5-bishydroxymethyl-4-chloro-4'-(3,7-dimethyloctyloxy)biphenyl

Procedure analogous to Example D1. After stirring in ethylacetate/hexane (1/10), the product was obtained as a white powder in a yield of 87%.

Melting point: 90° C.

$^1$H NMR (CDCl$_3$): [ppm]=7.56, 7.37 (2×s, 2×1H, H-3, H-6), 7.23, 6.93 (AA'BB', 4 H, H-aryl), 4.79, 4.60 (2×s, 2×2 H, CH$_2$O), 4.02 (m, 2 H, O—CH$_2$), 1.85 (m, 1 H, H-3"), 1.65 (m, 3 H, H-2", H-7"), 1.35 (m, 6 H, H-4", H-5", H-6"), 0.96 (d, 3 H, Me, J=7.5 Hz), 0.87 (d, 6 H, Me, J=7.5 Hz).

Example D9

Synthesis of 2,5-bishydroxymethyl-4-(3,7-dimethyloctyloxy)biphenyl 46 g of sodium were added to 1060 ml of 3,7-dimethyloctanol under a protective gas. The mixture was stirred at 120° C. for about 3 hours until the sodium salt had fully formed. 223 g of diethyl 2-chloro-5-phenylterephthalate were subsequently added dropwise over the course of 20 minutes at about 100° C. A cloudy, yellowish mixture formed during this addition. In order to complete the nucleophilic substitution, the mixture was stirred at 130° C. for a further 5 hours. 500 ml of water were subsequently added to the cooled batch, the phases were separated, the mixture was refluxed for a number of hours with ethanol and finally freed from solvent. The crude product obtained in this way proved to be (according to NMR) a mixture of various esters. However, the substitution of the chlorine by the dimethyloctyloxy group was complete. This crude product was reduced directly analogously to the description in D1 using LiAlH$_4$. Finally, after stirring twice with ethyl acetate/hexane (1/10), the product (35%) was obtained as white crystals.

Melting point: 112–115° C.

$^1$H NMR (CDCl$_3$):=[ppm] 7.36 (m (AA'BB'C), 5 H, H-phenyl), 7.19, 7.12 (2×s, 2×1H, H-3, H-6), 4.72, 4.61 (2×d, 2×2 H, CH$_2$O, J=6 Hz), 4.13 (m, 2 H, O—CH$_2$), 2.35, 1.48 (2×t, 2×1 H, OH, J=6 Hz), 1.88 (m, 1H, H-3"), 1.65 (m, 3 H, H-2", H-7"), 1.25 (m, 6 H, H-4", H-5", H-6"), 0.97 (d, 3 H, Me, J=7.5 Hz), 0.87 (d, 6 H, Me, J=7.5 Hz).

Example D10

Synthesis of 2,5-bishydroxymethyl-4-methoxy-3',5'-difluorobiphenyl

The procedure was carried out analogously to Example D1. After recrystallization from n-hexane, the product was obtained as a white powder.

Melting point: 123° C.

$^1$H NMR (CDCl$_3$): [ppm]=7.60, 7.26 (2×s, 2×1H, H-3, H-6); 6.96–6.89 (m, 2H, H-2', H-6'), 6.82 (tt, 1H, H-4', J=8.9, J=2.0); 4.72, 4.58 (2×s, 2×2 H, CH$_2$O), 4.02 (s, 3 H, O—CH$_3$),1.84, 1.73 (2 br. s, each 1H, OH).

E. Halogenations in Accordance with Reaction C

Example E1

Synthesis of 2,5-bischloromethyl-4-methoxy-4'-(3,7-dimethyloctyloxy)biphenyl 2,5-Bishydroxymethyl-4-methoxy-4'-(3,7-dimethyloctyloxy)biphenyl (54.9 g, 137 mmol) was initially introduced under N$_2$, and thionyl chloride (20 ml, 274 mmol) was carefully added. The batch was stirred at room temperature for 20 hours. The batch was carefully poured into aqueous NaHCO$_3$ solution and extracted with ethyl acetate, and finally the organic phase was washed until neutral. After the mixture had been dried over MgSO$_4$, the ethyl acetate was stripped off, and the product was obtained as a colorless, high-viscosity oil (40% yield) by distillation in a short-path distillation apparatus (0.3 mbar, 265° C.).

$^1$H NMR (CDCl$_3$): [ppm]=7.29, 6.95 (AA'BB', 4 H, H-aryl), 7.27, 7.03 (2×s, 2×1H, H-3, H-6), 4.65, 4.53 (2×s, 2×2 H, CH$_2$Cl), 4.04 (m, 2 H, O—CH$_2$), 3.94 (s, 3 H, O-Me), 1.85 (m, 1 H, H-3'), 1.63 (m, 3 H, H-2', H-7'), 1.28 (m, 6 H, H-4', H-5', H-6'), 0.97 (d, 3 H, Me, J=7.5 Hz), 0.88 (d, 6 H, Me, J=7.5 Hz).

Example E2

Synthesis of 2,5-bischloromethyl-4-methoxy-3'-(3,7-dimethyloctyloxy)biphenyl Procedure analogous to Example E1; the product was obtained as a colorless, high-viscosity oil (46% yield, purity: 99%) by distillation in a short-path distillation apparatus ($10^{-3}$ mbar, 180° C.).

$^1$H NMR (CDCl$_3$): [ppm]=7.32 (t; 1 H; J=8 Hz; H-5'), 7.30, 7.04 (2×s, 2×1H, H-3, H-6), 6.93 (m; 3 H; H-2', H-4', H-6'), 4.66, 4.53 (2×s, 2×2 H, CH$_2$Cl), 4.04 (m, 2 H, O—CH$_2$), 3.95 (s, 3 H, O-Me), 1.84 (m, 1 H, H-3'), 1.60 (m, 3 H, H-2', H-7'), 1.25 (m, 6 H, H-4', H-5', H-6'), 0.94 (d, 3 H, Me, J=7.5 Hz), 0.86 (d, 6 H, Me, J=7.5 Hz).

Example E3

Synthesis of 2,5-bischloromethyl-4-methoxy-3',4'-bis(2-methylpropyl)biphenyl Procedure analogous to Example E1; however, hexane was added as solvent (1 molar solution). The product crystallized out of the solution. After renewed stirring in hexane, a colorless powder was obtained in a yield of 60%.

Melting point: 97° C.

$^1$H NMR (CDCl$_3$): [ppm]=7.28, 7.03 (2×s, 2×1H, H-3, H-6), 6.94 (d, 1H, H-2', J=2 Hz), 6.91 (d, 1H, H-5', J=8 Hz), 6.86 (dd, 1H, H-6', J=8 Hz, J=2 Hz), 4.65, 4.53 (2×s, 2×2 H, CH$_2$Cl), 3.94 (s, 3 H, O-Me), 3.80, 3.79 (2×d, 2×2 H, O—CH$_2$, J=8 Hz), 2.15 (m, 2 H, CH), 1.06 (m, 12 H, CH$_3$).

Example E4

Synthesis of 2,5-bischloromethyl-4,2',5'-trimethoxybiphenyl

Procedure analogous to Example E3. The product crystallized out of the solution. After renewed stirring in hexane, a colorless powder was obtained in a yield of 57%.

Melting point: 71–73° C.

$^1$H NMR (CDCl$_3$): [ppm]=7.23, 7.09 (2×s, 2×1H, H-3, H-6), 6.89, 6.81 (m, 2+1H, H-3', H-4', H-6'), 4.65, 4.45 (2×br, 2×2 H, CH$_2$Cl), 3.94, 3.80, 3.70 (3×s, 3×3 H, 3×O-Me). The CH$_2$Cl groups were diastereotopic owing to hindered rotation.

Example E5

Synthesis of 2,5-bischloromethyl-4-methoxy-2',5'-dimethylbiphenyl

Procedure analogous to Example E3. The product was obtained as a viscous oil in a yield of 67% by distillation in a short-path evaporator (10 mbar, 115° C.).

$^1$H NMR (CDCl$_3$): [ppm]=7.16 (d, 1H, H-3', J=8 Hz), 7.15, 7.07 (2×s, 2×1H, H-3, H-6), 7.10 (dd, 1 H, H-4', J=8 Hz, J=1.2 Hz), 6.96 (s (br), 1H, H-6'), 4.67, 4.63 (AB, 2 H, CH$_2$Cl, J=12 Hz), 4.39, 4.30 (AB, 2 H, CH$_2$Cl, J=12 Hz), 3.95 (s, 3 H, O-Me), 2.33, 2.03 (2×s, 2×3 H, CH$_3$). The CH$_2$Cl groups were diastereotopic owing to hindered rotation.

Example E6

Synthesis of 2,5-bischloromethyl-4-fluoro-3'-(3,7-dimethyloctyloxy)biphenyl

Procedure analogous to Example E3. The product was obtained as a viscous oil in a yield of 68% by distillation in a short-path evaporator ($10^{-3}$ mbar, 180° C.).

$^1$H NMR (CDCl$_3$): [ppm]=7.34 (m, 2 H, H-6, H-5'), 7.28 (d, 1H, H-3, J$_{H-F}$=10 Hz), 6.92 (m, 3 H, H-2', H-4', H-6'), 4.64, 4.48 (2×s, 2×2 H, CH$_2$Cl), 4.04 (m, 2 H, O—CH$_2$), 1.83 (m, 1H, H-3''), 1.60 (m, 3 H, H-2'', H-7''), 1.25 (m, 6 H, H-4'', H-5'', H-6''), 0.95 (d, 3 H, Me, J=7.5 Hz), 0.87 (d, 6 H, Me, J=7.5 Hz).

Example E7

Synthesis of 2,5-bischloromethyl-4-fluoro-3',4'-bis(2-methylpropyl)biphenyl

Procedure analogous to Example E3. The product was obtained as a viscous oil in a yield of 70% by distillation in a short-path evaporator ($10^{-3}$ mbar, 185° C.).

$^1$H NMR (CDCl$_3$): [ppm]δ=7.33 (d, 1H, H-6, J$_{H-F}$=7 Hz), 7.26 (d, 1H, H-3, J$_{H-F}$=10 Hz), 6.93 (d; 1H; H-5', J=8 Hz), 6.91 (d; 1H; H-2', J=2 Hz), 6.84 (dd; 1H; H-6', J=8 Hz, J=2 Hz), 4.65, 4.47 (2×s, 2×2 H, CH$_2$Cl), 3.80, 3.77 (2×d, 2×2 H, O—CH$_2$, J=8 Hz), 2.16 (m, 2 H, CH), 1.06 (m, 12 H, CH$_3$).

Example E8

Synthesis of 2,5-bischloromethyl-4-chloro-4'-(3,7-dimethyloctyloxy)biphenyl

Procedure analogous to Example E3. The product was obtained as a viscous oil in a yield of 65% by distillation in a short-path evaporator ($10^{-3}$ mbar, 190° C.).

$^1$H NMR (CDCl$_3$): [ppm] δ=7.58, 7.38 (2×s, 2×1H, H-3, H-6), 7.29, 6.97 (AA'BB', 4 H, H-aryl), 4.70, 4.47 (2×s, 2×2 H, CH$_2$Cl), 4.05 (m, 2 H, O—CH$_2$), 1.85 (m, 1H, H-3''), 1.63 (m, 3 H, H-2'', H-7''), 1.28 (m, 6 H, H-4'', H-5'', H-6''), 0.97 (d, 3 H, Me, J=7.5 Hz), 0.88 (d, 6 H, Me, J=7.5 Hz).

Example E9

Synthesis of 2,5-bischloromethyl-4-(3,7-dimethyloctyloxy)biphenyl

Procedure analogous to Example E3. The product was obtained as a viscous oil in a yield of 44% by double distillation in a short-path evaporator ($10^{-3}$ mbar, 1.135° C., 2.190° C.).

$^1$H NMR (CDCl$_3$):=[ppm] 7.40 (m (AA'BB'C), 5 H, H-phenyl), 7.29, 7.05 (2×s, 2×1H, H-3, H-6), 4.66, 4.51 (2×s, 2×2 H, CH$_2$Cl), 4.13 (m, 2 H, O—CH$_2$), 1.90 (m, 1H, H-3''), 1.66 (m, 3 H, H-2'', H-7''), 1.28 (m, 6 H, H-4'', H-5'', H-6''), 0.99 (d, 3 H, Me, J=7.5 Hz), 0.88 (d, 6 H, Me, J=7.5 Hz).

Example E10

Synthesis of 2,5-bis(chloromethyl)4-methoxy-3',5'-bisfluorobiphenyl

Procedure analogous to Example E1. The product was purified by crystallization from heptane.

Melting point: 117° C.

$^1$H NMR (CDCl$_3$): [ppm] δ=7.54, 7.24 (2×s, 2×1H, H-3, H-6), 7.00–6.92 (m, 2 H, H-2', H-6'), 6.86 (tt, 1H, H-4', J=8.7 Hz, J=2 Hz), 4.60, 4.48 (2×s, 2×2 H, CH$_2$Cl), 3.99 (s, 3 H, O-Me).

Z. Synthesis of Comonomers

Z1. Synthesis of 2,5-bis(chloromethyl)-1-methoxy-4-(3,7-dimethyloctyloxy)benzene a) Preparation of 3,7-dimethyloctyl-1-chloride 275 ml (1.46 mol) of 3,7-dimethyl-1-octanol were introduced into a 1 l four-necked round-bottomed flask fitted with dropping funnel, high-efficiency condenser and magnetic stirrer bar, and cooled to −3° C. 0.7 ml of pyridine was then added, and 129 ml (1.77 mol, 1.2 eq) of thionyl chloride were added dropwise at such a rate that the temperature did not exceed 15° C. (75 minutes). The HCl gas formed was trapped in a wash bottle containing Ca(OH)$_2$/water. The mixture was then heated to 130° C. over the course of 40 minutes. After two hours at this temperature, the mixture was cooled to 50° C., and volatile constituents were distilled off by applying a reduced pressure of 100 mbar. The residue was then cooled to room temperature, diluted with 200 ml of n-hexane and washed firstly twice with 50 ml of 10% strength NaOH solution in water each time, then with 50 ml of water and finally with 50 ml of saturated aqueous NaHCO$_3$ solution. The solution was dried using Na$_2$SO$_4$, and the solvent was removed by distillation in a rotary evaporator. The residue was purified by distillation under reduced pressure (13 mbar, 86–87° C.), giving 178.9 g (1.01 mol, 69%) of 3,7-dimethyl-1-octyl chloride as a colorless oil.

Boiling point: 86–87° C., 13 mbar. $^1$H NMR (400 MHz, CDCl$_3$): (ppm)=3.61–3.49 (m, 2H, CH$_2$Cl); 1.82–1.74 (m, 1H); 1.69–1.48 (m, 3H); 1.37–1.21 (m, 3H); 1.19–1.09 (m, 3H); 0.89 (d, J=6.7 Hz, 3H; CH$_3$); 0.87 (d, J=6.7 Hz, 6H; 2×CH$_3$).

b) Preparation of 1-methoxy-4-(3,7-dimethyloctyloxy) benzene 184.4 g (1.48 mol) of p-methoxyphenol, 275.9 g (1.56 mol, 1.05 eq) of 3,7-dimethyl-1-octyl chloride, 106.9 g of KOH (85% strength, 1.62 mol, 1.09 eq) and 15.04 g of sodium iodide were dissolved in 620 ml of dry ethanol in a 2 l four-necked round-bottomed flask fitted with dropping funnel, high-efficiency condenser, gas outlet and magnetic stirrer bar, and heated at the boil for 64 hours with magnetic stirring. The mixture was cooled to room temperature, and the reaction solution was decanted off from the solid formed. The reaction solution was evaporated in a rotary evaporator. The solid was taken up in 400 ml of 10% strength aqueous NaOH solution. This solution was extracted twice with 400 ml of toluene each time. The organic phases were combined, washed with 100 ml of 10% strength aqueous NaOH solution and dried using Na$_2$SO$_4$. The solvent was distilled off under reduced pressure in a rotary evaporator. The residue was distilled under reduced pressure (1 mbar, head temperature: 159–162° C.), giving 372.4 g (1.41 mol, 95%) of 1-methoxy-4-(3,7-dimethyloctyloxy)benzene as a colorless oil.

Boiling point: 159–162° C./1 mbar. $^1$H NMR (400 MHz, CDCl$_3$): (ppm)=6.82 (d, J=0.8 Hz, 4H; H$_{arom}$); 3.97–3.88 (m, 2H; OCH$_2$); 3.75 (s, 3H; OCH$_3$); 1.84–1.75 (m, 1H); 1.71–1.47 (m, 3H); 1.38–1.23 (m, 3H); 1.22–1.09 (m, 3H); 0.93 (d, J=6.6 Hz, 6H; CH$_3$); 0.86 (d, J=6.7 Hz, 6H; 2×CH$_3$).

c) Preparation of 2,5-bis(chloromethyl)-1-methoxy-4-(3,7-dimethyloctyloxy)benzene 304.96 g (1.03 mol) of 1-(3,7-dimethyloctyloxy)4-methoxybenzene and 85.38 g (2.84 mol) of paraformaldehyde were introduced under N$_2$ in a 4 l four-necked flask fitted with mechanical stirrer, reflux condenser, thermometer and dropping funnel, and 490 ml (580.6 g, 5.89 mol) of 37 percent HCl were added; a yellow suspension was obtained. 990 ml (1070 g, 10.5 mol) of acetic anhydride were then added dropwise at such a rate that the internal temperature did not exceed 70° C. (duration: 1.5 hours). The final 100 ml were added in one portion; during this addition, a temperature increase from 70° C. to 75° C. occurred; the reaction mixture changed color from beige-brown to reddish. The batch was stirred at 70–75° C. for 3.5 hours and then cooled to room temperature with stirring, during which a pale solid crystallized out at 32° C., and a temperature increase to 35° C. occurred. The batch was left to stand at room temperature overnight, during which a pale solid precipitated out. 940 ml of cold-saturated Na acetate solution were added to the reaction mixture (duration: about 15 minutes). 700 ml of 25% strength NaOH were then added dropwise at such a rate that the internal temperature did not exceed 30° C. (duration: about 35 minutes). The batch was then heated to 52° C. (duration: about 30 minutes) and then cooled in an ice bath with rapid stirring (duration: about 30 minutes). The cream-colored, granular solid was filtered off with suction and washed with 200 ml of H$_2$O. 2500 ml of hexane were added to the solid (451 g), the mixture was stirred at room temperature, and 300 ml of boiling H$_2$O were then added. The mixture was stirred for 20 minutes, and the aqueous phase was separated off. The yellowish organic phase was stirred 3× with 300 ml of H$_2$O each time, and the pH was 5. The organic phase was dried over Na$_2$SO$_4$ and filtered. The filtrate was evaporated and crystallized in the freezer.

The crystallized precipitate (447 g) was filtered off with suction, washed with hexane at −20° C. and, for recrystallization, dissolved in 1000 ml of hexane at 60° C. The product was crystallized at −20° C., and the solid was filtered off with suction and dried at room temperature under reduced pressure, giving 279.6 g (0.774 mol, 75%) of 2,5-bis(chloromethyl)-1-methoxy-4-(3,7-dimethyloctyloxy) benzene as a colorless solid.

Melting point: 65° C.;

$^1$H NMR (400 MHz, CDCl$_3$): (ppm)=6.92 (d, J=2.0 Hz, 2H; H$_{arom}$); 4.63 (d, J=2.6 Hz, 4 H; CH$_2$Cl); 4.07–3.98 (m, 2H; OCH$_2$); 3.85 (s, 3H; OCH$_3$); 1.88–1.80 (m, 1H); 1.76–1.66 (br. m, 1H); 1.65–1.49 (m, 2H); 1.40–1.26 (m, 3H); 1.23–1.12 (m; 3H); 0.95 (d, J=6.8 Hz, 3H; CH$_3$); 0.87 (d, J=6.8 Hz, 6H; 2×CH$_3$). $^{13}$C NMR (100 MHz, CDCl$_3$): (ppm)=151.0, 150.7 (C1, C4); 127.1, 126.8 (C2, C5); 114.4, 113.3 (C3, C6); 67.5 (OCH$_2$); 56.3 (OCH$_3$); 41.3 (2×CH$_2$Cl); 39.2 (C2'); 37.3, 36.3 (C4', C6'); 29.9 (C3'); 28.0 (C7'); 24.7 (C5'); 22.7, 22.6, 19.7 (3×CH$_3$).

Z2. Synthesis of preparation of 2,5-bis(chloromethyl)-1,4-bis(3,7-dimethyloctyloxy)benzene a) Preparation of 1,4-bis(3,7-dimethyloctyloxy)benzene 84.2 g of KOH (85% strength, 1.28 mol, 1.28 eq) and 14.9 g of sodium iodide (0.10 mol) were dissolved in 600 ml of dry ethanol in a 2 l four-necked round-bottomed flask fitted with dropping funnel, high-efficiency condenser, gas inlet and magnetic stirrer bar. During this, the temperature rose to 35° C. 55.1 g (0.50 mol) of hydroquinone were then added to the cloudy solution, and 221 g of 3,7-dimethyl-1-octyl chloride (1.25 mol, 1.25 eq) were slowly added dropwise. The pale-brown suspension was heated at the boil for 10 hours with magnetic stirring. A further 21 g of KOH (85% strength, 0.32 mol) and 55 g of 3.7-dimethyl-1-octyl chloride (0.31 mol, 0.31 eq) were then added, and the mixture was then heated at the boil for a further 84 hours.

The mixture was cooled to room temperature, and the reaction solution was evaporated in a rotary evaporator. The solid was extracted with 500 ml of ethyl acetate. This solution was washed three times each with 200 ml of 10% strength aqueous NaOH solution each time and 200 ml of water and then dried using MgSO$_4$. The solvent was distilled off under reduced pressure in a rotary evaporator. The residue was distilled under reduced pressure (0.05 mbar, head temperature: 166–170° C.), giving 147.4 g (0.37 mol, 75%) of 1,4-bis(3,7-dimethyloctyloxy)benzene as a colorless oil.

Boiling point: 166–170° C./0.05 mbar. $^1$H NMR (400 MHz, CDCl$_3$): (ppm)=6.82 (s, 4H; H$_{arom}$); 3.98–3.88 (m, 4H; OCH$_2$); 1.84–1.75 (m, 2H); 1.71–1.61 (br. m, 2H); 1.59–1.49 (m, 4H); 1.40–1.09 (m, 12H); 0.93 (d, J=6.5 Hz, 6H; 2×CH$_3$); 0.86 (d, J=6.5 Hz, 12H; 4×CH$_3$).

b) Preparation of 2,5-bis(chloromethyl)-1,4-bis(3,7-dimethyloctyloxy)benzene 58.6 g (150 mmol) of 1,4-bis(3,7-dimethyloctyloxy)benzene and 12.43 g (414 mmol) of paraformaldehyde were introduced under N$_2$ into a 1 l four-necked flask fitted with mechanical stirrer, reflux condenser, thermometer and dropping funnel, and 71.4 ml (858 mmol) of 37 percent HCl were added; a yellow suspension was obtained. 144 ml (156 g, 1.53 mol) of acetic anhydride were then added dropwise at such a rate that the internal temperature did not exceed 70° C. (duration: 2 hours). The batch was stirred at 70–75° C. for 9 hours. A further 110 ml (119 g, 1.17 mol) of acetic anhydride were then added, and the mixture was again stirred at 70–75° C. for 8 hours and then cooled to room temperature with stirring, during which a pale solid crystallized out. 240 ml of cold-saturated Na acetate solution were added to the reaction mixture (duration: about 15 minutes), and 100 ml of 25% strength NaOH were then added dropwise at such a rate that the internal temperature did not exceed 30° C. (duration: about 35 minutes). The granular solid was partitioned between 300 ml of hexane and 300 ml of water. The organic phase was dried over Na$_2$SO$_4$ and filtered. The filtrate was evaporated and crystallized in the refrigerator. The product was again recrystallized from 170 ml of hexane (washing with hexane at −20° C.), giving 28.3 g (58.0 mmol, 39%) of 2,5-bis(chloromethyl)-1,4-bis(3,7-dimethyloctyloxy)benzene as a colorless solid.

Melting point: 55° C.; $^1$H NMR (400 MHz, CDCl$_3$): (ppm)=6.92 (s, 2H; H$_{arom}$); 4.62 (s, 4 H; CH$_2$Cl); 4.07–3.97 (m, 4H; OCH$_2$); 1.88–1.80 (m, 2H); 1.76–1.66 (br. m, 2H); 1.65–1.49 (m, 4H); 1.40–1.13 (m, 12H); 0.95 (d, J=6.5 Hz, 6H; 2×CH$_3$); 0.87 (d, J=6.8 Hz, 12H; 2×CH$_3$).

Z3. Synthesis of 2,5-bischloromethyl-3'-(3,7-dimethyloctyloxy)biphenyl a) Synthesis of dimethyl 2-(3'-(3,7-dimethyloctyloxy)phenyl)terephthalate Dimethyl bromoterephthalate (49.7 g, 182 mmol, purchased from TransWorld, Rockville Md., USA, or prepared analogously to Example A1), K$_2$CO$_3$ (50.3 g, 364 mmol) and 170 ml of toluene and 170 ml of H$_2$O were initially introduced, and the apparatus was flushed with argon for 30 minutes. 3-(3,7-Dimethyloctyloxy)boronic acid (55.7 g, 200 mmol) (cf. B1) and Pd(PPh$_3$)$_4$ (0.93 g, 0.8 mmol) were subsequently added under a protective gas. The yellow-greenish, cloudy mixture was stirred vigorously at an internal temperature of 85° C. under a protective-gas blanket. The reaction was complete after 24 hours. After the phases had been separated, the organic phase was washed (until neutral) by shaking with dilute HCl/H$_2$O. The aqueous phase was extracted by shaking with ethyl acetate, and the organic phases were combined, evaporated and dried at 2 mbar, giving the product as a yellow oil in adequate purity (greater than 95%): 76.1 g (98%).

$^1$H NMR (400 MHz; CDCl$_3$): [ppm]=8.07 (d; 1H; J=2 Hz; H-3), 8.05 (dd; 1H; J$_1$=8, J$_2$=2 Hz; H-5), 7.82 (d; 1 H; J=8 Hz; H-6), 7.29 (t; 1H; J=8 Hz; H-5'), 6.90 (m; 3 H; H-2', H-4', H-6'), 4.01 (m; 2 H; O—CH$_2$), 3.94, 3.67 (each: s; 3 H; CO$_2$—CH$_3$), 1.84 (m; 1H; O—CH$_2$—CH$_2$—CH), 1.63–1.48 (m; 3 H; H-alkyl), 1.37–1.12 (m; 6 H; H-alkyl), 0.96 (d; 3 H; J=7.8 Hz; CH$_3$), 0.87 (d; 6 H; J=7.7 Hz; CH$_3$).

b) Synthesis of 2,5-bishydroxymethyl-3'-(3,7-dimethyloctyloxy)biphenyl

LiAlH$_4$ (9.4 g, 248 mmol) was initially introduced in 300 ml of THF under N$_2$. Dimethyl 2-(3'-(3,7-dimethyloctyloxy)phenyl)terephthalate (75.5 g, 177 mmol), dissolved in 120 ml of THF, was then slowly added dropwise at RT. The mixture was subsequently stirred under reflux for 4 hours and cooled. Excess LiAlH$_4$ was then carefully destroyed by addition of H$_2$O. Semiconcentrated H$_2$SO$_4$ was subsequently carefully added dropwise (about 50 ml). The batch was of very low viscosity at this point. After a subsequent stirring time of 1 hour, a clear solution and a gray precipitate at the bottom of the flask were observed. The clear solution was decanted off, and the solvent was stripped off. The precipitate which remained was stirred with plenty of water and ethyl acetate and filtered, the organic phase was separated off, the solvent was stripped off, and combined with the first organic phase. The combined organic phases were taken up in ethyl acetate and extracted five times with water. After the extracts had been dried over MgSO$_4$, the solvent was stripped off. The resultant oil was stirred a number of times with hexane and dried in an oil-pump vacuum, giving the product as a pure, pale-yellow, high-viscosity oil (54 g, 82%).

$^1$H NMR (400 MHz; CDCl$_3$): [ppm]=7.50 (d; 1H; J=7.8 Hz; H-6), 7.34 (dd; 1H; J$_1$=7.8, J$_2$=1.9 Hz; H-5), 7.30 (dt; 1H; J$_1$=8, J$_2$=1 Hz; H-5'), 7.26 (d; 1H; J=1.9 Hz; H-3), 6.88 (m; 3 H; H-2', H-4', H-6'), 4.69, 4.59 (each: s; 2 H; CH$_2$—OH), 4.00 (m; 2 H; O—CH$_2$), 1.97 (s; 2 H; OH), 1.82 (m; 1 H; O—CH$_2$—CH$_2$—CH), 1.67–1.50 (m; 3 H; H-alkyl), 1.40–1.13 (m; 6 H; H-alkyl), 0.95 (d; 3 H; J=7.5 Hz; CH$_3$), 0.87 (d; 6 H; J=7.6 Hz; CH$_3$).

c) Synthesis of 2,5-bischloromethyl-3'-(3,7-dimethyloctyloxy)biphenyl 2,5-Bishydroxymethyl-3'-(3,7-dimethyloctyloxy)biphenyl (50.7 g, 137 mmol) was initially introduced under N$_2$, and thionyl chloride (20 ml, 274 mmol) was carefully added. 2 ml of thionyl chloride were added twice (after 2 and after 8 hours), and the batch was finally stirred at room temperature of a total of 20 hours. The batch was carefully poured into aqueous NaHCO$_3$ solution and extracted with ethyl acetate, and finally the organic phase was washed until neutral and dried over MgSO$_4$. The ethyl acetate was stripped off, and the batch was subjected to fractional distillation under reduced pressure, giving the product (39 g, 70%) as a high-viscosity, colorless oil (boiling point: 212° C. at 0.67 mbar).

$^1$H NMR (300 MHz; CDCl$_3$): [ppm]=7.54 (d; 1H; J=8.3 Hz; H-6), 7.41 (dd; 1H; J$_1$=8.2, J$_2$=2.1 Hz; H-5), 7.34 (d; 1H; J$_1$=8, J$_2$=1 Hz; H-5'), 7.31 (d; 1 H; J=2 Hz; H-3), 6.94 (m; 3 H; H-2'; H-4', H-6'); 4.61, 4.52 (each: s; 2 H; CH$_2$Cl), 4.04 (m; 2H; O—CH$_2$), 1.84 (m; 1 H; O—CH$_2$—CH$_2$—CH), 1.72–1.46 (m; 3 H; H-alkyl), 1.38–1.10 (m; 6 H; H-alkyl), 0.94 (d; 3 H; J=6.7 Hz; CH$_3$), 0.86 (d; 6 H; J=6.9 Hz; CH$_3$).

Z4. Synthesis of 2,5-bischloromethyl-4'-(3,7-dimethyloctyloxy)biphenyl

The synthesis is described in WO98125874 as Example E6.

Z5. Synthesis of 2,5-bischloromethyl-3',4'-bis(2-methylpropyl)biphenyl

The synthesis is described in WO98/25874 as Example E7.

Part 2: Synthesis and Characterization of the Polymers

The composition of the copolymers P1 to P17 and V1 to V7 was confirmed by oxidative degradation followed by qualitative and quantitative analysis of the monomer units thus obtained again. It was found that the proportion of monomer units in the copolymer was equal to the monomer ratio employed in the synthesis.

P: Synthesis of Polymers According to the Invention

Example P1

Copolymer comprising 50% of 2,5-bis(chloromethyl)1,4-bis(3,7-dimethyloctyloxy)benzene and 50% of 2,5-bis(chloromethyl)-3'-(3,7-dimethyloctyloxy)-4-methoxybiphenyl (polymer P1)

Preparation of poly(2,5-(3,7-dimethyloctyloxy)-p-phenylenevinylene)co(2-(3'-(3,7-dimethyloctyloxy)phenyl-5-methoxy)-p-phenylenevinylene)

590 g of dry and $O_2$-free 1,4-dioxane were heated to 99° C. in a dry 1 l four-necked flask fitted with mechanical Teflon stirrer, reflux condenser, thermometer and dropping funnel. A solution of 1.95 g (4.00 mmol) of 2,5-bis(chloromethyl)-1,4-bis(3',7'-dimethyloctyloxy)benzene and 1.75 g (4.00 mmol) of 2,5-bis(chloromethyl)-3'-(3,7-dimethyloctyloxy)4-methoxybiphenyl in 30 ml of dry 1,4-dioxane was then added. A solution of 2.36 g (21 mmol) of potassium tert-butoxide in 21 ml of dry 1,4-dioxane was then added dropwise to the vigorously stirred mixture over the course of 5 minutes. During this addition, the color changed from colorless via yellow to orange-red. After 5 minutes, a further 1.79 g (16 mmol) of potassium tert-butoxide, dissolved in 16 ml of 1,4-dioxane, were added. After the mixture had been stirred at 98–100° C. for 2 hours, it was cooled to 55° C., and a mixture of 4 ml of acetic acid and 4 ml of 1,4-dioxane was added. The solution, which was then orange, was poured into 0.85 l of vigorously stirred water. The polymer which precipitated was isolated by filtration through a polypropylene filter and was dried under reduced pressure. The crude yield was 2.22 g (5.70 mmol, 71%).

The polymer was dissolved in 250 ml of THF with heating to 60° C. and precipitated by addition of 250 ml of methanol at 40° C. After the mixture had been dried under reduced pressure, this step was repeated. Drying under reduced pressure gave 1.37 g (=3.52 mmol, 44%) of the polymer P1 as pale-orange fibers.

$^1$H NMR (400 MHz, CDCl$_3$): δ (ppm)=7.8–6.6 (br. m, 6 H); 4.2–3.6 (br. m, 4.5 H); 2.87 (br. s, bisbenzyl); 2.0–0.9 (br. m, 15 H); 0.85, 0.84 (2 s, 13.5 H). The $^1$H NMR spectrum of polymer P1 is reproduced in FIG. 1. Integration of the signal at 2.87 ppm gave the content of TBB groups as 1.4%.

GPC: THF+0.25% oxalic acid; column set SDV500, SDV1000, SDV10000 (PSS), 35° C., UV detection 254 nm, polystyrene standard: $M_w$=1.35×10$^6$ g/mol, $M_n$=1.27×10$^5$ g/mol.

Example P2

Copolymer comprising 50% of 2,5-bis(chloromethyl)4-methoxy-3'-(3,7-dimethyloctyloxy)biphenyl and 50% of 2,5-bis(chloromethyl)-3',4'-bis(2-methylpropoxy)biphenyl (polymer P2)

Preparation of poly(2-(3'-(3,7-dimethyloctyloxy)phenyl)-5-methoxy-p-phenylenevinylene)co(2-(3',4'-bis(2-methylpropoxy))phenyl)-p-phenylenevinylene)

3400 ml of dry and $O_2$-free 1,4-dioxane were heated to 99° C. in a heat-dried 6 l four-necked flask fitted with mechanical Teflon stirrer, reflux condenser, thermometer and dropping funnel. A solution of 12.45 g (28.5 mmol) of 2,5-bis(chloromethyl)4-methoxy-3'-(3,7-dimethyloctyloxy)biphenyl (Ex. E2) and 11.25 g (28.5 mmol) of 2,5-bis(chloromethyl)-3',4'-bis(2-methylpropoxy)biphenyl (Ex. Z5) in 50 g of dry 1,4-dioxane was then added. A solution of 16.6 g (148 mmol) of potassium tert-butoxide in 148 ml of dry 1,4-dioxane was then added dropwise to the vigorously stirred mixture over the course of 5 minutes. During this addition, the color changed from colorless via yellow to yellow-orange. After 5 minutes, a further 15.4 g (137 mmol) of potassium tert-butoxide, dissolved in 140 ml of 1,4-dioxane, were added. After the mixture had been stirred at 98–100° C. for 2 hours, it was cooled to 50° C., and a mixture of 33 ml of acetic acid and 35 ml of 1,4-dioxane was added. The solution, which was then orange, was poured into 3.8 l of vigorously stirred water. The fibrous polymer which precipitated was isolated by filtration through a polypropylene filter, washed twice with methanol and dried under reduced pressure. The crude yield was 15.33 g (78%).

The polymer was dissolved in 1.7 l of THF with heating to 60° C. and precipitated by addition of the same amount of methanol at 40° C. After the mixture had been washed with methanol and dried under reduced pressure, this step was repeated (1.2 l of THF/1.2 l of methanol). Drying under reduced pressure gave 8.68 g (=25.3 mmol, 44%) of the polymer P2 as yellow-orange fibers.

$^1$H NMR (400 MHz, CDCl$_3$): δ [ppm]=7.7–6.5 (br. m, 8 H; H$_{arom}$, olefin-H); 4.2–3.6 (br. m, 4.5 H; OCH$_3$, OCH$_2$); 2.8–2.7 ppm (br. m, bisbenzyl), 2.1–0.6 (br. m, 19H; aliph. H).

Integration of the signal at 2.8–2.7 ppm gave the content of TBB groups as 4.8%. The $^1$H NMR spectrum of polymer P2 is reproduced in FIG. 2.

GPC: THF+0.25% oxalic acid; column set SDV500, SDV1000, SDV10000 (PSS), 35° C., UV detection 254 nm, polystyrene standard: $M_w$=1.5×10$^6$ g/mol, $M_n$=2.8×10$^5$ g/mol.

Example P3

Copolymer comprising 75% of 2,5-bis(chloromethyl)4-methoxy-3'-(3,7-dimethyloctyloxy)biphenyl and 25% of 2,5-bis(chloromethyl)-3',4'-bis(2-methylpropoxy)biphenyl (polymer P3)

Preparation of poly(2-(3'-(3,7-dimethyloctyloxy)-5-methoxy)phenyl)-p-phenylenevinylene)co(2-(3',4'-bis(2-methylpropoxy))phenyl)-p-phenylenevinylene)

2.62 g (6.00 mmol) of 2,5-bis(chloromethyl)4-methoxy-3'-(3,7-dimethyloctyloxy)biphenyl and 0.79 g (2.00 mmol) of 2,5-bis(chloromethyl)-3',4'-bis(2-methylpropoxy)biphenyl and 540 ml of dry 1,4-dioxane were polymerized analogously to Example P2. Double reprecipitation from THF/MeOH gave 1.30 g (=46%) of the polymer P3 as a fine orange powder.

$^1$H NMR (400 MHz, CDCl$_3$): δ (ppm)=7.7–6.5 (br. m, 8 H; H$_{arom}$, olefin-H); 4.2–3.7 (br. m, 4.75 H; OCH$_3$, OCH$_2$); 2.8–2.7 ppm (br, bisbenzyl), 2.1–0.6 (br. m, 17.75 H; aliph. H).

Integration of the signal at 2.8–2.7 ppm gave the content of TBB groups as 1.8%)

GPC: THF+0.25% oxalic acid; column set SDV500, SDV1000, SDV10000 (PSS), 50° C., UV detection 254 nm, polystyrene standard: $M_w$=1.2×10$^6$ g/mol, $M_n$=1.8×10$^5$ g/mol.

Example P4

Copolymer comprising 25% of 2,5-bis(chloromethyl)-1,4-bis(3,7-dimethyloctyloxy)benzene and 75% of 2,5-bis(chloromethyl)-3'-(3,7-dimethyloctyloxy)-4-methoxybiphenyl (polymer P4)

Preparation of poly(2,5-(3,7-dimethyloctyloxy)-p-phenylenevinylene)co(2-(4'-(3,7-dimethyloctyloxy)phenyl-5-methoxy)-p-phenylenevinylene)

0.97 g (2.00 mmol) of 2,5-bis(chloromethyl)-1,4-bis(3',7'-dimethyloctyloxy)benzene and 2.62 g (6.00 mmol) of 2,5-bis(chloromethyl)-3'-(3,7-dimethyloctyloxy)-4-methoxybiphenyl in 590 g of 1,4-dioxane were polymerized analogously to Example P1. Purification was accomplished by double dissolution in 300 ml of chlorobenzene (110°) and precipitation using ethylene glycol. 1.50 g (50%) of polymer P4 were obtained as orange flakes.

$^1$H NMR (400 MHz, $C_2D_2Cl_4$, 363K): δ (ppm)=8.0–6.8 (br. m, 6.5 H; $H_{arom}$, $H_{olefin}$); 4.4–3.7 (br. m, 4.75 H, $OCH_3$, $OCH_2$); 2.7 (br. s, bisbenzyl); 2.0–0.9 (br. m, 23.75 H). Integration of the signal at 2.7 ppm gave a TBB content of 1.0%.

Example P5

Quaternary copolymer comprising 25% of 2,5-bis(chloromethyl)-1-methoxy-4-(3,7-dimethyloctyloxy)benzene, 25% of 2,5-bis(chloromethyl)-1,4-bis(3,7-dimethyloctyloxy)benzene, 25% of 2,5-bis(chloromethyl)-3'-(3,7-dimethyloctyloxy)biphenyl and 25% of 2,5-bis(chloromethyl)4-methoxy-3'-(3,7-dimethyloctyloxy)biphenyl (polymer P5)

Preparation of poly(2-methoxy-5-(3,7-dimethyloctyloxy)-p-phenylenevinylene)co(2-(3'-(3,7-dimethyloctyloxy)phenyl)-p-phenylenevinylene)co-(2,5-bis(3,7-dimethyloctyloxy)-p-phenylenevinylene)co(5-methoxy-2-(3'-(3,7-dimethyloctyloxy)phenyl)-p-phenylenevinylene)

600 g of dry and $O_2$-free 1,4-dioxane were introduced into a dry 1 l four-necked flask fitted with mechanical stirrer, reflux condenser, thermometer and dropping funnel, and heated to 98° C. with stirring. 2,5-bis(chloromethyl)-1-methoxy-4-(3,7-dimethyloctyloxy)benzene (723 mg), 2,5-bis-(chloromethyl)-1,4-bis(3,7-dimethyloctyloxy)benzene (975 mg), 2,5-bis(chloromethyl)-3'-(3,7-dimethyloctyloxy)biphenyl) (815 mg) and 2,5-bis-(chloromethyl)4-methoxy-3'-(3,7-dimethyloctyloxy)biphenyl (875 mg) (2 mmol each), dissolved in 50 ml of dry 1,4-dioxane, were then added. A solution of 2.36 g (21 mmol) of potassium tert-butoxide in 21 ml of dry 1,4-dioxane was then added dropwise to the vigorously stirred mixture over the course of 5 minutes. The viscosity of the solution increased slightly. After the mixture had been stirred at 98° C. for 5 minutes, a further 1.79 g (16 mmol, 2.0 eq) of potassium tert-butoxide in 16 ml of 1,4-dioxane were added over the course of one minute. After the mixture had been stirred at 97°–98° C. for a further 2 hours, it was cooled to 45° C., and a mixture of 2.2 ml of acetic acid and 2.2 ml of 1,4-dioxane were then added. After the mixture had been stirred for a further 20 minutes, the polymer was precipitated by addition of the reaction solution to 1 l of vigorously stirred water. The polymer obtained in this way was filtered off and washed twice with 100 ml of methanol each time. Drying at room temperature under reduced pressure gave 1.71 [lacuna] of crude polymer.

The crude product was dissolved in 200 ml of THF with heating to 60° C. and precipitated by addition of 200 ml of methanol. After the product had been dried under reduced pressure and washed with 100 ml of methanol, this step was repeated (200 ml of THF/200 ml of methanol). Drying for two days under reduced pressure gave 1.13 g (=3.2 mmol, 40%) of the polymer P5 as pale-orange fibers.

$^1$H NMR (400 MHz, $CDCl_3$): δ (ppm)=7.9–4.6 (br. m; about 9 H); 4.2–3.7 (br. s, 4 H); 2.9–2.8 (br. m, bisbenzyl); 1.90.8 (br. m, about 19 H).

Integration of the signal at 2.9–2.8 ppm gave a TBB content of 4.7 ppm.

GPC: THF+0.25% oxalic acid; column set SDV500, SDV1000, SDV10000 (PSS), 35° C., UV detection 254 nm, polystyrene standard: $M_w=1.0×10^6$ g/mol, $M_n=1.9×10^5$ g/mol.

Example P6

Copolymer comprising 50% of 2,5-bis(chloromethyl)-3',4'-bis(2-methylpropoxy)biphenyl and 50% of 2,5-bis(chloromethyl)4-methoxy-3',4'-bis(2-methylpropoxy)biphenyl (polymer P6)

Preparation of poly[2-(3',4'-bis(2-methylpropoxy))-phenyl-p-phenylenevinylene]co[2-(3',4'-bis(2-methylpropoxy)phenyl)-5-methoxy-p-phenylenevinylene]

11.42 g (28.9 mmol) of 2,5-bis(chloromethyl)-3',4'-bis(2-methylpropoxy)biphenyl (Ex. Z5) and 12.28 g (28.9 mmol) of 2,5-bis(chloromethyl)-4-methoxy-3',4'-bis(2-methylpropoxy)biphenyl (Ex. E3) in 3400 ml of dry 1,4-dioxane were polymerized analogously to Example P2. Double reprecipitation from THF/MeOH gave 10.5 g (=53%) of the polymer P6 as yellow fibers.

$^1$H NMR (400 MHz, $CDCl_3$): δ [ppm]=7.6–6.5 (br. m, 7.5 H; $H_{arom}$, olefin-H); 4.1–3.7 (br. m, 5.5 H; $OCH_3$, $OCH_2$); 2.8–2.7 ppm (br. m, bisbenzyl), 2.1 (br. s, 2H, CH), 1.2–0.8 (br. m, 12 H; aliph. H).

Integration of the signal at 2.8–2.7 ppm gave the content of TBB groups as 4.4%).

GPC: THF+0.25% oxalic acid; column set SDV500, SDV1000, SDV10000(PSS), 50° C., UV detection 254 nm, polystyrene standard: $M_w=1.1×10^6$ g/mol, $M_n=2.5×10^5$ g/mol.

Example P7

Copolymer comprising 50% of 2,5-bis(chloromethyl)-4-methoxy-3'-(3,7-dimethyloctyloxy)biphenyl and 50% of 2,5-bis(chloromethyl)- 3'-(3,7-dimethyloctyloxy)biphenyl (polymer P7)

Preparation of poly[2-(3'-(3,7-dimethyloctyloxy))phenyl-5-methoxy-p-phenylenevinylene]co[2-(3'-(3,7-dimethyloctyloxy))-phenyl-p-phenylenevinylene]

12.45 g (28.5 mmol) of 2,5-bis(chloromethyl)-4-methoxy-3'-(3,7-dimethyloctyloxy)biphenyl (Ex. E2) and 11.60 g (28.5 mmol) of 2,5-bis(chloromethyl)-3'-(3,7-dimethyloctyloxy)biphenyl (Ex. Z3) in 3400 ml of dry 1,4-dioxane were polymerized at 98° C. analogously to Example P2. Double reprecipitation from THF/MeOH gave 8.7 g (=44%) of the polymer P7 as yellow fibers.

$^1$H NMR (400 MHz, $CDCl_3$): δ [ppm]=7.8–6.5 (br. m, 8.5 H; $H_{arom}$, olefin-H); 4.1–3.6 (br. m, 3.5 H; $OCH_3$, $OCH_2$); 3.0–2.7 ppm (br. m, bisbenzyl); 1.9–0.8 (br. m, 19 H; aliph. H).

Integration of the signal at 3.0–2.7 ppm gave the content of TBB groups as 4.6%.

GPC: THF+0.25% oxalic acid; column set SDV500, SDV1000, SDV10000 (PSS), 50° C., UV detection 254 nm, polystyrene standard: $M_w=1.0×10^6$ g/mol, $M_n=2.4×10^5$ g/mol.

Example P8

Copolymer comprising 50% of 2,5-bis(chloromethyl)-3'-(3,7-dimethyloctyloxy)biphenyl and 50% of 2,5-bis(chloromethyl)-4-methoxy-3',4'-bis(2-methylpropoxy)biphenyl (polymer P8)

Preparation of poly[(2-(3'-(3,7-dimethyloctyloxy))phenyl-p-phenylenevinylene)co(2-(3',4'-bis(2-methylpropoxy))phenyl-5-methoxy-p-phenylenevinylene]

11.60 g (28.5 mmol) of 2,5-bis(chloromethyl)-3'-(3,7-dimethyloctyloxy)biphenyl (Ex. Z3) and 12.11 g (28.5 mmol) of 2,5-bis(chloromethyl)-4-methoxy-3',4'-bis(2-methylpropoxy)biphenyl (Ex. E3) in 3400 ml of dry 1,4-dioxane were polymerized at 99° C. analogously to Example P2. Double reprecipitation from THF/MeOH gave 8.13 g (=42%) of the polymer P8 as fine polymer fibers.

$^1$H NMR (400 MHz, $CDCl_3$): δ [ppm]=7.9–6.6 (br. m, 8 H; $H_{arom}$, olefin-H); 4.1–3.6 (br. m, 4.5 H; $OCH_3$, $OCH_2$);

2.9–2.6 ppm (br. m, bisbenzyl); 2.13 (br. s, 1H, CH); 1.9–0.8 (br. m, 15.5 H; aliph. H).

Integration of the signal at 2.9–2.6 ppm gave the content of TBB groups as 5.0%)

GPC: THF+0.25% oxalic acid; column set SDV500, SDV1000, SDV10000 (PSS), 50° C., UV detection 254 nm, polystyrene standard: $M_w=1.3\times10^6$ g/mol, $M_n=2.3\times10^5$ g/mol.

Example P9

Copolymer comprising 50% of 2,5-bis(chloromethyl)-3'-(3,7-dimethyloctyloxy)biphenyl and 50% of 2,5-bis(chloromethyl)-4-fluoro-3',4'-bis(2-methylpropoxy)biphenyl (polymer P9)

Preparation of poly[(2-(3'-(3,7-dimethyloctyloxy))phenyl-p-phenylenevinylene)co(2-(3',4'-bis(2-methylpropoxy))phenyl-5-fluoro-p-phenylenevinylene)]

5.80 g (14.23 mmol) of 2,5-bis(chloromethyl)-3'-(3,7-dimethyloctyloxy)biphenyl (Ex. Z3) and 5.88 g (14.23 mmol) of 2,5-bis(chloromethyl)-4-fluoro-3',4'-bis(2-methylpropoxy)biphenyl (Ex. E7) in 3200 ml of dry 1,4-dioxane were polymerized at 98° C. analogously to Example P2. Double reprecipitation from THF/MeOH save 8.13 g (=42%) of the polymer P9 as a yellow powder.

$^1$H NMR (400 MHz, CDCl$_3$): δ [ppm]=8.0–6.6 (br. m, 8 H; $H_{arom}$, olefin-H); 4.2–3.6 (br. m, 3 H; OCH$_3$, OCH$_2$); 3.0–2.6 ppm (br. m, bisbenzyl); 2.1 (br. s, 1H, CH); 1.9–0.8 (br. m, 15.5 H; aliph. H).

Integration of the signal at 3.0–2.6 ppm gave the content of TBB groups as 8.5%)

GPC: THF+0.25% oxalic acid; column set SDV500, SDV1000, SDV10000 (PSS), 50° C., UV detection 254 nm, polystyrene standard: $M_w=9.5\times10^5$ g/mol, $M_n=1.1\times10^5$ g/mol.

Example P10

Copolymer comprising 40% of 2,5-bis(chloromethyl)-4-chloro-4'-(3,7-dimethyloctyloxy)biphenyl and 60% of 2,5-bis(chloromethyl)-3',4'-bis(2-methylpropoxy)biphenyl (polymer P10)

Preparation of poly[(2-(4'-(3,7-dimethyloctyloxy)phenyl)-5-chloro-p-phenylenevinylene)co(2-(3',4'-bis(2-methylpropoxy))phenyl-p-phenylenevinylene)]

2.83 g (6.4 mmol) of 2,5-bis(chloromethyl)4-chloro-4'-(3,7-dimethyloctyloxy)biphenyl (Ex. E8) and 3.79 g (9.6 mmol) of 2,5-bis(chloromethyl)-3',4'-bis(2-methylpropoxy)biphenyl (Ex. Z5) in 1100 ml of dry 1,4-dioxane were polymerized at 98° C. analogously to Example P2. Double reprecipitation from chlorobenzene/MeOH gave 1.6 g (=42%) of the polymer P10 as a yellow powder.

$^1$H NMR (400 MHz, CDCl$_3$): δ [ppm]=8.0–6.6 (br. m, 8 H; $H_{arom}$, olefin-H); 4.1–3.6 (br. m, 3.2 H; OCH$_3$, OCH$_2$); 3.0–2.7 ppm (br. m, bisbenzyl); 2.2 (br. s, 1H, CH); 1.9–0.8 (br. m, 15 H; aliph. H).

Integration of the signal at 3.0–2.7 ppm gave a content of TBB groups of 9.5%.

Example P11

Copolymer comprising 50% of 1,4-bis(chloromethyl)-2-(3,7-dimethyloctyloxy)-5-methoxybenzene, 30% of 2,5-bis(chloromethyl)-4-methoxy-3'-(3,7-dimethyloctyloxy)biphenyl and 20% of 2,5-bis(chloromethyl)-3'-(3,7-dimethyloctyloxy)biphenyl (polymer P11)

Preparation of poly[2-methoxy-5-(3,7-dimethyloctyloxy)-p-phenylenevinylene]co[2-(3'-(3,7-dimethyloctyloxy)phenyl)-5-methoxy-p-phenylenevinylene]co[2-(3'-(3,7-dimethyloctyloxy))-phenyl-p-phenylenevinylene]

7.47 g (28.5 mmol) of 1,4-bis(chloromethyl)-2-(3,7-dimethyloctyloxy)-5-methoxybenzene (Ex. Z1), 6.22 g (17.1 mmol) of 2,5-bis(chloromethyl)4-methoxy-3'-(3,7-dimethyloctyloxy)biphenyl (Ex. E2) and 4.64 g (11.4 mmol) of 2,5-bis(chloromethyl-3'-(3,7-dimethyloctyloxy)biphenyl (Ex. Z3) in 3450 ml of dry 1,4-dioxane were polymerized at 98–100° C. analogously to Example P2. Double reprecipitation from THF/
MeOH gave 7.9 g (=43%) of the polymer P11 as
orange-red fibers.

$^1$H NMR (400 MHz, CDCl$_3$): δ [ppm]=7.7–6.4 (br. m, 6.2 H; $H_{arom}$, olefin-H); 4.1–3.6 (br. m, 4.4 H; OCH$_3$, OCH$_2$); 3.0–2.8 ppm (br. m, bisbenzyl); 1.9–0.8 (br. m, 19 H; aliph. H).

Integration of the signal at 3.0–2.8 ppm gave the content of TBB groups as 3.3%.

GPC: THF+0.25% oxalic acid; column set SDV500, SDV1000, SDV10000 (PSS), 50° C., UV detection 254 nm, polystyrene standard: $M_w=1.0\times10^6$ g/mol, $M_n=2.4\times10^5$ g/mol.

Example P12

Copolymer comprising 25% of 2,5-bis(chloromethyl)-3'-(3,7-dimethyloctyloxy)biphenyl, 25% of 2,5-bis(chloromethyl)-4-methoxy-3'-(3,7-dimethyloctyloxy)biphenyl, 25% of 2,5-bis(chloromethyl)4-methoxy-3',4'-bis(2-methylpropoxy)biphenyl and 25% of 2,5-bis(chloromethyl)-3',4'-bis(2-methylpropoxy)biphenyl (polymer P12)

5.80 g (14.2-mmol) of 2,5-bis(chloromethyl)-3'-(3,7-dimethyloctyloxy)biphenyl (Ex. Z3), 6.22 g (14.2 mmol) of 2,5-bis(chloromethyl)-4-methoxy-3'-(3,7-dimethyloctyloxy)biphenyl (Ex. E2), 6.05 g (14.2 mmol) of 2,5-bis(chloromethyl)4-methoxy-3',4'-bis(2-methylpropoxy)biphenyl (Ex. E3) and 5.63 g (14.2 mmol) of 2,5-bis(chloromethyl)-3',4'-bis(2-methylpropoxy)biphenyl (Ex. Z5) in 3400 ml of dry 1,4-dioxane were polymerized at 99° C. analogously to Example P2. Neutralization, precipitation and double reprecipitation from THF/MeOH gave 9.12 g (47%) of the polymer P12 as fine yellow fibers.

$^1$H NMR (400 MHz, CDCl$_3$): δ [ppm]=7.7–6.5 (br. m, 8 H; $H_{arom}$, olefin-H); 4.1–3.6 (br. m, 4.5 H; OCH$_3$, OCH$_2$); 2.9–2.6 ppm (br. m, bisbenzyl); 2.14 (br. s,1H, CH); 1.9–4.8 (br. m, 15.5 H; aliph. H).

Integration of the signal at 2.9–2.6 ppm gave the content of TBB groups as 6.0%.

GPC: THF+0.25% oxalic acid; column set SDV500, SDV1000, SDV10000 (PSS), 50° C., UV detection 254 nm, polystyrene standard: $M_w=1.1\times10^6$ g/mol, $M_n=1.8\times10^5$ g/mol.

Example P13

Copolymer comprising 50% of 2,5-bis(chloromethyl)-3'-(3,7-dimethyloctyloxy)biphenyl and 50% of 2,5-bischloromethyl-4-(3,7-dimethyloctyloxy)biphenyl (polymer P13)

Preparation of poly[(2-(3'-(3,7-dimethyloctyloxy))phenyl-p-phenylenevinylene)co(2-phenyl-5-(3,7-dimethyloctyloxy)-p-phenylenevinylene)]

8.85 g (21.7 mmol) of 2,5-bis(chloromethyl)-3'-(3,7-dimethyloctyloxy)biphenyl (Ex. Z3) and 8.85 g (21.7 mmol) of 2,5-bischloromethyl-4-(3,7-dimethyloctyloxy)-biphenyl (Ex. E9) in 2250 g of dry 1,4-dioxane were polymerized at 99° C. analogously to Example P2. Double reprecipitation from THF/MeOH gave 7.6 g (=52%) of the polymer P13 as a yellow powder.

¹H NMR (400 MHz, CDCl₃): δ [ppm]=7.7–6.6 (br. m, 9 H; H$_{arom}$, olefin-H); 4.4–3.6 (br. m, 2 H; OCH₃, OCH₂); 2.9–2.6 ppm (br. m, bisbenzyl); 1.9–0.8 (br. m, 19 H; aliph. H).

Integration of the signal at 2.9–2.6 ppm gave the content of TBB groups as 7.0%.

GPC: THF+0.25% oxalic acid; column set SDV500, SDV1000, SDV10000(PSS), 50° C., UV detection 254 nm, polystyrene standard: $M_w$=1.1×10⁶ g/mol, $M_n$=1.3×10⁵ g/mol.

Example P14

Copolymer comprising 50% of 2,5-bis(chloromethyl)-3',4'-bis(2-methylpropoxy)biphenyl and 50% of 2,5-bis(chloromethyl)-3'-(3,7-dimethyloctyloxy)-4-fluorobiphenyl (polymer P14)

Preparation of poly[(2-(3',4'-bis(2-methylpropoxy)phenyl)-p-phenylenevinylene)co(2-(3'-(3,7-dimethyloctyloxy))phenyl-5-fluoro-p-phenylenevinylene)]

3.26 g (8.25 mmol) of 2,5-bis(chloromethyl)-3',4'-bis(2-methylpropoxy)biphenyl (Ex. Z5) and 3.51 g (8.25 mmol) of 2,5-bis(chloromethyl)4-fluoro-3',4'-bis(2-methylpropoxy)biphenyl (Ex. E6) in 1000 ml of dry 1,4-dioxane were polymerized at 98° C. analogously to Example P2. Double reprecipitation from THF/MeOH gave 3.3 g (=59%) of the polymer P14 as a yellow powder.

¹H NMR (400 MHz, CDCl₃): δ [ppm]=7.9–6.5 (br. m, 8 H; H$_{arom}$, olefin-H); 4.2–3.5 (br. m, 3 H; OCH₃, OCH₂); 2.9–2.5 ppm (br. s, bisbenzyl); 2.2–0.8 (br. m, 16.5 H; aliph. H).

Integration of the signal at 2.9–2.5 ppm gave the content of TBB groups as 8.5%.

¹⁹F NMR (376 MHz, CDCl₃): δ [ppm]=120 (br. m); using an internal reference (C₆F₆), it was found that the proportion of fluorine-containing groups is 50%.

GPC: THF+0.25% oxalic acid; column set SDV500, SDV1000, SDV10000 (PSS), 50° C., UV detection 254 nm, polystyrene standard: $M_w$=1.05×10⁶ g/mol, $M_n$=1.9×10⁵ g/mol.

Example P15

Copolymer comprising 50% of 2,5-bis(chloromethyl)-3'-(3,7-dimethyloctyloxy)biphenyl and 50% of 2,5-bischloromethyl-4,2',5'-trimethoxybiphenyl (polymer P15)

Preparation of poly[(2-(3'-(3,7-dimethyloctyloxy))phenyl)-p-phenylenevinylene)co(2-(2',5'-dimethoxy)phenyl)-5-methoxy-p-phenylenevinylene]

3.36 g (8.25 mmol) of 2,5-bis(chloromethyl)-3'-(3,7-dimethyloctyloxy)biphenyl (Ex. Z3) and 2.82 g (8.25 mmol) of 2,5-bis(chloromethyl)-4,2',5'-trimethoxybiphenyl (Ex. E4) in 1000 ml of dry 1,4-dioxane were polymerized at 98–100° C. analogously to Example P2. Double reprecipitation from THF/MeOH gave 1.95 g (=54%) of the polymer P15 as a yellow powder.

¹H NMR (400 MHz, CDCl₃): δ [ppm]=7.6–6.6 (br. m, 8 H; H$_{arom}$, olefin-H); 4.4–3.6 (br. m, 5.5 H; OCH₃, OCH₂); 2.9–2.6 ppm (br. s, bisbenzyl); 2.0–0.8 (br. m, 9.5 H; aliph. H).

Integration of the signal at 2.9–2.6 ppm gave the content of TBB groups as 5.5%.

¹⁹F NMR (376 MHz, CDCl₃): δ [ppm]=116 (br. s); using an internal reference (C₆F₆) it was found that the proportion of fluorine-containing groups is 50%.

GPC: THF+0.25% oxalic acid; column set SDV500, SDV1000, SDV10000 (PSS), 50° C., UV detection 254 nm, polystyrene standard: $M_w$=1.0×10⁶ g/mol, $M_n$=1.9×10⁵ g/mol.

Example P16

Copolymer comprising 30% of 2,5-bis(chloromethyl)-3'-(3,7-dimethyloctyloxy)biphenyl, 30% of 2,5-bis(chloromethyl-3',4'-bis(2-methylpropoxy)biphenyl and 40% of 2,5-bis(chloromethyl)4-methoxy-2',5'-dimethylbiphenyl (polymer P16)

6.96 g (16.6 mmol) of 2,5-bis(chloromethyl)-3'-(3,7-dimethyloctyloxy)biphenyl (Ex. Z3), 6.75 [lacuna] (16.6 mmol) of 2,5-bis(chloromethyl)-3',4'-bis(2-methylpropoxy)biphenyl (Ex. Z5) and 7.04 g (22.1 mmol) of 2,5-bis(chloromethyl)-4-methoxy-2',5'-dimethylbiphenyl (Ex. E5) in 3400 ml of dry 1,4-dioxane were polymerized at 98° C. analogously to Example P2. Double reprecipitation from THF/MeOH gave 6.70 g (=40%) of the polymer P16 as green-yellow fibers.

¹H NMR (400 MHz, CDCl₃): δ [ppm]=7.8–6.6 (br. m, 7.9 H; H$_{arom}$, olefin-H); 4.2–3.6 (br. m, 3 H; OCH₃, OCH₂); 2.9–2.7 ppm (br. s, bisbenzyl); 2.4–0.8 (br. m, 12.3 H; aliph. H).

Integration of the signal at 2.9–2.7 ppm gave the content of TBB groups as 4.0%.

GPC: THF+0.25% oxalic acid; column set SDV500, SDV1000, SDV10000 (PSS), 50° C., UV detection 254 nm, polystyrene standard: $M_w$=1.2×10⁶ g/mol, $M_n$=2.7×10⁵ g/mol.

Example P17

Copolymer comprising 50% of 2,5-bis(chloromethyl-3'-(3,7-dimethyloctyloxy)biphenyl and 50% of 2,5-bis(chloromethyl)4-methoxy-3',5'-bisfluorobiphenyl (polymer P9)

Preparation of poly[(2-(3'-(3,7-dimethyloctyloxy))phenyl-p-phenylenevinylene)co(2-3',5'-difluorophenyl-5-methoxy-p-phenylenevinylene)]

4.27 g (10.5 mmol) of 2,5-bis(chloromethyl)-3'-(3,7-dimethyloctyloxy)biphenyl (Ex. Z3) and 3.35 g (10.5 mmol) of 2,5-bis(chloromethyl)4-methoxy-3',5'-bisfluorobiphenyl (Ex. E10) in 2500 ml of dry 1,4-dioxane were polymerized at 98° C. analogously to Example P2. Double reprecipitation from THF/MeOH gave 2.99 g (=49%) of the polymer P9 as a yellow powder.

¹H NMR (400 MHz, CDCl₃): δ [ppm]=8.1–6.6 (br. m, 8 H; H$_{arom}$, olefin-H); 4.2–3.6 (br. m, 2.5 H; OCH₃, OCH₂); 3.0–2.6 ppm (br. s, bisbenzyl); 2.1 (br. s, 1H, CH); 1.9–0.8 (br. m, 9.5 H; aliph. H).

Integration of the signal at 3.0–2.6 ppm gave the content of TBB groups as 4.5%.

GPC: THF+0.25% oxalic acid; column set SDV500, SDV1000, SDV10000 (PSS), 50° C., UV detection 254 nm, polystyrene standard: $M_w$=9×10⁵ g/mol, $M_n$=1.8×10⁵ g/mol.

V. Synthesis of Comparative Examples Not According to the Invention

Example V1

Copolymer comprising 50% of 2,5-bis(chloromethyl)-1-methoxy-4-(3,7-dimethyloctyloxy)benzene and 50% of 2,5-bis(chloromethyl)-3'-(3,7-dimethyloctyloxy)biphenyl (polymer V1)

Preparation of poly(2-methoxy-5-(3,7-dimethyloctyloxy)-p-phenylenevinylene)co(2-(3'-(3,7-dimethyloctyloxy)phenyl)-p-phenylenevinylene)

3.5 l of dry and O₂-free 1,4-dioxane were introduced into a dry 6 l four-necked flask fitted with mechanical stirrer, reflux condenser, thermometer and dropping funnel, and heated to 95° C. with stirring. 9.00 g (24.9 mmol) of 2,5-bis(chloromethyl)-1-methoxy-4-(3,7-dimethyloctyloxy)benzene and 10.13 g (24.9 mmol) of 2,5-bis(chloromethyl)-3'-(3,7-dimethyloctyloxy)biphenyl, dissolved in 30 ml of dry 1,4-dioxane, were then added. A solution of 13.97 g (124.5 mmol, 2.5 eq) of potassium tert-butoxide in 125 ml of dry 1,4-dioxane was then added dropwise to the vigorously stirred mixture over the course of 5 minutes. During the course of this addition, the color changed from colorless via yellow to orange-red. After the mixture had been stirred at 95–96° C. for 5 minutes, the same amount (13.97 g, 124.5 mmol, 2.5 eq) of potassium tert-butoxide in 125 ml of 1,4-dioxane was again added over the course of one minute. After the mixture had been stirred at 95°–97° C. for a further two hours, it was cooled to 55° C., and a mixture of 30 ml of acetic acid and 30 ml of 1,4-dioxane was added. 1.8 l of water were added to the solution, which was then pale orange, over the course of 5 minutes with vigorous stirring. The precipitated polymer was filtered off and washed twice with 100 ml of methanol each time. Drying under reduced pressure gave 14.1 g of crude polymer.

The crude polymer was dissolved in 1.8 l of THF with heating to 60° C. and precipitated by addition of 2 l of methanol. After the product had been dried under reduced pressure and washed with 200 ml of methanol, this step was repeated. Drying for two days under reduced pressure gave 10.80 g 34.7 mmol, 70%) of the polymer V1 as pale-orange fibers.

$^1$H NMR (400 MHz, CDCl$_3$): (ppm)=7.9–6.6 (br. m; 6.5 H); 4.2–3.6 (br. m, 3.5 H); 3.0–2.6 (br. M; 7.2% bisbenzyl); 2.0–0.95 (br. m, 10H); 0.86, 0.84 (2 s, 9H).

GPC: THF+0.25% oxalic acid; column set SDV500, SDV1000, SDV10000 (PSS), 35° C., UV detection 254 nm, polystyrene standard: $M_w$=7.4×10$^5$ g/mol, $M_n$=7×10$^4$ g/mol.

The $^1$H-NMR spectrum of the polymer V1 is reproduced in FIG. 1.

Example V2

Copolymer comprising 50% of 2,5-bis(chloromethyl)-3'-(3,7-dimethyloctyloxy)biphenyl and 50% of 2,5-bis(chloromethyl)-3',4'-bis(2-methylpropoxy)biphenyl (polymer V2)

Preparation of poly(2-(3'-(3,7-dimethyloctyloxy)phenyl)-p-phenylenevinylene)co(2-(3',4'-2-methylpropoxy)phenyl)-p-phenylenevinylene)

600 ml of dry 1,4-dioxane were introduced into a heat-dried 1 l four-necked flask fitted with mechanical Teflon stirrer, high-efficiency condenser, thermometer and dropping funnel, degassed by passing through N$_2$ for 15 minutes and then heated to gentle reflux (99° C.) with stirring. 1.63 g (4.00 mmol) of 2,5-bis(chloromethyl)-3'-(3,7-dimethyloctyloxy)biphenyl and 1.58 g (4.00 mmol) of [lacuna], dissolved in 20 ml of dry 1,4-dioxane, were subsequently added. A solution of 2.36 g (21 mmol, 2.6 eq) of potassium tert-butoxide in 21 ml of dry 1,4-dioxane was then added dropwise to the vigorously stirred mixture over the course of 5 minutes. During the addition of the base, the following color change was observed: colorless—yellow—yellow-green. After the mixture had been stirred at this temperature for a further 5 minutes, a further 1.80 g (16 mmol, 2.0 eq) of potassium tert-butoxide in 16 ml of dry 1,4-dioxane were added over the course of one minute. The temperature was held at 98–99° C. for a further 2 hours; after this time, the mixture was cooled to 45° C., and a mixture of 2.5 ml of acetic acid and 2.5 ml of 1,4-dioxane was added. The color of the reaction mixture became somewhat paler during this addition, and the viscosity rose. The reaction mixture was stirred for 20 minutes and poured into 0.65 l of vigorously stirred water. 100 ml of methanol were added, and the mixture was stirred for a further 20 minutes. Filtration through a polypropylene circular filter, rinsing twice with methanol and drying under reduced pressure gives 1.30 g (3.93 mmol, 49%) of crude polymer as yellow fibers.

After the crude polymer has been dried at room temperature under reduced pressure, purification is carried out by double dissolution in 100 ml of THF each time and precipitation using 100 ml of methanol each time. Drying gave 0.99 g (3.00 mmol, 38%) of polymer V2 as yellow fibers.

$^1$H NMR (400 MHz, CDCl$_3$): δ (ppm)=7.8–6.5, beneath this br. s at 6.9 (br. m; 8.8 H); 4.0 (br. s, 1.6 H); 3.0–2.6 ppm (br. m, 12% bisbenzyl); 2.3 (br. s, 0.6 H, CH$_3$); 2.0 (br. s, 0.6 H, CH$_3$); 1.8, 1.65, 1.55, 1.3, 1.15 (5×s, together 8 H; alkyl-H); 0.91, 0.85 (2×s, 7.2H; 3×CH$_3$).

GPC: THF+0.25% oxalic acid; column set SDV500, SDV1000, SDV10000 (PSS), 35° C., UV detection 254 nm, polystyrene standard: $M_w$=1.8×10$^6$ g/mol, $M_n$=3.9×10$^5$ g/mol.

The $^1$H-NMR spectrum of the polymer V2 is reproduced in FIG. 2.

Example V3

Copolymer comprising 50% of 2,5-bis(chloromethyl)-1-methoxy-4-(3,7-dimethyloctyloxy)benzene and 50% of 2,5-bis(chloromethyl)-4'-(3,7-dimethyloctyloxy)biphenyl (polymer V3)

Preparation of poly(2-methoxy-5-(3,7-dimethyloctyloxy)-p-phenylenevinylene)co-(2-(4'-(3,7-dimethyloctyloxy)phenyl)-p-phenylenevinylene)

3400 ml of dry and O$_2$-free 1,4-dioxane were heated to 97° C. in a dry 6 l four-necked flask fitted with mechanical Teflon stirrer, reflux condenser, thermometer and dropping funnel. A solution of 8.44 g (23.35 mmol) of 2,5-bis(chloromethyl)-1-methoxy-4-(3',7'-dimethyloctyloxy)benzene and 9.52 g (23.35 mmol) of 2,5-bis(chloromethyl)-4'-(3,7-dimethyloctyloxy)biphenyl in 50 ml of dry 1,4-dioxane was then added. A solution of 13.10 g (117 mmol) of potassium tert-butoxide in 117 ml of dry 1,4-dioxane was then added dropwise to the vigorously stirred mixture over the course of 5 minutes. During this addition, the color changed from colorless via yellow to orange-red. After 5 minutes, a further 10.48 g (93 mmol) of potassium tert-butoxide, dissolved in 93 ml of 1,4-dioxane, were added. After the mixture had been stirred at 95–97° C. for 2 hours, it was cooled to 45° C., and a mixture of 19 ml of acetic acid and 20 ml of 1,4-dioxane was added. The solution, which was then orange, was poured into 4 l of vigorously stirred water. The precipitated polymer was isolated by filtration through a polypropylene filter and dried under reduced pressure. The crude yield was 12.65 g (40.6 mmol, 87%).

The polymer was dissolved in 1690 ml of THF with heating to 60° C. and precipitated by addition of 1700 ml of methanol at 40° C. After the product had been dried under reduced pressure, this step was repeated. Drying under reduced pressure gave 7.10 g (=22.79 mmol, 49%) of the polymer V3 as pale-orange fibers.

$^1$H NMR (400 MHz, CDCl$_3$): δ (ppm)=7.9–6.9 (br. m, 6.5 H); 4.2–3.6 (br. m, 3.5 H); 2.9–2.6 (br. m, 7% bisbenzyl); 2.0–0.9 (br. m, 10H); 0.89, 0.86 (2 s, 9H).

GPC: THF+0.25% oxalic acid; column set SDV500, SDV1000, SDV10000 (PSS), 35° C., UV detection 254 nm, polystyrene standard: $M_w$=1.5×10$^6$ g/mol, $M_n$=2.8×10$^5$ g/mol.

Example V4

Quaternary copolymer comprising 2% of 2,5-bis(chloromethyl)-1-methoxy-4-(3,7-dimethyloctyloxy)benzene, 13% of 2,5-bis(chloromethyl)-2',5'-dimethylbiphenyl, 25% of 2,5-bis(chloromethyl)-3'-(3,7-dimethyloctyloxy)biphenyl and 60% of 2,5-bis(chloromethyl)-4'-(3,7-dimethyloctyloxy)biphenyl (polymer V4)

Preparation of poly(2-methoxy-5-(3,7-dimethyloctyloxy)-p-phenylenevinylene)co(2-(3'-(3,7-dimethyloctyloxy)phenyl)-p-phenylenevinylene)phenylenevinylene)co(2-(4'-(3,7-dimethyloctyloxy)phenyl)-p-phenylenevinylene)co(2-(2',5'-dimethyl)phenyl)-p-phenylenevinylene)

3.55 kg (3.40 l) of dry and $O_2$-free 1,4-dioxane were introduced into a dry 6 l four-necked flask fitted with mechanical stirrer, reflux condenser, thermometer and dropping funnel, and heated to 98° C. with stirring. A solution of 240 mg (0.66 mmol) of 2,5-bis(chloromethyl)-1-methoxy-4-(3,7-dimethyloctyloxy)benzene, 3.38 g (8.29 mmol) of 2,5-bis(chloromethyl)-3'-(3,7-dimethyloctyloxy)biphenyl, 8.11 g (19.9 mmol) of 2,5-bis(chloromethyl)4'-(3,7-dimethyloctyloxy)biphenyl and 1.20 g (4.31 mmol) of 2,5-bis(chloromethyl)-2',5'-dimethylbiphenyl, dissolved in 50 ml of dry 1,4-dioxane, was then added. A solution of 9.30 g (82.9 mmol, 2.6 eq) of potassium tert-butoxide in 83 ml of dry 1,4-dioxane was then added dropwise to the vigorously stirred mixture over the course of 5 minutes. The viscosity of the solution increased slightly. After the mixture had been stirred at 98° C. for 5 minutes, a further 7.44 g (66.3 mmol, 2.0 eq) of potassium tert-butoxide in 66 ml of 1,4-dioxane were added over the course of one minute. After the mixture had been stirred at 97°–98° C. for a further 2 hours, it was cooled to 45° C., and a mixture of 19.1 ml of acetic acid and 20 ml of 1,4-dioxane was added. The polymer was stirred for a further 20 minutes and precipitated by addition of the reaction solution to 4 l of vigorously stirred water. The polymer obtained in this way was filtered off and washed twice with 300 ml of methanol each time. Drying at room temperature under reduced pressure gave 10.40 g (32.8 mmol, 99%) of crude polymer.

The crude product was dissolved in 1390 ml of THF with heating to 60° C. and precipitated by addition of 1.4 l of methanol. After the product had been dried under reduced pressure and washed with 100 ml of methanol, this step was repeated (800 ml of THF/800 ml of methanol). Drying for two days under reduced pressure gave 7.90 g (=24.9 mmol, 75%) of the polymer V4 as pale-orange fibers.

$^1$H NMR (400 MHz, $CDCl_3$): δ (ppm)=7.9–6.6 (br. m; about 9 H); 4.0 (br. s, about 2 H); 2.9–2.6 (br. m, 12% bisbenzyl); 2.4, 2.1 (2×br. s, 2×each H); 1.9–0.8 (br. m, about 19 H).

GPC: THF+0.25% oxalic acid; column set SDV500, SDV1000, SDV10000 (PSS), 35° C., UV detection 254 nm, polystyrene standard: $M_w$=7.8×10$^5$ g/mol, $M_n$=1.9×10$^5$ g/mol.

Example V5
Copolymer comprising 82% of 2,5-bis(chloromethyl)-1-(3,7-dimethyloctyloxy)-4-methoxybenzene and 18% of 2,5-bis(chloromethyl)-3'-(3,7-dimethyloctyloxy)-4-methoxybiphenyl (polymer V5)
Preparation of poly(2-(3,7-dimethyloctyloxy)-5-methoxy-p-phenylenevinylene)co(2-(3'-(3,7-dimethyloctyloxy)phenyl)-5-methoxy-p-phenylenevinylene)

540 ml of dry and $O_2$-free 1,4-dioxane were heated to 98° C. in a dry 1 l four-necked flask fitted with mechanical Teflon stirrer, reflux condenser, thermometer and dropping funnel. A solution of 2.37 g (6.56 mmol) of 2,5-bis(chloromethyl)-1-(3,7-dimethyloctyloxy)4-methoxybenzene and 0.630 g (1.44 mmol) of 2,5-bis(chloromethyl)-3'-(3,7-dimethyloctyloxy)-4-methoxybiphenyl in 10 ml of dry 1,4-dioxane was then added. A solution of 2.47 g (22 mmol) of potassium tert-butoxide in 22 ml of dry 1,4-dioxane was then added dropwise to the vigorously stirred mixture over the course of 5 minutes. During this addition, the color changed from colorless via yellow to orange-red. After 5 minutes, a further 2.47 g (22 mmol) of potassium tert-butoxide, dissolved in 22 ml of 1,4-dioxane, were added. After the mixture had been stirred at 98–99° C. for 2 hours, it was cooled to 42° C. A mixture of 6 ml of acetic acid and 6 ml of 1,4-dioxane was then added. The orange, cloudy solution was poured into 0.6 l of vigorously stirred water. The polymer, which precipitated in flake form, was isolated by filtration through a polypropylene filter and dried under reduced pressure. The crude yield was 2.46 g (6.56 mmol, 82%).

The polymer was dissolved in 330 ml of THF with heating to reflux. It was precipitated by dropwise addition of 350 ml of methanol. After the product had been dried under reduced pressure, it was dissolved in 300 ml of THF and precipitated by addition of 300 ml of methanol. Washing with methanol and drying under reduced pressure gave 1.62 g (=4.32 mmol, 54%) of polymer V5 as orange fibers.

$^1$H NMR (400 MHz, $CDCl_3$): δ (ppm)=7.9–6.5 (br. m, 4.7 H); 4.4–3.6 (br. m, 5 H); 3.0–2.7 (br. m, 3.5% bisbenzyl); 2.0–0.7 (br. m, 19 H).

Owing to the tendency of polymer V5 to gel, a GPC measurement could not be carried out.

Example V6
Polymerization of 2,5-bis(chloromethyl)-3'-(3,7-dimethyloctyloxy)biphenyl (polymer V6) by dehydrohalogenation
Preparation of poly[2-(3'-(3,7-dimethyloctyloxy)phenyl)-p-phenylenevinylene]

640 g (619 ml) of dry 1,4-dioxane were introduced into a dry reaction apparatus (2 l four-necked round-bottomed flask fitted with reflux condenser, mechanical stirrer, dropping funnel and thermometer) and degassed by passing through $N_2$ for 15 minutes. After switching over to an $N_2$ blanket, the dioxane was heated to 98° C. 3.26 g (8.00 mmol) of 2,5-bis(chloromethyl)-3'-(3,7-dimethyloctyloxy)biphenyl (dissolved in 30 ml of dry 1,4-dioxane) were then added to the boiling solution. A solution of 2.33 g (20.8 mmol, 2.6 eq) of potassium tert-butoxide in 21 ml of dry 1,4-dioxane was added dropwise over the course of 5 minutes; during this addition, the color of the reaction mixture changed from colorless to green. After 5 minutes, a further 1.8 g (16 mmol, 2 eq) of potassium tert-butoxide (dissolved in 18 ml of dry 1,4-dioxane) were added over the course of one minute. The mixture was stirred at 98° C. for a further 2 hours, during which the color changed from green to yellow-green. The reaction solution was cooled to 50° C., and a mixture of 3 ml of acetic acid and 3 ml of 1,4-dioxane was added. The mixture was stirred for a further 20 minutes and then poured into 700 ml of water with vigorous stirring. After 100 ml of methanol had been added, the polymer (fine green fibers) was filtered off with suction through a polypropylene circular filter and washed with 100 ml of methanol/water 1:1 and then with 100 ml of pure methanol. Drying at room temperature under reduced pressure gave 2.60 g (7.77 mmol, 97%) of crude polymer V6.

The purification was carried out by dissolving the polymer in 300 ml of THF (60° C.), cooling to 30° C. and precipitating the product by dropwise addition of 300 ml of methanol. The product was washed with 100 ml of methanol and dried at room temperature under reduced pressure. This procedure was repeated a further twice with 260 ml of THF/260 ml of methanol each time. 1.85 g (5.53 mmol, 69%) of polymer V6 were obtained as green-fluorescent fibrous polymer.

$^1$H NMR (400 MHz, $CDCl_3$): (ppm)=7.85–7.02 (br. m, 7 H; $H_{arom}$); 6.92, 6.67 (br. s, together 2H; olefin-H); 3.99 (br. s, 2 H; $OCH_2$); 1.82 (br. s, 1H; aliph. H); 1.72–1.45 (m, 3H);

1.40–1.08 (m, 6H), 0.91 (s, 3H; CH$_3$); 0.85 (s, 3H; CH$_3$); 0.83 (s, 3H; CH$_3$).

GPC: THF+0.25% oxalic acid; column set SDV500, SDV1000, SDV10000 (PSS), 35° C., UV detection 254 nm, polystyrene standard: M$_w$=6.3×10$^5$ g/mol, M$_n$=6.8×10$^4$ g/mol.

Example V7

Homopolymerization of 2,5-bis(chloromethyl)-1-methoxy-4-(3',7'-dimethyloctyloxy)benzene (polymer V7)

Preparation of poly(2-methoxy-5-(3,7-dimethyloctyloxy)-p-phenylenevinylene)

A 4 l four-necked flask fitted with mechanical (Teflon) stirrer, reflux condenser, thermometer and dropping funnel was dried by heating (hair drier) and flushed with N$_2$. It was then filled with 2.3 l of dry 1,4-dioxane, and, for degassing, N$_2$ was passed through the solvent for about 15 minutes. The flask was heated to 98° C. in an oil bath, and 14.0 g (38.7 mmol) of 2,5-bis(chloromethyl)-1-methoxy-4-(3',7'-dimethyloctyloxy)benzene were added as solid (rinsing with about 10 ml of dry 1,4-dioxane). 11.3 g (100 mmol, 2.6 eq) of potassium tert-butoxide, dissolved in 100 ml of 1,4-dioxane, were added dropwise to the reaction solution over the course of 5 minutes via the dropping funnel. During this addition, the reaction mixture changed color from colorless via greenish to yellow/orange, and the viscosity increased significantly. When the addition was complete, the mixture was stirred at 98° C. for about 5 more minutes, and then 8.70 g of potassium tert-butoxide (77 mmol, 2 eq) in 100 ml of dry 1,4-dioxane were added over the course of one minute, and the mixture was stirred at 96–98° C. for a further 2 hours. The solution was then cooled to 50° C. over the course of about 2 hours. 15 ml (260 mmol, 1.5 eq, based on the base) of acetic acid (diluted with the same amount of dioxane) were finally added to the reaction, and the mixture was stirred for a further 20 minutes. The solution was then deep orange. For work-up, the reaction solution was poured slowly into 2.5 l of vigorously stirred water. The mixture was stirred for a further 10 minutes, 200 ml of methanol were added, and the precipitated polymer was filtered off, washed with 200 ml of methanol and dried at room temperature under reduced pressure, giving 10.04 g (34.8 mmol, 90%) of crude polymer as red fibers.

Purification was carried out by dissolving the polymer in 1.1 l of THF (60° C.), cooling the solution to 40° C. and precipitating the product by dropwise addition of 1.2 l of methanol. After the product had been washed with 200 ml of methanol, it was dried at room temperature under reduced pressure. This procedure was repeated again with 1.0 l of THF/1.0 l of methanol. 6.03 g (20.9 mmol, 54%) of polymer V7 were obtained as dark-orange fibrous polymer.

$^1$H NMR (400 MHz, CDCl$_3$): (ppm)=7.7–6.5 (br. m, 4 H; H$_{arom}$, olefin-H); 4.5–3.6 (br. m, 5 H; OCH$_3$, OCH$_2$); 2.9 (br. s, bisbenzyl (3,5%)); 2.1–0.6 (br. m, 19H; aliph. H). GPC: THF+0.25% oxalic acid; column set SDV500, SDV1000, SDV10000 (PSS), 35° C., UV detection 254 nm, polystyrene standard: M$_w$=1.2×10$^6$ g/mol, M$_n$=1.1×10$^5$ g/mol.

Part 3: Production and Characterization of LEDs

LEDs were produced by the general process outlined below. Naturally, this had to be adapted to the particular circumstances (for example polymer viscosity and optimum layer thickness of the polymer in the device) in individual cases. The LEDs described below were in each case one-layer systems, i.e. substrate//ITO//polymer//negative electrode.

General Process for the Production of High-Efficiency Long-Life LEDs

After the ITO-coated substrates (for example glass support, PET foil) have been cut to the correct size, they are cleaned in a number of cleaning steps in an ultrasound bath (for example soap solution, Millipore water, isopropanol).

For drying, they are blown with an N$_2$ gun and stored in a desiccator. Before coating with the polymer, they are treated with an ozone plasma unit for about 20 minutes. A solution of the respective polymer (in general with a concentration of 4–25 mg/ml in, for example, toluene, chlorobenzene, xylene:cyclohexanone (4:1)) is prepared and dissolved by stirring at room temperature. Depending on the polymer, it may also be advantageous to stir the solution at 50–70° C. for some time. When the polymer has dissolved completely, it is filtered through a 5 μm or smaller filter and coated on at variable speeds (400–6000) using a spin coater. The layer thicknesses can be varied thereby in the range from about 50 to 300 nm.

Electrodes are then applied to the polymer films. This is generally carried out by thermal evaporation (Balzer BA360 or Pfeiffer PL S 500). The transparent ITO electrode is then connected as positive electrode and the metal electrode (for example Ca) as negative electrode, and the device parameters are determined.

The results obtained using the polymers described are shown in Table 1:

TABLE 1

| Polymer Example [a] | Polymer conc. [mg/ml] | Spin speed [rpm] | TBB content [%] | Max. luminance efficiency Cd/A | EL λmax [nm] | Color | U for 100 cd/m$^2$ [V] | I/Area for 100 cd/m$^2$ [mA/cm$^2$] |
|---|---|---|---|---|---|---|---|---|
| P1 | 5 | 2000 | 1.4% | 3.6 | 586 | yellow-orange | 3.2 | 2.9 |
| P2 | 5 | 1800 | 4.8% | 12.8 | 555 | yellow | 2.9 | 0.9 |
| P3 | 5 | 2500 | 1.8% | 7.8 | 565 | yellow | 3.9 | 1.4 |
| P4 | 5 | 1800 | 1.0% | 3.2 | 579 | yellow-orange | 3.2 | 2.8 |
| P5 | 5 | 600 | 4.7% | 2.9 | 578 | yellow-orange | 3.4 | 3.0 |
| P6 | 5 | 2000 | 4.4% | 11.8 | 555 | yellow | 3.1 | 0.9 |
| P7 | 5 | 1900 | 4.6% | 10.7 | 544 | yellow | 3.3 | 1.1 |
| P8 | 6 | 3700 | 5.0% | 9.1 | 551 | yellow | 3.1 | 1.5 |
| P9 | 5 | 1000 | 8.5% | 7.3 | 535 | green-yellow | 3.9 | 2.6 |
| P10 | 5(Cl-benzene) | 1300 | 9.5% | 4.0 | 540 | yellow-green | 4.6 | 4.0 |
| P11 | 5 | 2000 | 3.3% | 3.1 | 581 | yellow-orange | 3.2 | 1.8 |

TABLE 1-continued

| Polymer Example [a] | Polymer conc. [mg/ml] | Spin speed [rpm] | TBB content [%] | Max. luminance efficiency Cd/A | EL λmax [nm] | Color | U for 100 cd/m² [V] | I/Area for 100 cd/m² [mA/cm²] |
|---|---|---|---|---|---|---|---|---|
| P12 | 5 | 800 | 6.0% | 9.7 | 555 | yellow | 3.2 | 1.3 |
| P13 | 5(Cl-benzene) | 1000 | 7.0% | 3.4 | 550 | yellow | 5.2 | 4.4 |
| P14 | 5 | 1400 | 8.5% | 8.6 | 528 | green-yellow | 3.8 | 1.4 |
| P15 | 5 | 2000 | 5.5% | 9.2 | 560 | yellow | 3.4 | 1.3 |
| P16 | 5 | 1500 | 4.0% | 8.6 | 552 | yellow | 3.2 | 1.2 |
| P17 | 5 | 1000 | 4.5% | 9.0 | 549 | yellow-green | 3.1 | 1.1 |
| V1 | 5 [b] | 500 | 7.0% | 3.0 | 587 | yellow-orange | 4.3 | 4.4 |
| V2 | 5 | 1000 | 12.3% | 4.6 | 517 | green | 5.1 | 4.6 |
| V3 | 5 | 3000 | 7.0% | 3.1 | 581 | yellow-orange | 4.5 | 5.0 |
| V4 | 5 | 900 | 12.0% | 4.0 | 547 | yellow | 5.6 | 5.6 |
| V5 | 5 | 2000 | 3.5% | 1.2 | 591 | orange | 3.4 | 5.1 |
| V6 | 8 | 2200 | 12.5% | 5.9 | 519 | green | 4.4 | 3.8 |
| V7 | 6 [b] | 1100 | 3.5% | 1.2 | 591 | orange | 3.5 | 5.3 |

[a] Device size: 16 mm²; layer thickness: 80 nm, solutions in toluene
[b] 100 nm layer thickness The polymers according to the invention have a structural difference with respect to certain defect structures compared with all PPVs known hitherto prepared by dehydrohalogenation; this difference will be explained in greater detail below without restricting the invention or making the invention dependent on the truth content of the model explained. This structural difference can be correlated in model terms with the obtaining of the desired properties (long active service life of the corresponding LEDs; low increase in voltage).

In the dehydrohalogenation polymerization, the following takes place—following the outlined model: the stable pre-monomer employed (referred to as just monomer in the text above) initially eliminates HX on contact with a strong base, resulting in the formation of the actual monomer (quinodimethane). This reactive intermediate then polymerizes very quickly (presumably anionically initiated) to give the prepolymer, which is converted into the actual PPV by further base-induced elimination of HX (cf. following scheme).

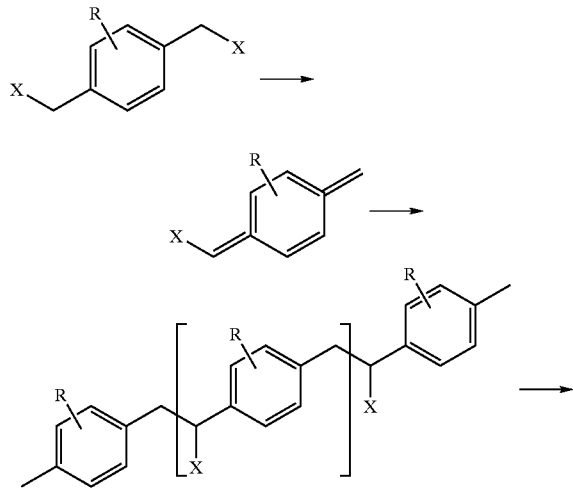

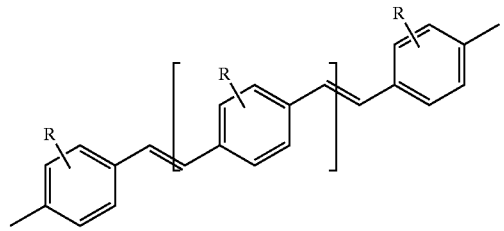

So long as a uniform head/tail polymerization always occurs here, this results in a defect-free PPV. However, as soon as a polymer lines up quasi-inverted (i.e. head/head and tail/tail polymerization), this results in the occurrence of triple and single bonds or a tolan-bisbenzyl defect (TBB); cf. following scheme.

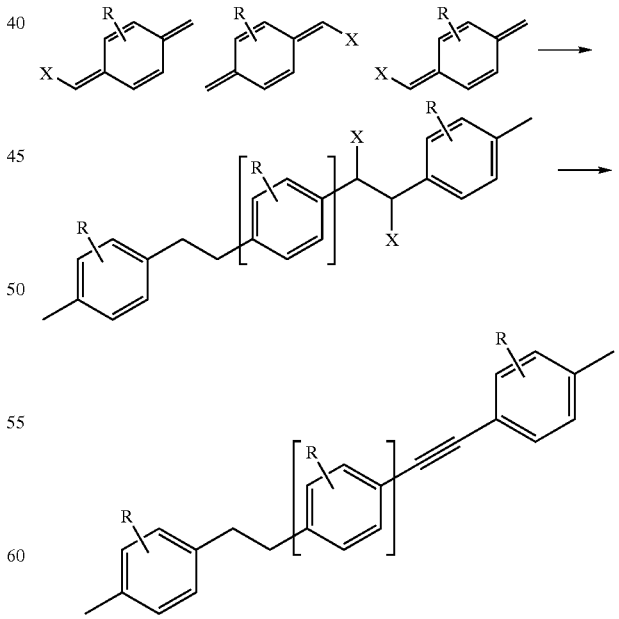

These defects can also be detected analytically in the NMR of the corresponding polymers. The bisbenzyl unit gives a broad signal in the region of 2.6 to 3.0 ppm ($^1$H NMR; CDCl$_3$; about 300 K). Integration of this signal and comparison with other main signals gives information on the content of defective bonds. The following is now known from a number of experiments (cf. FIGS. 1 and 2 and Comparative Experiments V1–V7): 2,5-dialkoxy-PPVs generally have a TBB content in the range 3–5% (TBB content: content of single+triple bonds based on the total number of "vinylic bonds"). Copolymers containing dialkoxy-PPV units and aryl-substituted PPV units have a higher TBB content, which is dependent on the monomer ratio. Homopolymers, which are 2-aryl-substituted PPVs, have a TBB content of greater than 12%. A surprisingly found feature of the polymers according to the invention is that the TBB content is significantly lower than that of comparative polymers which have no further substituents in the 5- or 6-position, i.e. in addition to the aryl substituent on the phenyl ring: thus, for example, a 50/50 copolymer comprising dialkoxy-PPV monomers and 5-methoxy-2-aryl-PPV monomers has a TBB content of about 1.5% (compared with about 6–8% for the corresponding polymer without methoxy substitution) (cf. Ex. P1). Analogously, a 50/50 copolymer between aryl-PPV monomers and 5-methoxy-2-aryl-PPV monomers has a TBB content of about 5–6% (compared with about 12% for the corresponding polymer without methoxy substitution) (cf. Ex. P2).

This lower TBB content surprisingly results (cf. table below) in a significant reduction in the voltage increase (in each case based on comparable polymers) and also in greater active service lives. Thus, the structural characteristic described here for the polymers according to the invention can be regarded retrospectively as the scientific basis for the desirable properties surprisingly found.

TABLE 2

| Polymer | M1 [%] | M2 [%] | M3 [%] | TBB [%] | $T_{1/2}$ [h][a] | dU/dt[a] [mV/h] |
|---|---|---|---|---|---|---|
| V1 | [structure] 50% | [structure] 50% | | 7% | 90 | 120 |
| V2 | [structure] 50% | [structure] 50% | | 12.3% | 1 | 1500 |
| V3 | [structure] 50% | [structure] 50% | | 7% | 80 | 120 |

TABLE 2-continued
| Polymer | M1 [%] | M2 [%] | M3 [%] | TBB [%] | $T_{1/2}$ [h][a] | dU/dt[a] [mV/h] |
|---|---|---|---|---|---|---|
| V4 | 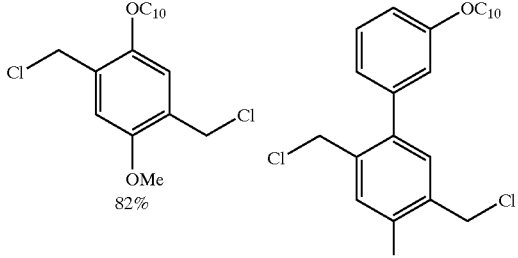 | | | 12% | 1.5 | 1000 |
| V5 | | 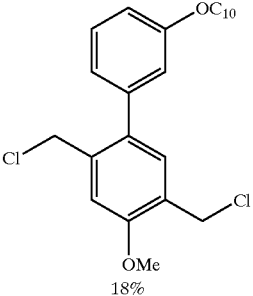 | | 3.5% | 80 | 45 |
| V6 | 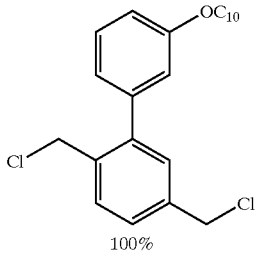 | | | 12.5% | 1 | 1500 |
| V7 | 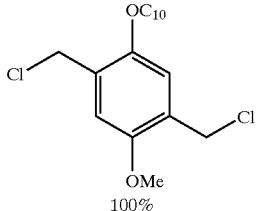 | | | 3.5% | 100 | 40 |
| P1 | 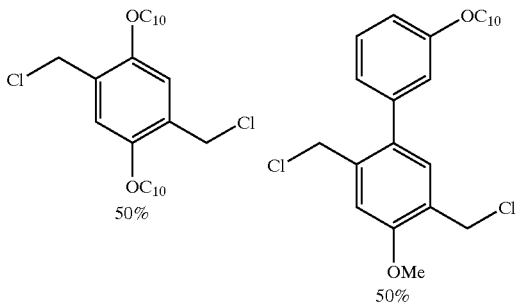 | 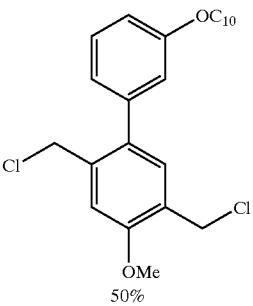 | | 1.4% | 280 | 10 |
| P2 | 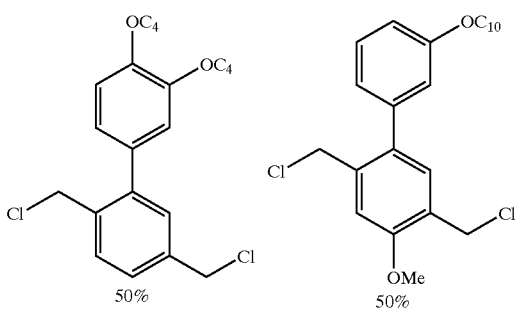 | 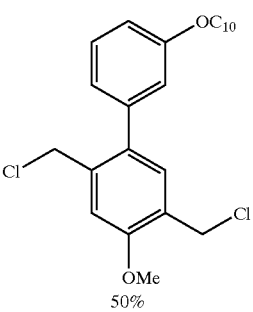 | | 4.8% | 200 | 15 |

TABLE 2-continued
| Polymer | M1 [%] | M2 [%] | M3 [%] | TBB [%] | $T_{1/2}$ [h][a] | dU/dt[a] [mV/h] |
|---|---|---|---|---|---|---|
| P3 | 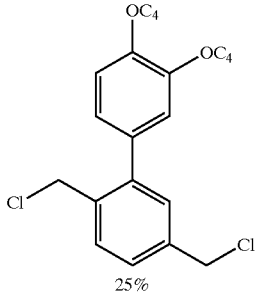 25% | 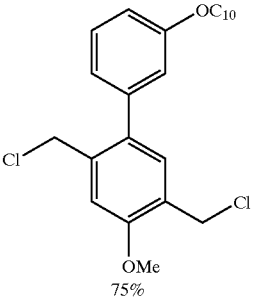 75% | | 1.8% | 300 | 5 |
| P4 | 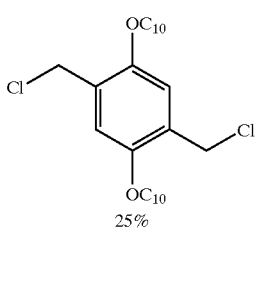 25% | 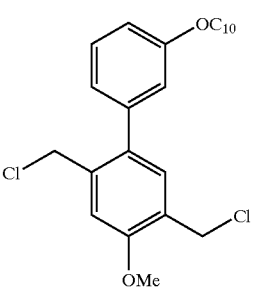 75% | | 1.0% | 800 | 2 |
| P5 P6 | 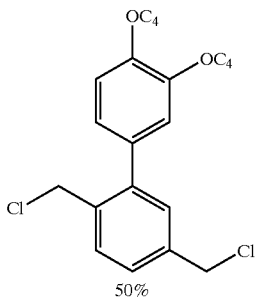 50% | 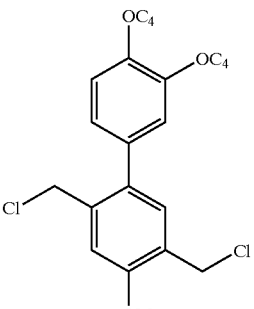 50% | | 4.7% 4.4% | 750 1250 | 4 1.5 |
| P7 | 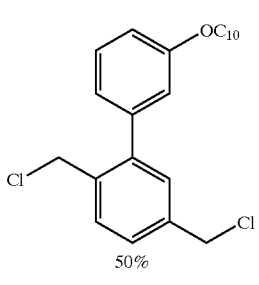 50% | 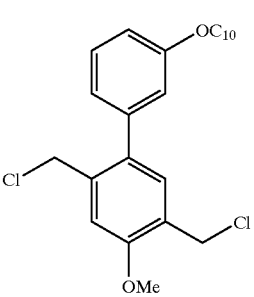 50% | | 4.6% | 560 | 4 |

TABLE 2-continued
| Polymer | M1 [%] | M2 [%] | M3 [%] | TBB [%] | $T_{1/2}$ [h][a] | $dU/dt$[a] [mV/h] |
|---|---|---|---|---|---|---|
| P8 | 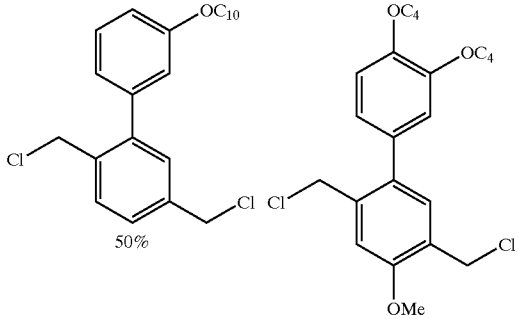 50% | 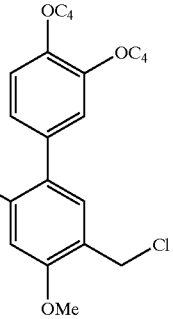 50% | | 5.0% | 1100 | 1.2 |
| P9 | 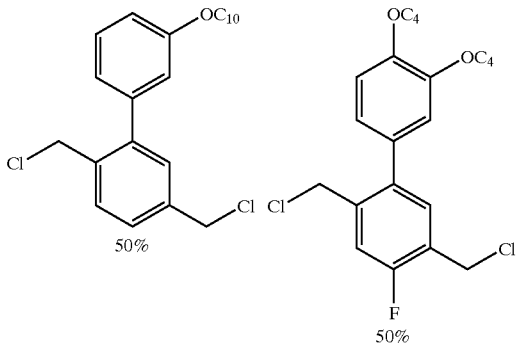 50% | 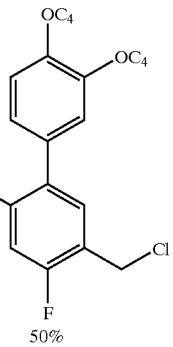 50% | | 8.5% | 130 | 30 |
| P10 | 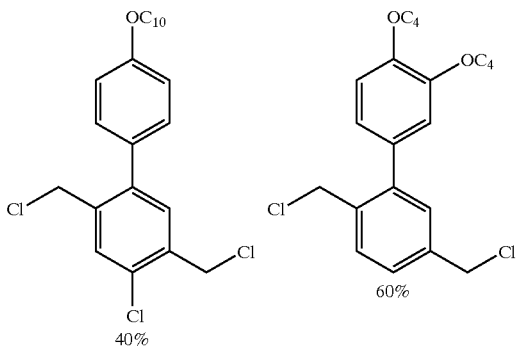 40% | 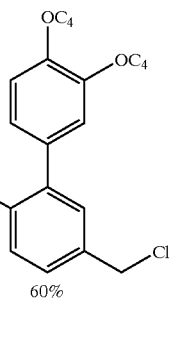 60% | | 9.5% | 55 | 110 |
| P11 | 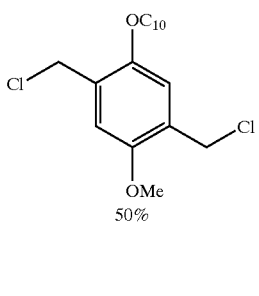 50% | 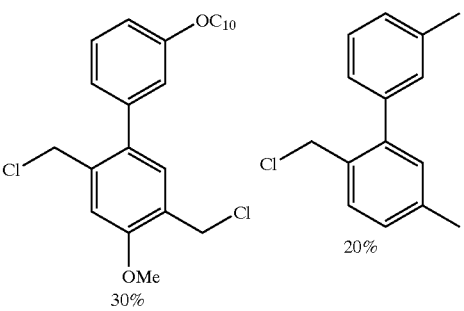 30% | 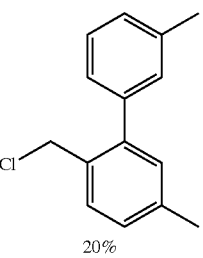 20% | 3.3% | 2600 | <1 |

TABLE 2-continued

| Polymer | M1 [%] | M2 [%] | M3 [%] | TBB [%] | $T_{1/2}$ [h][a] | $dU/dt$[a] [mV/h] |
|---|---|---|---|---|---|---|
| P12 | (biphenyl with OC10, two CH2Cl) 50% | (biphenyl with OC10, two CH2Cl) 50% | | 6.0% | 550 | 5 |
| P13 | (biphenyl with OC10, two CH2Cl) 50% | (biphenyl with OC10, two CH2Cl) 50% | | 7.0% | 110 | 35 |
| P14 | (biphenyl with OC10, two CH2Cl, F) 50% | (biphenyl with OC4, OC4, two CH2Cl) 50% | | 8.5% | 180 | 20 |
| P15 | (biphenyl with OMe, MeO, OMe, two CH2Cl) 50% | (biphenyl with OC10, two CH2Cl) 50% | | 5.5% | 100 | 50 |
| P16 | (biphenyl with CH3, H3C, OMe, two CH2Cl) 40% | (biphenyl with OC10, two CH2Cl) 30% | (biphenyl with OC4, Cl, CH3, CH2Cl) 30% | 4.0% | 280 | 8 |

TABLE 2-continued

| Polymer | M1 [%] | M2 [%] | M3 [%] | TBB [%] | $T_{1/2}$ [h][a] | dU/dt[a] [mV/h] |
|---|---|---|---|---|---|---|
| P17 | 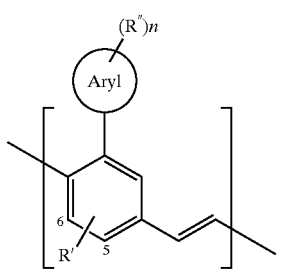 | 50% | | 4.5% | 145 | 17 |

Table
[a]in each case at a luminosity of 1000 Cd/m$^2$.
$C_{10}$ = 3,7-dimethyloctyl
$C_4$ = 2-methylpropyl

What is claimed is:

1. A poly(arylenevinylene) comprising at least 20% of recurring units of the formula (I), (I)

where the symbols and indices have the following meanings:
Aryl: is an aryl group having 4 to 14 carbon atoms;
R': is a substituent which is either in the labeled phenylene position 5 or 6 and is CN, F, Cl, N(R$^1$R$^2$) or a straight-chain, branched or cyclic alkyl, alkoxy or thioalkoxy group having 1 to 20 carbon atoms, in which, in addition, one or more H atoms may be replaced by F;
R": are identical or different and are CN, F, Cl or a straight-chain, branched or cyclic alkyl or alkoxy group having 1 to 20 carbon atoms, where one or more non-adjacent CH$_2$ groups may be replaced by —O—, —S—, —CO—, —COO—, —O—CO—, —NR$^1$—, —(NR$^2$R$^3$)$^+$—A$^-$ or —CONR$^4$—, and where one or more H atoms may be replaced by F, or an aryl group having 4 to 14 carbon atoms, which may be substituted by one or more non-aromatic radicals R';
R$^1$, R$^2$, R$^3$, R$^4$ are identical or different and are H or an aliphatic or aromatic hydrocarbon radical having 1 to 20 carbon atoms;
A$^-$: is a singly charged anion or an equivalent thereof; and
n: is 0, 1, 2, 3, 4 or 5.

2. A poly(arylenevinylene) as claimed in claim 1, which has from 10 to 10,000 recurring units.

3. A poly(arylenevinylene) as claimed in claim 1, essentially consisting of recurring units of the formula (I).

4. A poly(arylenevinylene) as claimed in claim 1, which is a copolymer.

5. A poly(arylenevinylene) as claimed in claim 4, which comprises at least two different recurring units of the formula (I).

6. A poly(arylenevinylene) as claimed in claim 5, which, besides one or more recurring units of the formula (I), comprises one or more further poly(arylenevinylene) recurring units.

7. A poly(arylenevinylene) as claimed in claim 6, which comprises one or more 2,5-dialkoxy-1,4-phenylenevinylene recurring units.

8. A poly(arylenevinylene) as claimed in claim 1, where the symbols and indices in the formula (I) have the following meanings:
Aryl is phenyl, 1- or 2-naphthyl, 1-, 2- or 9-anthracenyl, 2-, 3- or 4-pyridinyl, 2-, 4- or 5-pyrimidinyl, 2-pyrazinyl, 3- or 4-pyridazinyl, 2-, 3-, 4-, 5-, 6-, 7- or 8-quinolinyl, 2- or 3-thiophenyl, 2- or 3-pyrrolyl, 2- or 3-furanyl or 2-(1,3,4-oxadiazol)yl;
R' are identical or different and are CN, F, Cl, CF$_3$ or a straight-chain or branched alkoxy group having 1 to 12 carbon atoms;
R" are identical or different and are a straight-chain or branched alkyl or alkoxy group having 1 to 12 carbon atoms; and
n is 0, 1, 2 or 3.

9. A poly(arylenevinylene) as claimed in claim 8, wherein aryl in the formula (I) is phenyl, 1-naphthyl, 2-naphthyl or 9-anthracenyl.

10. A poly(arylenevinylene) as claimed in claim 9, wherein, in the recurring unit of the formula (I), the aryl substituent has the following substitution pattern:
2-, 3- or 4-alkyl(oxy)phenyl, 2,3-, 2,4-, 2,5-, 2,6-, 3,4- or 3,5-dialkyl(oxy)phenyl, 2,3,4,- 2,3,5-, 2,3,6-, 2,4,5-, 2,4,6- or 3,4,5-trialkyl(oxy)phenyl, 2-, 3-, 4-, 5-, 6-, 7- or 8-alkyl(oxy)-1-naphthyl, 1-, 3-, 4-, 5-, 6-, 7- or 8-alkyl(oxy)-2-naphthyl or 10-alkyl(oxy)-9-anthracenyl.

11. A process for the preparation of a poly (arylenevinylene) as claimed in claim 1, which comprises polymerizing one or more monomers comprising one or more polymerizable biaryls of the formula (II),

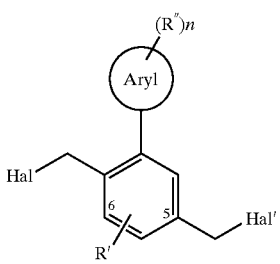

(II)

in which Hal and Hal' are identical or different and are Cl, Br or I, and the other symbols and indices are as defined in the formula (I), via base-induced dehydrohalogenation.

12. An electroluminescent material comprising one or more poly(arylenevinylenes) as claimed in claim 1 and a substrate.

13. A process for the production of an electroluminescent material as claimed in claim 12, which comprises applying one or more poly(arylenevinylenes) comprising recurring units of the formula (I) as a film to the substrate.

14. An electroluminescent device containing one or more active layers, where at least one of these active layers comprises one or more poly(arylenevinylenes) as claimed in claim 1.

15. A poly(arylenevinylene) as claimed in claim 1, wherein the proportion of TBB defect structures is less than 10%.

16. A polymerizable biaryl derivative of the formula (II)

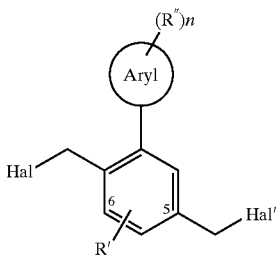

(II)

in which Hal and Hal' are identical or different and are Cl, Br or I, and the other symbols and indices have the following meanings:

Aryl: is an aryl group having 4 to 14 carbon atoms;

R': is a substituent which is either in the labeled phenylene position 5 or 6 and is CN, F, Cl, $N(R^1R^2)$ or a straight chain, branched or cyclic alkyl, alkoxy or thioalkoxy group having 1 to 20 carbon atoms, in which, in addition, one or more H atoms may be replaced by F;

R": are identical or different and are CN, F, Cl or a straight-chain, branched or cyclic alkyl or alkoxy group having 1 to 20 carbon atoms, where one or more non-adjacent $CH_2$ groups may be replaced by —O—, —S—, —CO—, —COO—, —O—CO—, —$NR^1$—, —$(NR^2R^3)^+$—$A^-$ or —$CONR^4$—, and where one or more H atoms may be replaced by F, or an aryl group having 4 to 14 carbon atoms, which may be substituted by one or more non-aromatic radicals R';

$R^1$, $R^2$, $R^3$, $R^4$ are identical or different and are H or an aliphatic or aromatic hydrocarbon radical having 1 to 20 carbon atoms;

$A^-$: is a singly charged anion or an equivalent thereof; and n: is 0, 1, 2, 3, 4 or 5;

with the exception of 2,5-bis(chloromethyl-4-methoxy-4'-(3,7-dimethyloctyloxy)-biphenyl and 2,5-bis(chloromethyl-4-methoxy-3'(3,7-dimethyloctyloxy)-biphenyl.

17. A polymerizable biaryl derivative as claimed in claim 16, wherein the substituent $R^1$ is a straight-chain or branched alkoxy group having 1 to 10 carbon atoms.

18. A process for preparing the polymerizable biaryl derivative of claim 16 comprising reacting an aryl derivative with a phenyl derivative in the presence of a palladium catalyst.

19. A process for preparing an organic semiconductor comprising dissolving one or more of the poly(arylenevinylenes) of claim 1 in an organic solvent to form a solution and coating the solution on a substrate.

* * * * *

UNITED STATES PATENT AND TRADEMARK OFFICE
CERTIFICATE OF CORRECTION

PATENT NO. : 6,638,646 B2 Page 1 of 1
DATED : October 28, 2003
INVENTOR(S) : Hubert Spreitzer et al.

It is certified that error appears in the above-identified patent and that said Letters Patent is hereby corrected as shown below:

Title page,
Item [60], Related U.S. Application Data, "Provisional application No. PCT/EP98/06722, filed Oct. 22, 1998, now abandoned" should read -- A 371 of international application No. PCT/EP65/06722, filed on Oct. 22, 1998 --.

Signed and Sealed this

Twenty-seventh Day of January, 2004

JON W. DUDAS
*Acting Director of the United States Patent and Trademark Office*